United States Patent
Flynn et al.

(10) Patent No.: US 11,640,359 B2
(45) Date of Patent: May 2, 2023

(54) SYSTEMS AND METHODS FOR IDENTIFYING STORAGE RESOURCES THAT ARE NOT IN USE

(71) Applicant: Unification Technologies LLC, Frisco, TX (US)

(72) Inventors: David Flynn, Sandy, UT (US); Jonathan Thatcher, Liberty Lake, WA (US); Michael Zappe, Arvada, CO (US)

(73) Assignee: Unification Technologies LLC, Frisco, TX (US)

( * ) Notice: Subject to any disclaimer, the term of this patent is extended or adjusted under 35 U.S.C. 154(b) by 0 days.

(21) Appl. No.: 16/543,464

(22) Filed: Aug. 16, 2019

(65) Prior Publication Data

US 2019/0370185 A1   Dec. 5, 2019

Related U.S. Application Data

(63) Continuation of application No. 15/460,126, filed on Mar. 15, 2017, now Pat. No. 10,387,328, which is a
(Continued)

(51) Int. Cl.
*G06F 12/121* (2016.01)
*G06F 3/06* (2006.01)
(Continued)

(52) U.S. Cl.
CPC .......... *G06F 12/121* (2013.01); *G06F 1/183* (2013.01); *G06F 3/0604* (2013.01); *G06F 3/065* (2013.01);
(Continued)

(58) Field of Classification Search
CPC ......... G06F 12/0246; G06F 2212/7201; G06F 2212/7206
See application file for complete search history.

(56) References Cited

U.S. PATENT DOCUMENTS

| | | | |
|---|---|---|---|
| 3,478,251 | A | 11/1969 | Perotto et al. |
| 4,092,732 | A | 5/1978 | Ouchi |

(Continued)

FOREIGN PATENT DOCUMENTS

| | | | |
|---|---|---|---|
| CN | 1340760 A | 3/2002 | |
| CN | 1619509 A | 5/2005 | |

(Continued)

OTHER PUBLICATIONS

Han-joon Kim, Sang-goo Lee; "A New Flash Memory Management for Flash Storage System"; 1999; IEEE; pp. 284-289 (Year: 1999).*
(Continued)

*Primary Examiner* — Edward J Dudek, Jr.
(74) *Attorney, Agent, or Firm* — Thomas J. Lavan

(57) ABSTRACT

An apparatus, system, and method are disclosed for managing a non-volatile storage medium. A storage controller receives a message that identifies data that no longer needs to be retained on the non-volatile storage medium. The data may be identified using a logical identifier. The message may comprise a hint, directive, or other indication that the data has been erased and/or deleted. In response to the message, the storage controller records an indication that the contents of a physical storage location and/or physical address associated with the logical identifier do not need to be preserved on the non-volatile storage medium.

20 Claims, 18 Drawing Sheets

Related U.S. Application Data continuation of application No. 15/228,893, filed on Aug. 4, 2016, now Pat. No. 10,387,327, which is a continuation of application No. 14/309,751, filed on Jun. 19, 2014, now Pat. No. 9,632,727, which is a continuation of application No. 13/566,471, filed on Aug. 3, 2012, now Pat. No. 8,762,658, which is a continuation of application No. 11/952,113, filed on Dec. 6, 2007, now Pat. No. 8,261,005.

(60) Provisional application No. 60/974,470, filed on Sep. 22, 2007, provisional application No. 60/873,111, filed on Dec. 6, 2006.

(51) Int. Cl.

| | |
|---|---|
| G06F 1/18 | (2006.01) |
| G06F 9/52 | (2006.01) |
| G06F 11/10 | (2006.01) |
| G06F 12/0804 | (2016.01) |
| G06F 12/0868 | (2016.01) |
| G06F 13/28 | (2006.01) |
| G06F 13/40 | (2006.01) |
| H05K 7/14 | (2006.01) |
| G06F 12/02 | (2006.01) |
| H04L 67/02 | (2022.01) |
| G06F 13/42 | (2006.01) |
| G06F 12/12 | (2016.01) |
| G06F 12/123 | (2016.01) |
| G06F 9/54 | (2006.01) |
| H04L 67/1097 | (2022.01) |

(52) U.S. Cl.
CPC .......... *G06F 3/0608* (2013.01); *G06F 3/0613* (2013.01); *G06F 3/0619* (2013.01); *G06F 3/0643* (2013.01); *G06F 3/0652* (2013.01); *G06F 3/0656* (2013.01); *G06F 3/0659* (2013.01); *G06F 3/0679* (2013.01); *G06F 3/0685* (2013.01); *G06F 3/0688* (2013.01); *G06F 9/52* (2013.01); *G06F 9/54* (2013.01); *G06F 11/108* (2013.01); *G06F 12/0246* (2013.01); *G06F 12/0804* (2013.01); *G06F 12/0868* (2013.01); *G06F 12/12* (2013.01); *G06F 12/123* (2013.01); *G06F 13/28* (2013.01); *G06F 13/4022* (2013.01); *G06F 13/426* (2013.01); *H04L 67/02* (2013.01); *H05K 7/1444* (2013.01); *H05K 7/1487* (2013.01); *G06F 2211/002* (2013.01); *G06F 2211/103* (2013.01); *G06F 2212/1044* (2013.01); *G06F 2212/2022* (2013.01); *G06F 2212/222* (2013.01); *G06F 2212/70* (2013.01); *G06F 2212/7205* (2013.01); *H04L 67/1097* (2013.01); *Y02D 10/00* (2018.01)

(56) References Cited

U.S. PATENT DOCUMENTS

| | | |
|---|---|---|
| 4,290,105 A | 9/1981 | Cichelli et al. |
| 4,571,674 A | 2/1986 | Hartung |
| 4,584,665 A | 4/1986 | Vrielink |
| 4,761,785 A | 8/1988 | Clark et al. |
| 4,858,070 A | 8/1989 | Buron et al. |
| 4,980,861 A | 12/1990 | Herdt et al. |
| 5,043,871 A | 8/1991 | Nishigaki et al. |
| 5,111,463 A | 5/1992 | Zook |
| 5,124,987 A | 6/1992 | Milligan et al. |
| 5,151,905 A | 9/1992 | Yokono et al. |
| 5,193,184 A | 3/1993 | Belsan et al. |
| 5,226,154 A | 7/1993 | Kondoh |
| 5,261,068 A | 11/1993 | Gaskins et al. |
| 5,263,003 A | 11/1993 | Cowles et al. |
| 5,274,799 A | 12/1993 | Brant et al. |
| 5,291,496 A | 3/1994 | Andaleon et al. |
| 5,307,497 A | 4/1994 | Feigenbaum et al. |
| 5,313,475 A | 5/1994 | Cromer et al. |
| 5,323,489 A | 6/1994 | Bird |
| 5,325,509 A | 6/1994 | Lautzenheiser |
| 5,325,523 A | 6/1994 | Beglin et al. |
| 5,337,275 A | 8/1994 | Garner |
| 5,357,475 A | 10/1994 | Hasbun et al. |
| 5,379,304 A | 1/1995 | Dell et al. |
| 5,381,528 A | 1/1995 | Brunelle |
| 5,382,950 A | 1/1995 | Gronemeyer |
| 5,388,083 A | 2/1995 | Assar et al. |
| 5,388,108 A | 2/1995 | DeMoss et al. |
| 5,392,427 A | 2/1995 | Barrett et al. |
| 5,394,531 A | 2/1995 | Smith |
| 5,404,485 A | 4/1995 | Ban |
| 5,414,840 A | 5/1995 | Rengarajan et al. |
| 5,422,856 A | 6/1995 | Sasaki et al. |
| 5,434,994 A | 7/1995 | Shaheen et al. |
| 5,438,671 A | 8/1995 | Miles |
| 5,457,658 A | 10/1995 | Niijima et al. |
| 5,465,355 A | 11/1995 | Cook et al. |
| 5,469,555 A | 11/1995 | Ghosh et al. |
| 5,479,638 A | 12/1995 | Assar et al. |
| 5,485,595 A | 1/1996 | Assar et al. |
| 5,490,248 A | 2/1996 | Dan et al. |
| 5,499,354 A | 3/1996 | Aschoff et al. |
| 5,499,367 A | 3/1996 | Bamford et al. |
| 5,504,882 A | 4/1996 | Chai et al. |
| 5,535,328 A | 7/1996 | Harari et al. |
| 5,535,391 A | 7/1996 | Hejlsberg et al. |
| 5,535,399 A | 7/1996 | Blitz et al. |
| 5,541,886 A | 7/1996 | Hasbun |
| 5,544,356 A | 8/1996 | Robinson et al. |
| 5,548,757 A | 8/1996 | Matsuyama et al. |
| 5,551,003 A | 8/1996 | Mattson et al. |
| 5,553,261 A | 9/1996 | Hasbun et al. |
| 5,559,988 A | 9/1996 | Durante et al. |
| 5,561,784 A | 10/1996 | Chen et al. |
| 5,566,315 A | 10/1996 | Milillo et al. |
| 5,574,882 A | 11/1996 | Menon et al. |
| 5,579,474 A | 11/1996 | Kakuta et al. |
| 5,586,291 A | 12/1996 | Lasker et al. |
| 5,592,641 A | 1/1997 | Fandrich et al. |
| 5,594,883 A | 1/1997 | Pricer |
| 5,596,708 A | 1/1997 | Weber |
| 5,596,736 A | 1/1997 | Kerns |
| 5,598,370 A | 1/1997 | Niijima et al. |
| 5,603,001 A | 2/1997 | Sukegawa et al. |
| 5,638,289 A | 6/1997 | Yamada et al. |
| 5,651,133 A | 7/1997 | Burkes et al. |
| 5,664,096 A | 9/1997 | Ichinomiya et al. |
| 5,664,187 A | 9/1997 | Burkes et al. |
| 5,680,579 A | 10/1997 | Young et al. |
| 5,682,497 A | 10/1997 | Robinson |
| 5,682,499 A | 10/1997 | Bakke et al. |
| 5,701,434 A | 12/1997 | Nakagawa |
| 5,720,025 A | 2/1998 | Wilkes et al. |
| 5,721,874 A | 2/1998 | Carnevale et al. |
| 5,734,861 A | 3/1998 | Cohn et al. |
| 5,742,787 A | 4/1998 | Talreja |
| 5,745,671 A | 4/1998 | Hodges |
| 5,745,673 A | 4/1998 | Di Zenzo et al. |
| 5,745,792 A | 4/1998 | Jost |
| 5,754,563 A | 5/1998 | White |
| 5,754,567 A | 5/1998 | Norman |
| 5,757,567 A | 5/1998 | Hetzler et al. |
| 5,758,118 A | 5/1998 | Choy et al. |
| 5,761,402 A | 6/1998 | Kaneda et al. |
| 5,765,207 A | 6/1998 | Curran |
| 5,768,152 A | 6/1998 | Battaline et al. |
| 5,787,486 A | 7/1998 | Chin et al. |
| 5,797,022 A | 8/1998 | Shimotono et al. |
| 5,798,968 A | 8/1998 | Lee et al. |
| 5,799,140 A | 8/1998 | Niijima et al. |
| 5,799,200 A | 8/1998 | Brant et al. |

(56) References Cited

U.S. PATENT DOCUMENTS

| | | |
|---|---|---|
| 5,802,602 A | 9/1998 | Rahman et al. |
| 5,805,501 A | 9/1998 | Shiau et al. |
| 5,809,515 A | 9/1998 | Kaki et al. |
| 5,809,527 A | 9/1998 | Cooper et al. |
| 5,809,543 A | 9/1998 | Byers et al. |
| 5,812,457 A | 9/1998 | Arase |
| 5,822,759 A | 10/1998 | Treynor |
| 5,831,989 A | 11/1998 | Fujisaki |
| 5,832,515 A | 11/1998 | Ledain et al. |
| 5,835,935 A | 11/1998 | Estakhri et al. |
| 5,835,964 A | 11/1998 | Draves et al. |
| 5,845,313 A | 12/1998 | Estakhri et al. |
| 5,845,329 A | 12/1998 | Onishi et al. |
| 5,854,796 A | 12/1998 | Sato |
| 5,860,083 A | 1/1999 | Sukegawa |
| 5,867,430 A | 2/1999 | Chen et al. |
| 5,873,118 A | 2/1999 | Letwin |
| 5,890,192 A | 3/1999 | Lee et al. |
| 5,893,086 A | 4/1999 | Schmuck et al. |
| 5,893,138 A | 4/1999 | Judd et al. |
| 5,907,856 A | 5/1999 | Estakh et al. |
| 5,920,869 A | 7/1999 | Wakayama et al. |
| 5,922,080 A | 7/1999 | Olarig |
| 5,924,113 A | 7/1999 | Estakhri et al. |
| 5,930,815 A | 7/1999 | Estakhri et al. |
| 5,933,847 A | 8/1999 | Ogawa |
| 5,953,737 A | 9/1999 | Estakhri et al. |
| 5,957,158 A | 9/1999 | Volz et al. |
| 5,958,067 A | 9/1999 | Kaneda et al. |
| 5,960,462 A | 9/1999 | Solomon et al. |
| 5,961,660 A | 10/1999 | Capps, Jr. et al. |
| 5,969,986 A | 10/1999 | Wong et al. |
| 5,996,046 A | 11/1999 | Yagisawa et al. |
| 5,996,054 A | 11/1999 | Ledain et al. |
| 6,000,006 A | 12/1999 | Bruce et al. |
| 6,000,019 A | 12/1999 | Dykstal et al. |
| 6,003,123 A | 12/1999 | Carter et al. |
| 6,014,724 A | 1/2000 | Jenett |
| 6,014,747 A | 1/2000 | Fackenthall et al. |
| 6,034,882 A | 3/2000 | Johnson et al. |
| 6,034,897 A | 3/2000 | Estakhri et al. |
| 6,038,619 A | 3/2000 | Berning et al. |
| 6,044,438 A | 3/2000 | Olnowich |
| 6,047,334 A | 4/2000 | Langendorf et al. |
| 6,049,890 A | 4/2000 | Kakuta et al. |
| 6,061,511 A | 5/2000 | Marantz et al. |
| 6,069,827 A | 5/2000 | Sinclair |
| 6,073,232 A | 6/2000 | Kroeker et al. |
| 6,078,520 A | 6/2000 | Tobita et al. |
| 6,092,158 A | 7/2000 | Harriman et al. |
| 6,092,215 A | 7/2000 | Hodges et al. |
| 6,101,601 A | 8/2000 | Matthews et al. |
| 6,105,076 A | 8/2000 | Beardsley et al. |
| 6,112,319 A | 8/2000 | Paulson |
| 6,115,793 A | 9/2000 | Gruber et al. |
| 6,125,072 A | 9/2000 | Wu |
| 6,128,695 A | 10/2000 | Estakhri et al. |
| 6,138,125 A | 10/2000 | DeMoss |
| 6,141,249 A | 10/2000 | Estakhri et al. |
| 6,145,051 A | 11/2000 | Estakhri et al. |
| 6,148,377 A | 11/2000 | Carter et al. |
| 6,157,963 A | 12/2000 | Courtright, II et al. |
| 6,170,039 B1 | 1/2001 | Kishida |
| 6,170,042 B1 | 1/2001 | Gaertner et al. |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,188,619 B1 | 2/2001 | Jung |
| 6,189,078 B1 | 2/2001 | Bauman et al. |
| 6,205,521 B1 | 3/2001 | Schumann |
| 6,209,000 B1 | 3/2001 | Klein et al. |
| 6,209,003 B1 | 3/2001 | Mattis et al. |
| 6,209,088 B1 | 3/2001 | Reneris |
| 6,219,751 B1 | 4/2001 | Hodges |
| 6,223,308 B1 | 4/2001 | Estakhri et al. |
| 6,230,234 B1 | 5/2001 | Estakhri et al. |
| 6,236,593 B1 | 5/2001 | Hong et al. |
| 6,237,059 B1 | 5/2001 | Dean et al. |
| 6,240,040 B1 | 5/2001 | Akaogi et al. |
| 6,256,642 B1 | 7/2001 | Krueger et al. |
| 6,256,749 B1 | 7/2001 | Kakuta et al. |
| 6,262,918 B1 | 7/2001 | Estakhri et al. |
| 6,269,382 B1 | 7/2001 | Cabrera et al. |
| 6,278,633 B1 | 8/2001 | Wong et al. |
| 6,279,041 B1 | 8/2001 | Baber et al. |
| 6,279,069 B1 | 8/2001 | Robinson et al. |
| 6,289,413 B1 | 9/2001 | Rogers et al. |
| 6,295,571 B1 | 9/2001 | Scardamalia et al. |
| 6,295,577 B1 | 9/2001 | Anderson et al. |
| 6,295,581 B1 | 9/2001 | DeRoo |
| 6,298,401 B1 | 10/2001 | Anderson |
| 6,311,290 B1 | 10/2001 | Hasbun et al. |
| 6,311,305 B1 | 10/2001 | Sollish et al. |
| 6,321,263 B1 | 11/2001 | Luzzi et al. |
| 6,321,345 B1 | 11/2001 | Mann et al. |
| 6,330,688 B1 | 12/2001 | Brown |
| 6,334,173 B1 | 12/2001 | Won et al. |
| 6,336,174 B1 | 1/2002 | Li et al. |
| 6,341,289 B1 | 1/2002 | Burroughs et al. |
| 6,347,341 B1 | 2/2002 | Glassen et al. |
| 6,353,878 B1 | 3/2002 | Dunham |
| 6,356,986 B1 | 3/2002 | Solomon et al. |
| 6,370,631 B1 | 4/2002 | Dye |
| 6,374,266 B1 | 4/2002 | Shnelvar |
| 6,374,336 B1 | 4/2002 | Peters et al. |
| 6,385,688 B1 | 5/2002 | Mills et al. |
| 6,385,710 B1 | 5/2002 | Goldman et al. |
| 6,393,513 B2 | 5/2002 | Estakhri et al. |
| 6,401,175 B1 | 6/2002 | Tremblay et al. |
| 6,404,647 B1 | 6/2002 | Minne' |
| 6,404,676 B2 | 6/2002 | Kihara et al. |
| 6,405,201 B1 | 6/2002 | Nazari |
| 6,407,930 B1 | 6/2002 | Hsu |
| 6,412,030 B1 | 6/2002 | Adusumilli |
| 6,412,080 B1 | 6/2002 | Fleming et al. |
| 6,418,478 B1 | 7/2002 | Ignatius et al. |
| 6,418,509 B1 | 7/2002 | Yanai et al. |
| 6,420,215 B1 | 7/2002 | Knall et al. |
| 6,424,872 B1 | 7/2002 | Glanzer et al. |
| 6,446,188 B1 | 9/2002 | Henderson et al. |
| 6,449,688 B1 | 9/2002 | Peters et al. |
| 6,467,011 B2 | 10/2002 | Scardamalia et al. |
| 6,467,022 B1 | 10/2002 | Buckland et al. |
| 6,470,238 B1 | 10/2002 | Nizar et al. |
| 6,477,617 B1 | 11/2002 | Golding |
| 6,480,933 B1 | 11/2002 | Cargemel et al. |
| 6,487,636 B1 | 11/2002 | Dolphin et al. |
| 6,496,366 B1 | 12/2002 | Coglitore et al. |
| 6,507,911 B1 | 1/2003 | Langford |
| 6,513,112 B1 | 1/2003 | Craig et al. |
| 6,515,909 B1 | 2/2003 | Wooldridge |
| 6,515,928 B2 | 2/2003 | Sato et al. |
| 6,516,380 B2 | 2/2003 | Kenchammana-Hoskote et al. |
| 6,519,185 B2 | 2/2003 | Harari et al. |
| 6,523,102 B1 | 2/2003 | Dye et al. |
| 6,525,953 B1 | 2/2003 | Johnson |
| 6,526,482 B1 | 2/2003 | Nonoyama et al. |
| 6,532,527 B2 | 3/2003 | Selkirk et al. |
| 6,535,869 B1 | 3/2003 | Housel, III |
| 6,535,949 B1 | 3/2003 | Parker |
| 6,535,997 B1 | 3/2003 | Janson et al. |
| 6,549,987 B1 | 4/2003 | Rappoport et al. |
| 6,552,955 B1 | 4/2003 | Miki |
| 6,556,440 B2 | 4/2003 | Jensen et al. |
| 6,557,084 B2 | 4/2003 | Freerksen et al. |
| 6,564,285 B1 | 5/2003 | Mills et al. |
| 6,567,307 B1 | 5/2003 | Estakhri |
| 6,567,889 B1 | 5/2003 | DeKoning et al. |
| 6,571,312 B1 | 5/2003 | Sugai et al. |
| D475,705 S | 6/2003 | Coglitore et al. |
| 6,578,113 B2 | 6/2003 | Krishnamurthy et al. |
| 6,587,915 B1 | 7/2003 | Kim |
| 6,587,937 B1 | 7/2003 | Jensen et al. |

(56) References Cited

U.S. PATENT DOCUMENTS

| | | | |
|---|---|---|---|
| 6,594,712 B1 | 7/2003 | Pettey et al. |
| 6,601,151 B1 | 7/2003 | Harris |
| 6,601,211 B1 | 7/2003 | Norman |
| 6,604,168 B2 | 8/2003 | Ogawa |
| 6,608,793 B2 | 8/2003 | Park et al. |
| 6,611,836 B2 | 8/2003 | Davis et al. |
| 6,615,355 B2 | 9/2003 | Mattison |
| 6,618,451 B1 | 9/2003 | Gonikberg |
| 6,622,200 B1 | 9/2003 | Hasbun et al. |
| 6,625,685 B1 | 9/2003 | Cho et al. |
| 6,629,112 B1 | 9/2003 | Shank et al. |
| 6,633,950 B1 | 10/2003 | Brown et al. |
| 6,633,956 B1 | 10/2003 | Mitani |
| 6,643,181 B2 | 11/2003 | Sofer et al. |
| 6,643,748 B1 | 11/2003 | Wieland |
| 6,655,758 B2 | 12/2003 | Pasotti et al. |
| 6,658,438 B1 | 12/2003 | Moore et al. |
| 6,671,757 B1 | 12/2003 | Multer et al. |
| 6,675,318 B1 | 1/2004 | Lee |
| 6,675,349 B1 | 1/2004 | Chen |
| 6,683,810 B2 | 1/2004 | Sakamoto |
| 6,684,274 B1 | 1/2004 | Chong, Jr. |
| 6,684,301 B1 | 1/2004 | Martin |
| 6,694,281 B2 | 2/2004 | Arnaout et al. |
| 6,694,453 B1 | 2/2004 | Shukla et al. |
| 6,697,076 B1 | 2/2004 | Trivedi et al. |
| 6,697,797 B1 | 2/2004 | Hoggatt et al. |
| 6,697,878 B1 | 2/2004 | Imai |
| 6,701,452 B1 | 3/2004 | Kinjo et al. |
| 6,710,901 B2 | 3/2004 | Pastor |
| 6,715,027 B2 | 3/2004 | Kim et al. |
| 6,715,046 B1 | 3/2004 | Shoham et al. |
| 6,724,640 B1 | 4/2004 | Cooper |
| 6,725,321 B1 * | 4/2004 | Sinclair .............. G06F 3/0619 711/103 |
| 6,725,342 B1 | 4/2004 | Coulson |
| 6,728,851 B1 | 4/2004 | Estakhri et al. |
| 6,728,866 B1 | 4/2004 | Kahle et al. |
| 6,735,546 B2 | 5/2004 | Scheuerlein |
| 6,737,675 B2 | 5/2004 | Patel et al. |
| 6,742,078 B1 | 5/2004 | Chien et al. |
| 6,742,081 B2 | 5/2004 | Talagala et al. |
| 6,745,284 B1 | 6/2004 | Lee et al. |
| 6,745,292 B1 | 6/2004 | Stevens |
| 6,748,487 B1 | 6/2004 | Takamoto et al. |
| 6,748,504 B2 | 6/2004 | Sawdon et al. |
| 6,751,155 B2 | 6/2004 | Gorobets |
| 6,751,769 B2 | 6/2004 | Chen et al. |
| 6,754,773 B2 | 6/2004 | Ulrich et al. |
| 6,754,774 B2 | 6/2004 | Gruner et al. |
| 6,754,800 B2 | 6/2004 | Wong et al. |
| 6,757,800 B1 | 6/2004 | Estakhri et al. |
| 6,760,805 B2 | 7/2004 | Lasser |
| 6,760,806 B2 | 7/2004 | Jeon |
| 6,763,424 B2 | 7/2004 | Conley |
| 6,763,440 B1 | 7/2004 | Traversat et al. |
| 6,766,432 B2 | 7/2004 | Saltz |
| 6,775,185 B2 | 8/2004 | Fujisawa et al. |
| 6,779,045 B2 | 8/2004 | Kendall et al. |
| 6,779,080 B2 | 8/2004 | Basham et al. |
| 6,779,088 B1 | 8/2004 | Benveniste et al. |
| 6,779,094 B2 | 8/2004 | Selkirk et al. |
| 6,779,145 B1 | 8/2004 | Edwards et al. |
| 6,785,078 B2 | 8/2004 | Basham et al. |
| 6,785,768 B2 | 8/2004 | Peters et al. |
| 6,785,776 B2 | 8/2004 | Arimilli et al. |
| 6,785,785 B2 | 8/2004 | Piccirillo et al. |
| 6,795,890 B1 | 9/2004 | Sugai et al. |
| 6,801,979 B1 | 10/2004 | Estakhri |
| 6,804,755 B2 | 10/2004 | Selkirk et al. |
| 6,807,097 B2 | 10/2004 | Takano et al. |
| 6,816,917 B2 | 11/2004 | Dicorpo et al. |
| 6,823,398 B1 | 11/2004 | Lee et al. |
| 6,824,393 B2 | 11/2004 | Debord et al. |
| 6,839,819 B2 | 1/2005 | Martin |
| 6,839,826 B2 | 1/2005 | Cernea |
| 6,845,053 B2 | 1/2005 | Chevallier |
| 6,845,428 B1 | 1/2005 | Kedem |
| 6,849,480 B1 | 2/2005 | Low et al. |
| 6,849,905 B2 | 2/2005 | Ilkbahar et al. |
| 6,850,408 B1 | 2/2005 | Coglitore et al. |
| 6,850,969 B2 | 2/2005 | Ladan-Mozes et al. |
| 6,859,824 B1 | 2/2005 | Yamamoto et al. |
| 6,862,692 B2 | 3/2005 | Ulrich et al. |
| 6,865,657 B1 | 3/2005 | Traversat et al. |
| 6,871,257 B2 | 3/2005 | Conley et al. |
| 6,871,295 B2 | 3/2005 | Ulrich et al. |
| 6,877,076 B1 | 4/2005 | Cho et al. |
| 6,880,049 B2 | 4/2005 | Gruner et al. |
| 6,881,994 B2 | 4/2005 | Lee et al. |
| 6,883,044 B1 | 4/2005 | Roohparvar |
| 6,883,068 B2 | 4/2005 | Tsirigotis et al. |
| 6,883,069 B2 | 4/2005 | Yoshida |
| 6,883,079 B1 | 4/2005 | Priborsky |
| 6,887,058 B2 | 5/2005 | Fujiwara |
| 6,892,298 B2 | 5/2005 | West |
| 6,901,499 B2 | 5/2005 | Aasheim et al. |
| 6,906,961 B2 | 6/2005 | Eggleston et al. |
| 6,910,170 B2 | 6/2005 | Choi et al. |
| 6,912,537 B2 | 6/2005 | Selkirk et al. |
| 6,912,598 B1 | 6/2005 | Bedarida et al. |
| 6,912,618 B2 | 6/2005 | Estakhri et al. |
| 6,914,853 B2 | 7/2005 | Coulson |
| 6,920,522 B2 | 7/2005 | Roohparvar |
| 6,922,754 B2 | 7/2005 | Liu et al. |
| 6,928,505 B1 | 8/2005 | Klingman |
| 6,931,509 B2 | 8/2005 | Lloyd-Jones |
| 6,932,617 B2 | 8/2005 | Debord et al. |
| 6,938,133 B2 | 8/2005 | Johnson et al. |
| 6,938,252 B2 | 8/2005 | Baylor et al. |
| 6,950,952 B2 | 9/2005 | Felsman |
| 6,950,966 B2 | 9/2005 | Chiquoine et al. |
| 6,957,158 B1 | 10/2005 | Hancock et al. |
| 6,959,369 B1 | 10/2005 | Ashton et al. |
| 6,968,421 B2 | 11/2005 | Conley |
| 6,973,531 B1 | 12/2005 | Chang et al. |
| 6,973,551 B1 | 12/2005 | Walton |
| 6,977,599 B2 | 12/2005 | Widmer |
| 6,977,847 B2 | 12/2005 | Lasser et al. |
| 6,978,342 B1 | 12/2005 | Estakhri et al. |
| 6,981,070 B1 | 12/2005 | Luk et al. |
| 6,988,151 B2 | 1/2006 | Tsuruta |
| 6,990,547 B2 | 1/2006 | Ulrich et al. |
| 6,990,553 B2 | 1/2006 | Nakayama et al. |
| 6,996,676 B2 | 2/2006 | Megiddo et al. |
| 7,000,063 B2 | 2/2006 | Friedman et al. |
| 7,005,350 B2 | 2/2006 | Walker et al. |
| 7,010,652 B2 | 3/2006 | Piccirillo et al. |
| 7,010,662 B2 | 3/2006 | Aasheim et al. |
| 7,010,663 B2 | 3/2006 | George et al. |
| 7,013,364 B2 | 3/2006 | Honda et al. |
| 7,013,376 B2 | 3/2006 | Hooper, III |
| 7,013,379 B1 | 3/2006 | Testardi |
| 7,024,695 B1 | 4/2006 | Kumar et al. |
| 7,035,111 B1 | 4/2006 | Lin et al. |
| 7,035,974 B2 | 4/2006 | Shang |
| 7,042,664 B2 | 5/2006 | Gill et al. |
| 7,043,599 B1 | 5/2006 | Ware et al. |
| 7,045,717 B2 | 5/2006 | Kolvick et al. |
| 7,047,366 B1 | 5/2006 | Ezra |
| 7,050,337 B2 | 5/2006 | Iwase et al. |
| 7,057,936 B2 | 6/2006 | Yaegashi et al. |
| 7,057,942 B2 | 6/2006 | Suda et al. |
| 7,058,769 B1 | 6/2006 | Danilak |
| 7,064,994 B1 | 6/2006 | Wu |
| 7,065,618 B1 | 6/2006 | Ghemawat et al. |
| 7,069,307 B1 | 6/2006 | Lee et al. |
| 7,069,349 B2 | 6/2006 | Hawkins et al. |
| 7,069,380 B2 | 6/2006 | Ogawa et al. |
| 7,076,599 B2 | 7/2006 | Aasheim et al. |
| 7,076,688 B2 | 7/2006 | Yamamoto |
| 7,076,723 B2 | 7/2006 | Saliba |
| 7,080,193 B2 | 7/2006 | Roohparvar |
| 7,081,377 B2 | 7/2006 | Cleeves |

(56) References Cited

U.S. PATENT DOCUMENTS

| | | |
|---|---|---|
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,085,953 B1 | 8/2006 | Hsu et al. |
| 7,085,983 B2 | 8/2006 | Ohta |
| 7,089,391 B2 | 8/2006 | Geiger et al. |
| 7,093,101 B2 | 8/2006 | Aasheim et al. |
| 7,096,321 B2 | 8/2006 | Modha |
| 7,107,419 B1 | 9/2006 | Ghemawat et al. |
| 7,107,430 B2 | 9/2006 | Grossman et al. |
| 7,107,480 B1 | 9/2006 | Moshayedi et al. |
| 7,111,115 B2 | 9/2006 | Peters et al. |
| 7,111,140 B2 | 9/2006 | Estakhri et al. |
| 7,120,051 B2 | 10/2006 | Gorobets et al. |
| 7,130,956 B2 | 10/2006 | Rao |
| 7,130,957 B2 | 10/2006 | Rao |
| 7,130,960 B1 | 10/2006 | Kano |
| 7,136,964 B2 | 11/2006 | Yamamoto |
| 7,139,864 B2 | 11/2006 | Bennett et al. |
| 7,143,228 B2 | 11/2006 | Iida et al. |
| 7,149,947 B1 | 12/2006 | MacLellan et al. |
| 7,155,559 B1 | 12/2006 | Estakhri et al. |
| 7,162,560 B2 | 1/2007 | Taylor et al. |
| 7,162,571 B2 | 1/2007 | Kilian et al. |
| 7,165,144 B2 | 1/2007 | Choubal et al. |
| 7,167,944 B1 | 1/2007 | Estakhri |
| 7,167,953 B2 | 1/2007 | Megiddo et al. |
| 7,171,536 B2 | 1/2007 | Chang et al. |
| 7,173,852 B2 | 2/2007 | Gorobets et al. |
| 7,177,197 B2 | 2/2007 | Cernea |
| 7,178,081 B2 | 2/2007 | Lee et al. |
| 7,181,569 B2 | 2/2007 | Greco et al. |
| 7,181,572 B2 | 2/2007 | Walmsley |
| 7,185,162 B1 | 2/2007 | Snyder |
| 7,185,265 B2 | 2/2007 | Kakuta et al. |
| 7,194,577 B2 | 3/2007 | Johnson et al. |
| 7,194,740 B1 | 3/2007 | Frank et al. |
| 7,197,567 B1 | 3/2007 | Fitzgerald |
| 7,197,657 B1 | 3/2007 | Tobias |
| 7,200,758 B2 | 4/2007 | Zimmer |
| 7,203,815 B2 | 4/2007 | Haswell |
| 7,215,580 B2 | 5/2007 | Gorobets |
| 7,219,197 B2 | 5/2007 | Hatakeyama |
| 7,219,238 B2 | 5/2007 | Saito et al. |
| 7,225,247 B2 | 5/2007 | Kennedy et al. |
| 7,227,777 B2 | 6/2007 | Roohparvar |
| 7,231,401 B1 | 6/2007 | Inohara et al. |
| 7,234,082 B2 | 6/2007 | Lai et al. |
| 7,237,141 B2 | 6/2007 | Fredin |
| 7,240,152 B2 | 7/2007 | Nakayama et al. |
| 7,243,203 B2 | 7/2007 | Scheuerlein |
| 7,246,179 B2 | 7/2007 | Camara et al. |
| 7,248,691 B1 | 7/2007 | Pandit et al. |
| 7,254,672 B1 | 8/2007 | Murray et al. |
| 7,254,686 B2 | 8/2007 | Islam et al. |
| 7,256,641 B2 | 8/2007 | Namekawa et al. |
| 7,257,129 B2 | 8/2007 | Lee et al. |
| 7,257,690 B1 | 8/2007 | Baird |
| 7,260,820 B1 | 8/2007 | Waldspurger et al. |
| 7,263,591 B2 | 8/2007 | Estakhri et al. |
| 7,269,534 B2 | 9/2007 | Mugunda et al. |
| 7,272,755 B2 | 9/2007 | Smith |
| 7,275,098 B1 | 9/2007 | Becher et al. |
| 7,275,135 B2 | 9/2007 | Coulson |
| 7,280,373 B2 | 10/2007 | Aizawa |
| 7,280,536 B2 | 10/2007 | Testardi |
| 7,281,076 B2 | 10/2007 | Yates et al. |
| 7,284,089 B2 | 10/2007 | Gall et al. |
| 7,287,109 B2 | 10/2007 | Barth et al. |
| 7,290,116 B1 | 10/2007 | Grohoski et al. |
| 7,293,165 B1 | 11/2007 | Tobias |
| 7,293,183 B2 | 11/2007 | Lee et al. |
| 7,293,196 B2 | 11/2007 | Hicken et al. |
| 7,299,339 B2 | 11/2007 | Ramesh |
| 7,299,354 B2 | 11/2007 | Khanna et al. |
| 7,301,805 B2 | 11/2007 | Gorobets et al. |
| 7,305,520 B2 | 12/2007 | Voigt et al. |
| 7,305,668 B2 | 12/2007 | Kennedy |
| 7,310,711 B2 | 12/2007 | New et al. |
| 7,318,173 B1 | 1/2008 | Falik et al. |
| 7,324,614 B2 | 1/2008 | Lee et al. |
| 7,328,307 B2 | 2/2008 | Hoogterp |
| 7,337,201 B1 | 2/2008 | Yellin et al. |
| 7,340,558 B2 | 3/2008 | Lee et al. |
| 7,340,566 B2 | 3/2008 | Voth et al. |
| 7,340,581 B2 | 3/2008 | Gorobets et al. |
| 7,340,645 B1 | 3/2008 | Martin et al. |
| 7,340,665 B2 | 3/2008 | Tsang |
| 7,343,465 B2 | 3/2008 | Shibayama et al. |
| 7,353,324 B2 | 4/2008 | Tanaka |
| 7,356,651 B2 | 4/2008 | Liu et al. |
| 7,356,730 B2 | 4/2008 | Ulrich et al. |
| 7,360,015 B2 | 4/2008 | Matthews et al. |
| 7,360,037 B2 | 4/2008 | Higaki et al. |
| 7,366,808 B2 | 4/2008 | Kano et al. |
| 7,366,825 B2 | 4/2008 | Williams et al. |
| 7,366,868 B2 | 4/2008 | Reuter et al. |
| 7,370,163 B2 | 5/2008 | Yang et al. |
| 7,373,514 B2 | 5/2008 | Krueger et al. |
| 7,376,034 B2 | 5/2008 | Torabi et al. |
| 7,380,081 B2 | 5/2008 | Ji et al. |
| 7,389,465 B2 | 6/2008 | Radke et al. |
| 7,392,365 B2 | 6/2008 | Selkirk et al. |
| 7,395,384 B2 | 7/2008 | Sinclair et al. |
| 7,398,348 B2 | 7/2008 | Moore et al. |
| 7,400,537 B2 | 7/2008 | Hemink et al. |
| 7,403,424 B2 | 7/2008 | Hemink et al. |
| 7,415,575 B1 | 8/2008 | Tong et al. |
| 7,418,490 B1 | 8/2008 | Zhang et al. |
| 7,424,593 B2 | 9/2008 | Estakhri et al. |
| 7,428,691 B2 | 9/2008 | Ouchi |
| 7,430,465 B2 | 9/2008 | Liebl et al. |
| 7,434,097 B2 | 10/2008 | Guha et al. |
| 7,437,510 B2 | 10/2008 | Rosenbluth et al. |
| 7,441,067 B2 | 10/2008 | Gorobets et al. |
| 7,441,081 B2 | 10/2008 | Humlicek |
| 7,441,090 B2 | 10/2008 | Estakhri et al. |
| 7,444,460 B2 | 10/2008 | Nakanishi et al. |
| 7,447,847 B2 | 11/2008 | Louie et al. |
| 7,450,420 B2 | 11/2008 | Sinclair et al. |
| 7,451,128 B2 | 11/2008 | Song et al. |
| 7,451,344 B1 | 11/2008 | Rothberg |
| 7,451,346 B2 | 11/2008 | Katsuragi et al. |
| 7,454,555 B2 | 11/2008 | Ware et al. |
| 7,457,166 B2 | 11/2008 | Hemink et al. |
| 7,457,897 B1 | 11/2008 | Lee et al. |
| 7,460,432 B2 | 12/2008 | Warner |
| 7,463,521 B2 | 12/2008 | Li |
| 7,463,532 B2 | 12/2008 | Tran et al. |
| 7,464,221 B2 | 12/2008 | Nakamura et al. |
| 7,464,240 B2 | 12/2008 | Caulkins et al. |
| 7,480,766 B2 | 1/2009 | Gorobets |
| 7,487,235 B2 | 2/2009 | Andrews et al. |
| 7,487,320 B2 | 2/2009 | Bansal et al. |
| 7,487,343 B1 | 2/2009 | Insley et al. |
| 7,495,954 B2 | 2/2009 | Ito |
| 7,499,317 B2 | 3/2009 | Ito |
| 7,499,320 B2 | 3/2009 | Li |
| 7,499,338 B2 | 3/2009 | Ito |
| 7,500,000 B2 | 3/2009 | Groves et al. |
| 7,502,255 B2 | 3/2009 | Li |
| 7,502,369 B2 | 3/2009 | Teoh |
| 7,502,884 B1 | 3/2009 | Shah et al. |
| 7,505,321 B2 | 3/2009 | Scheuerlein et al. |
| 7,509,454 B2 | 3/2009 | Kano |
| 7,516,267 B2 | 4/2009 | Coulson et al. |
| 7,522,457 B2 | 4/2009 | Hemink et al. |
| 7,523,249 B1 | 4/2009 | Estakhri et al. |
| 7,523,546 B2 | 4/2009 | Vatanparast et al. |
| 7,526,614 B2 | 4/2009 | Van Riel |
| 7,529,905 B2 | 5/2009 | Sinclair |
| 7,532,537 B2 | 5/2009 | Solomon et al. |
| 7,535,766 B2 | 5/2009 | Ito |
| 7,536,491 B2 | 5/2009 | Kano et al. |

(56) References Cited

U.S. PATENT DOCUMENTS

| | | |
|---|---|---|
| 7,548,464 B2 | 6/2009 | Kim |
| 7,549,013 B2 | 6/2009 | Estakhri et al. |
| 7,552,271 B2 | 6/2009 | Sinclair et al. |
| 7,565,569 B2 | 7/2009 | Zohar et al. |
| 7,574,554 B2 | 8/2009 | Tanaka et al. |
| 7,580,287 B2 | 8/2009 | Aritome |
| 7,590,796 B2 | 9/2009 | Rajan et al. |
| 7,594,471 B2 | 9/2009 | Koekemoer et al. |
| 7,599,967 B2 | 10/2009 | Girkar et al. |
| 7,603,532 B2 | 10/2009 | Rajan et al. |
| 7,610,348 B2 | 10/2009 | Kisley et al. |
| 7,619,912 B2 | 11/2009 | Bhakta et al. |
| 7,619,941 B2 | 11/2009 | Torabi et al. |
| 7,620,769 B2 | 11/2009 | Lee et al. |
| 7,620,773 B2 | 11/2009 | Nicholson et al. |
| 7,624,239 B2 | 11/2009 | Bennett et al. |
| 7,630,255 B2 | 12/2009 | Yang |
| 7,631,138 B2 | 12/2009 | Gonzalez et al. |
| 7,631,162 B2 | 12/2009 | Gorobets |
| 7,640,390 B2 | 12/2009 | Iwamura et al. |
| 7,644,206 B2 | 1/2010 | Lawson et al. |
| 7,644,239 B2 | 1/2010 | Ergan et al. |
| 7,652,922 B2 | 1/2010 | Kim et al. |
| 7,660,911 B2 | 2/2010 | McDaniel |
| 7,660,941 B2 | 2/2010 | Lee et al. |
| 7,664,239 B2 | 2/2010 | Groff et al. |
| 7,664,906 B2 | 2/2010 | Chung et al. |
| 7,669,019 B2 | 2/2010 | Fujibayashi et al. |
| 7,673,111 B2 | 3/2010 | Chen et al. |
| 7,676,625 B2 | 3/2010 | Cassiday et al. |
| 7,676,628 B1 | 3/2010 | Compton et al. |
| 7,676,728 B2 | 3/2010 | Resnick et al. |
| 7,689,599 B1 | 3/2010 | Shah et al. |
| 7,689,803 B2 | 3/2010 | Karr et al. |
| 7,702,873 B2 | 4/2010 | Griess et al. |
| 7,707,232 B2 | 4/2010 | Dussud et al. |
| 7,707,337 B2 | 4/2010 | Lee et al. |
| 7,720,864 B1 | 5/2010 | Muth et al. |
| 7,721,059 B2 | 5/2010 | Mylly et al. |
| 7,725,628 B1 | 5/2010 | Phan et al. |
| 7,725,661 B2 | 5/2010 | Liu et al. |
| 7,734,643 B1 | 6/2010 | Waterhouse et al. |
| 7,743,210 B1 | 6/2010 | Jernigan, IV et al. |
| 7,752,360 B2 | 7/2010 | Galles |
| 7,752,389 B1 | 7/2010 | Fan |
| 7,761,625 B2 | 7/2010 | Karamcheti et al. |
| RE205,335 | 8/2010 | Phan et al. |
| 7,773,521 B2 | 8/2010 | Zhang et al. |
| 7,774,392 B2 | 8/2010 | Lin |
| 7,774,542 B2 | 8/2010 | Zhang et al. |
| 7,777,652 B2 | 8/2010 | Lee et al. |
| 7,778,092 B2 | 8/2010 | Klein |
| 7,778,961 B2 | 8/2010 | Chang et al. |
| 7,783,956 B2 | 8/2010 | Ko et al. |
| 7,797,479 B2 | 9/2010 | Trika et al. |
| 7,818,525 B1 | 10/2010 | Frost et al. |
| 7,822,887 B2 | 10/2010 | Torabi et al. |
| 7,827,442 B2 | 11/2010 | Sharma et al. |
| 7,831,783 B2 | 11/2010 | Pandit et al. |
| 7,836,226 B2 | 11/2010 | Flynn et al. |
| 7,840,839 B2 | 11/2010 | Scales et al. |
| 7,853,772 B2 | 12/2010 | Chang et al. |
| 7,856,528 B1 | 12/2010 | Frost et al. |
| 7,865,761 B1 | 1/2011 | Chilton |
| 7,873,693 B1 | 1/2011 | Mehrotra et al. |
| 7,873,782 B2 | 1/2011 | Terry et al. |
| 7,873,803 B2 | 1/2011 | Cheng |
| 7,877,539 B2 | 1/2011 | Sinclair et al. |
| 7,881,150 B2 | 2/2011 | Solomon et al. |
| 7,882,305 B2 | 2/2011 | Moritoki |
| 7,885,413 B2 | 2/2011 | Vasic et al. |
| 7,898,867 B2 | 3/2011 | Hazama et al. |
| 7,903,468 B2 | 3/2011 | Litsyn et al. |
| 7,904,647 B2 | 3/2011 | El-Batal et al. |
| 7,908,501 B2 | 3/2011 | Kim et al. |
| 7,913,051 B1 | 3/2011 | Todd et al. |
| 7,917,803 B2 | 3/2011 | Stefanus et al. |
| 7,925,879 B2 | 4/2011 | Yasaki et al. |
| 7,925,936 B1 | 4/2011 | Sommer |
| 7,930,326 B2 | 4/2011 | Doucette et al. |
| 7,930,589 B2 | 4/2011 | Lavastre et al. |
| 7,934,072 B2 | 4/2011 | Hobbet et al. |
| 7,941,591 B2 | 5/2011 | Aviles |
| 7,944,762 B2 | 5/2011 | Gorobets |
| 7,958,280 B2 | 6/2011 | Salessi et al. |
| 7,970,770 B2 | 6/2011 | Edwards |
| 7,970,806 B2 | 6/2011 | Park et al. |
| 7,970,919 B1 | 6/2011 | Duran |
| 7,973,531 B2 | 7/2011 | Findeklee et al. |
| 7,978,541 B2 | 7/2011 | Sutardja |
| 7,984,230 B2 | 7/2011 | Nasu et al. |
| 7,991,940 B2 | 8/2011 | Frydman et al. |
| 8,001,334 B2 | 8/2011 | Lee |
| 8,001,434 B1 | 8/2011 | Lee et al. |
| 8,010,738 B1 | 8/2011 | Chilton et al. |
| 8,019,938 B2 | 9/2011 | Flynn et al. |
| 8,019,940 B2 | 9/2011 | Flynn et al. |
| 8,028,120 B2 | 9/2011 | Mo et al. |
| 8,046,500 B2 | 10/2011 | Flynn et al. |
| 8,046,526 B2 | 10/2011 | Yeh |
| 8,046,551 B1 | 10/2011 | Sahin |
| 8,055,820 B2 | 11/2011 | Sebire |
| 8,055,922 B2 | 11/2011 | Brittain et al. |
| 8,055,979 B2 | 11/2011 | Wu et al. |
| 8,074,041 B2 | 12/2011 | Clark et al. |
| 8,078,794 B2 | 12/2011 | Lee et al. |
| 8,081,536 B1 | 12/2011 | Solomon et al. |
| 8,090,886 B2 | 1/2012 | Phan et al. |
| 8,112,574 B2 | 2/2012 | Lee et al. |
| 8,127,103 B2 | 2/2012 | Kano et al. |
| 8,130,551 B2 | 3/2012 | Oowada et al. |
| 8,135,900 B2 | 3/2012 | Kunimatsu et al. |
| 8,135,904 B2 | 3/2012 | Lasser et al. |
| 8,151,082 B2 | 4/2012 | Flynn et al. |
| 8,156,281 B1 | 4/2012 | Grosner et al. |
| 8,161,353 B2 | 4/2012 | Flynn et al. |
| 8,171,204 B2 | 5/2012 | Chow et al. |
| 8,175,099 B2 | 5/2012 | Hodges et al. |
| 8,189,407 B2 | 5/2012 | Strasser et al. |
| 8,205,015 B2 | 6/2012 | Flynn et al. |
| 8,205,060 B2 | 6/2012 | Hahn et al. |
| 8,214,583 B2 | 7/2012 | Sinclair et al. |
| 8,214,591 B2 | 7/2012 | Flynn et al. |
| 8,234,450 B2 | 7/2012 | Glover et al. |
| 8,250,295 B2 | 8/2012 | Amidi et al. |
| 8,261,005 B2 | 9/2012 | Flynn et al. |
| 8,289,801 B2 | 10/2012 | Smith et al. |
| 8,296,628 B2 | 10/2012 | Madan |
| 8,301,810 B2 | 10/2012 | Pang et al. |
| 8,301,833 B1 | 10/2012 | Chen et al. |
| 8,315,092 B2 | 11/2012 | Strasser et al. |
| 8,359,501 B1 | 1/2013 | Lee et al. |
| 8,364,888 B2 | 1/2013 | Melik-Martirosian et al. |
| 8,402,069 B2 | 3/2013 | Rajaram et al. |
| 8,402,226 B1 | 3/2013 | Faibish et al. |
| 8,417,901 B2 | 4/2013 | Lin |
| 8,423,701 B2 | 4/2013 | Perroni et al. |
| 8,423,710 B1 | 4/2013 | Gole |
| 8,429,242 B1 | 4/2013 | Todd |
| 8,429,436 B2 | 4/2013 | Fillingim et al. |
| 8,446,892 B2 | 5/2013 | Ji et al. |
| 8,463,846 B2 | 6/2013 | Girbal |
| 8,489,817 B2 | 7/2013 | Flynn et al. |
| 8,489,820 B1 | 7/2013 | Ellard |
| 8,495,292 B2 | 7/2013 | Flynn et al. |
| 8,516,185 B2 | 8/2013 | Lee et al. |
| 8,516,187 B2 | 8/2013 | Chen et al. |
| 8,533,391 B2 | 9/2013 | Song et al. |
| 8,533,406 B2 | 9/2013 | Flynn et al. |
| 8,549,230 B1 | 10/2013 | Chatterjee et al. |
| 8,572,310 B2 | 10/2013 | Oh et al. |
| 8,595,573 B2 | 11/2013 | Shalvi et al. |
| 8,607,028 B2 | 12/2013 | Kale et al. |
| 8,694,722 B2 | 4/2014 | Gorobets et al. |

(56) References Cited

U.S. PATENT DOCUMENTS

| | | | |
|---|---|---|---|
| 8,745,011 B2 | 6/2014 | Kishi | |
| 8,762,658 B2 | 6/2014 | Flynn et al. | |
| 8,838,875 B2 | 9/2014 | Park | |
| 8,904,091 B1 | 12/2014 | Guda et al. | |
| 9,015,209 B2 | 4/2015 | Hahn et al. | |
| 9,116,823 B2 | 8/2015 | Fillingim et al. | |
| 9,152,556 B2 | 10/2015 | Olbrich et al. | |
| 9,170,754 B2 | 10/2015 | Flynn et al. | |
| 9,207,876 B2 | 12/2015 | Shu et al. | |
| 9,286,198 B2 | 3/2016 | Bennett | |
| 9,495,241 B2 | 11/2016 | Flynn et al. | |
| 9,575,902 B2 | 2/2017 | Flynn et al. | |
| 9,632,727 B2 | 4/2017 | Flynn et al. | |
| 10,013,354 B2 | 7/2018 | Flynn et al. | |
| 10,133,662 B2 | 11/2018 | Peterson et al. | |
| 10,216,569 B2 | 2/2019 | Flynn et al. | |
| 10,296,220 B2 | 5/2019 | Batwara et al. | |
| 10,331,351 B2 | 6/2019 | Asnaashari et al. | |
| 10,387,327 B2 * | 8/2019 | Flynn | G06F 3/0652 |
| 10,387,328 B2 * | 8/2019 | Flynn | G06F 3/0685 |
| 2001/0007533 A1 | 7/2001 | Kobayashi et al. | |
| 2001/0008007 A1 | 7/2001 | Halligan et al. | |
| 2001/0013087 A1 | 8/2001 | Ronstrom | |
| 2001/0021924 A1 | 9/2001 | Ohno | |
| 2001/0025360 A1 | 9/2001 | Kakuta et al. | |
| 2001/0052093 A1 | 12/2001 | Oshima et al. | |
| 2002/0002661 A1 | 1/2002 | Blumenau et al. | |
| 2002/0035665 A1 | 3/2002 | Basham et al. | |
| 2002/0048191 A1 | 4/2002 | Ikehashi et al. | |
| 2002/0049883 A1 | 4/2002 | Schneider et al. | |
| 2002/0051468 A1 | 5/2002 | Ofek et al. | |
| 2002/0053009 A1 | 5/2002 | Selkirk et al. | |
| 2002/0057798 A1 | 5/2002 | Zhang | |
| 2002/0066047 A1 | 5/2002 | Olarig et al. | |
| 2002/0069317 A1 | 6/2002 | Chow et al. | |
| 2002/0069318 A1 | 6/2002 | Chow et al. | |
| 2002/0078124 A1 | 6/2002 | Baylor et al. | |
| 2002/0095403 A1 | 7/2002 | Chan et al. | |
| 2002/0103819 A1 | 8/2002 | Duvillier et al. | |
| 2002/0108016 A1 | 8/2002 | Haines et al. | |
| 2002/0111996 A1 | 8/2002 | Jones et al. | |
| 2002/0133743 A1 | 9/2002 | Oldfield et al. | |
| 2002/0138686 A1 | 9/2002 | Yang et al. | |
| 2002/0150154 A1 | 10/2002 | Warke | |
| 2002/0154645 A1 | 10/2002 | Hu et al. | |
| 2002/0156984 A1 | 10/2002 | Padovano | |
| 2002/0161855 A1 | 10/2002 | Manczak et al. | |
| 2002/0161972 A1 | 10/2002 | Talagala et al. | |
| 2002/0174326 A1 | 11/2002 | Kling et al. | |
| 2002/0181134 A1 | 12/2002 | Bunker et al. | |
| 2002/0182899 A1 | 12/2002 | Debord et al. | |
| 2002/0184481 A1 | 12/2002 | Bish et al. | |
| 2002/0194451 A1 | 12/2002 | Mukaida et al. | |
| 2002/0199056 A1 | 12/2002 | Ayukawa et al. | |
| 2003/0002503 A1 | 1/2003 | Brewer et al. | |
| 2003/0014598 A1 | 1/2003 | Brown | |
| 2003/0023784 A1 | 1/2003 | Matsunami et al. | |
| 2003/0023911 A1 | 1/2003 | Davis et al. | |
| 2003/0028704 A1 | 2/2003 | Mukaida et al. | |
| 2003/0028726 A1 | 2/2003 | Gaertner et al. | |
| 2003/0033361 A1 | 2/2003 | Garnett et al. | |
| 2003/0041211 A1 | 2/2003 | Merkey et al. | |
| 2003/0046380 A1 | 3/2003 | Steger et al. | |
| 2003/0056142 A1 | 3/2003 | Hashemi | |
| 2003/0061296 A1 | 3/2003 | Craddock et al. | |
| 2003/0065866 A1 | 4/2003 | Spencer | |
| 2003/0070034 A1 | 4/2003 | Friedman et al. | |
| 2003/0093741 A1 | 5/2003 | Argon et al. | |
| 2003/0099312 A1 | 5/2003 | Gummadi et al. | |
| 2003/0101025 A1 | 5/2003 | Shah et al. | |
| 2003/0115405 A1 | 6/2003 | Funyu et al. | |
| 2003/0126420 A1 | 7/2003 | Murayama et al. | |
| 2003/0126475 A1 | 7/2003 | Bodas | |
| 2003/0130969 A1 | 7/2003 | Hawkins et al. | |
| 2003/0131182 A1 | 7/2003 | Kumar et al. | |
| 2003/0135808 A1 | 7/2003 | Kakuta et al. | |
| 2003/0140051 A1 | 7/2003 | Fujiwara et al. | |
| 2003/0142764 A1 | 7/2003 | Keevill et al. | |
| 2003/0145230 A1 | 7/2003 | Chiu et al. | |
| 2003/0149753 A1 | 8/2003 | Lamb | |
| 2003/0163630 A1 | 8/2003 | Aasheim et al. | |
| 2003/0163633 A1 | 8/2003 | Aasheim et al. | |
| 2003/0163663 A1 | 8/2003 | Aasheim et al. | |
| 2003/0165076 A1 | 9/2003 | Gorobets et al. | |
| 2003/0198084 A1 | 10/2003 | Fujisawa et al. | |
| 2003/0204788 A1 | 10/2003 | Smith | |
| 2003/0210601 A1 | 11/2003 | Lin et al. | |
| 2003/0221060 A1 | 11/2003 | Um et al. | |
| 2004/0003002 A1 * | 1/2004 | Adelmann | G06F 16/10 |
| 2004/0003167 A1 | 1/2004 | Kimura et al. | |
| 2004/0010612 A1 | 1/2004 | Pandya | |
| 2004/0010742 A1 | 1/2004 | Williamson et al. | |
| 2004/0025064 A1 | 2/2004 | Felsman | |
| 2004/0034750 A1 | 2/2004 | Horn | |
| 2004/0044705 A1 | 3/2004 | Stager et al. | |
| 2004/0044840 A1 | 3/2004 | Wong | |
| 2004/0054867 A1 | 3/2004 | Stravers et al. | |
| 2004/0059870 A1 | 3/2004 | Ash et al. | |
| 2004/0064558 A1 | 4/2004 | Miyake | |
| 2004/0064600 A1 | 4/2004 | Lee et al. | |
| 2004/0064647 A1 | 4/2004 | DeWhitt et al. | |
| 2004/0070955 A1 | 4/2004 | Dobbs et al. | |
| 2004/0073806 A1 | 4/2004 | Zimmer | |
| 2004/0073829 A1 | 4/2004 | Olarig | |
| 2004/0078456 A1 | 4/2004 | Kennedy et al. | |
| 2004/0088514 A1 | 5/2004 | Bullen et al. | |
| 2004/0093463 A1 | 5/2004 | Shang | |
| 2004/0098544 A1 | 5/2004 | Gaither et al. | |
| 2004/0098575 A1 | 5/2004 | Datta et al. | |
| 2004/0103238 A1 | 5/2004 | Avraham et al. | |
| 2004/0103245 A1 | 5/2004 | Fukusawa et al. | |
| 2004/0117586 A1 | 6/2004 | Estakhri et al. | |
| 2004/0122559 A1 | 6/2004 | Young et al. | |
| 2004/0122888 A1 | 6/2004 | Carmichael | |
| 2004/0128470 A1 | 7/2004 | Hetzler et al. | |
| 2004/0133771 A1 | 7/2004 | King et al. | |
| 2004/0139282 A1 | 7/2004 | Yoshioka et al. | |
| 2004/0148360 A1 | 7/2004 | Mehra et al. | |
| 2004/0150964 A1 | 8/2004 | Uzuka et al. | |
| 2004/0158589 A1 | 8/2004 | Liang et al. | |
| 2004/0177054 A1 | 9/2004 | Stern et al. | |
| 2004/0177216 A1 * | 9/2004 | Asari | G06F 12/0246 |
| | | | 711/103 |
| 2004/0179387 A1 | 9/2004 | Abraham | |
| 2004/0186946 A1 | 9/2004 | Lee | |
| 2004/0205177 A1 | 10/2004 | Levy et al. | |
| 2004/0207440 A1 | 10/2004 | Robertson et al. | |
| 2004/0221132 A1 | 11/2004 | Torkelsson et al. | |
| 2004/0225719 A1 | 11/2004 | Kisley et al. | |
| 2004/0225946 A1 | 11/2004 | Hashimoto et al. | |
| 2004/0228063 A1 | 11/2004 | Hawkins et al. | |
| 2004/0230710 A1 | 11/2004 | Goodman | |
| 2004/0230866 A1 | 11/2004 | Yates et al. | |
| 2004/0233910 A1 | 11/2004 | Chen et al. | |
| 2004/0236761 A1 | 11/2004 | Both | |
| 2004/0236798 A1 | 11/2004 | Srinivasan et al. | |
| 2004/0247022 A1 | 12/2004 | Raghavan et al. | |
| 2004/0250019 A1 | 12/2004 | Fujie et al. | |
| 2004/0255122 A1 | 12/2004 | Ingerman et al. | |
| 2004/0260947 A1 | 12/2004 | Brady et al. | |
| 2004/0264847 A1 | 12/2004 | Koh et al. | |
| 2004/0267482 A1 | 12/2004 | Robertson et al. | |
| 2004/0267483 A1 | 12/2004 | Percer et al. | |
| 2004/0267486 A1 | 12/2004 | Percer et al. | |
| 2004/0268013 A1 | 12/2004 | Pagan | |
| 2004/0268064 A1 | 12/2004 | Rudelic | |
| 2004/0268359 A1 | 12/2004 | Hanes | |
| 2005/0002263 A1 | 1/2005 | Iwase et al. | |
| 2005/0005191 A1 | 1/2005 | Judd | |
| 2005/0010715 A1 | 1/2005 | Davies et al. | |
| 2005/0015539 A1 | 1/2005 | Horii et al. | |
| 2005/0015685 A1 | 1/2005 | Yamamoto | |
| 2005/0018527 A1 | 1/2005 | Gorobets | |
| 2005/0021260 A1 | 1/2005 | Robertson et al. | |

(56) References Cited

U.S. PATENT DOCUMENTS

| | | |
|---|---|---|
| 2005/0027851 A1 | 2/2005 | McKeown et al. |
| 2005/0027900 A1 | 2/2005 | Pettey |
| 2005/0027951 A1 | 2/2005 | Piccirillo et al. |
| 2005/0042893 A1 | 2/2005 | Debord et al. |
| 2005/0055495 A1 | 3/2005 | Vihmalo et al. |
| 2005/0055497 A1 | 3/2005 | Estakhri et al. |
| 2005/0071461 A1 | 3/2005 | Mihm et al. |
| 2005/0071677 A1 | 3/2005 | Khanna et al. |
| 2005/0076107 A1 | 4/2005 | Goud et al. |
| 2005/0080887 A1 | 4/2005 | Lee et al. |
| 2005/0080994 A1 | 4/2005 | Cohen et al. |
| 2005/0091215 A1 | 4/2005 | Chandra et al. |
| 2005/0091452 A1 | 4/2005 | Chen et al. |
| 2005/0097243 A1 | 5/2005 | Yamashita et al. |
| 2005/0097278 A1 | 5/2005 | Hsu et al. |
| 2005/0102437 A1 | 5/2005 | Pettey et al. |
| 2005/0108292 A1 | 5/2005 | Burton et al. |
| 2005/0114591 A1 | 5/2005 | Coronado et al. |
| 2005/0120177 A1 | 6/2005 | Black |
| 2005/0132148 A1 | 6/2005 | Arimilli et al. |
| 2005/0132259 A1 | 6/2005 | Emmot et al. |
| 2005/0138092 A1 | 6/2005 | Abuaiadh et al. |
| 2005/0141312 A1 | 6/2005 | Sinclair et al. |
| 2005/0141313 A1 | 6/2005 | Gorobets et al. |
| 2005/0144358 A1 | 6/2005 | Conley et al. |
| 2005/0144361 A1 | 6/2005 | Gonzalez et al. |
| 2005/0144418 A1 | 6/2005 | Kita |
| 2005/0149472 A1 | 7/2005 | Schreter |
| 2005/0149618 A1 | 7/2005 | Cheng |
| 2005/0149645 A1 | 7/2005 | Tsuruta |
| 2005/0149819 A1 | 7/2005 | Hwang |
| 2005/0154786 A1 | 7/2005 | Shackelford |
| 2005/0168962 A1 | 8/2005 | Takeuchi et al. |
| 2005/0172099 A1 | 8/2005 | Lowe |
| 2005/0177672 A1 | 8/2005 | Rao |
| 2005/0177687 A1 | 8/2005 | Rao |
| 2005/0193166 A1 | 9/2005 | Johnson et al. |
| 2005/0201306 A1 | 9/2005 | Engel |
| 2005/0204187 A1 | 9/2005 | Lee et al. |
| 2005/0210323 A1 | 9/2005 | Batchelor et al. |
| 2005/0216653 A1 | 9/2005 | Aasheim et al. |
| 2005/0223154 A1 | 10/2005 | Uemura |
| 2005/0228963 A1 | 10/2005 | Rothman et al. |
| 2005/0229090 A1 | 10/2005 | Shen et al. |
| 2005/0235082 A1 | 10/2005 | Sato |
| 2005/0235088 A1 | 10/2005 | Kang |
| 2005/0235103 A1 | 10/2005 | Saliba et al. |
| 2005/0235132 A1 | 10/2005 | Karr et al. |
| 2005/0238035 A1 | 10/2005 | Riley |
| 2005/0240713 A1 | 10/2005 | Wu et al. |
| 2005/0246487 A1 | 11/2005 | Ergan et al. |
| 2005/0246510 A1 | 11/2005 | Retnamma et al. |
| 2005/0246558 A1 | 11/2005 | Ku |
| 2005/0257017 A1 | 11/2005 | Yagi |
| 2005/0257213 A1 | 11/2005 | Chu et al. |
| 2005/0262150 A1 | 11/2005 | Krishnaswamy |
| 2005/0267882 A1 | 12/2005 | Aupperlee et al. |
| 2005/0268037 A1 | 12/2005 | Hama et al. |
| 2005/0270927 A1 | 12/2005 | Hayashi |
| 2005/0271079 A1 | 12/2005 | Teoh |
| 2005/0273476 A1 | 12/2005 | Wertheimer et al. |
| 2005/0276092 A1 | 12/2005 | Hansen et al. |
| 2005/0283489 A1 | 12/2005 | Shiozawa et al. |
| 2006/0004955 A1 | 1/2006 | Ware et al. |
| 2006/0015529 A1 | 1/2006 | Yagawa |
| 2006/0017963 A1 | 1/2006 | Sakuda et al. |
| 2006/0020616 A1 | 1/2006 | Hardy et al. |
| 2006/0020744 A1* | 1/2006 | Sinclair ............... G06F 12/0246 711/103 |
| 2006/0020745 A1 | 1/2006 | Conley et al. |
| 2006/0020747 A1* | 1/2006 | Estakhri ............... G06F 3/0679 711/103 |
| 2006/0026221 A1 | 2/2006 | Chen et al. |
| 2006/0026263 A1 | 2/2006 | Raghavan et al. |
| 2006/0026339 A1 | 2/2006 | Rostampour |
| 2006/0026341 A1 | 2/2006 | Lasser |
| 2006/0026347 A1 | 2/2006 | Hung |
| 2006/0026385 A1 | 2/2006 | Dinechin et al. |
| 2006/0036904 A1 | 2/2006 | Yang |
| 2006/0047920 A1 | 3/2006 | Moore et al. |
| 2006/0047926 A1 | 3/2006 | Zheng |
| 2006/0059326 A1 | 3/2006 | Aasheim et al. |
| 2006/0059358 A1 | 3/2006 | Galal et al. |
| 2006/0064556 A1 | 3/2006 | Aasheim et al. |
| 2006/0069868 A1 | 3/2006 | Nonaka et al. |
| 2006/0069870 A1 | 3/2006 | Nicholson et al. |
| 2006/0069885 A1 | 3/2006 | Matsui et al. |
| 2006/0074877 A1 | 4/2006 | Kuersch et al. |
| 2006/0075057 A1 | 4/2006 | Gildea et al. |
| 2006/0075146 A1 | 4/2006 | Schoinas et al. |
| 2006/0085471 A1 | 4/2006 | Rajan et al. |
| 2006/0085626 A1 | 4/2006 | Roberson et al. |
| 2006/0085670 A1 | 4/2006 | Carver et al. |
| 2006/0085674 A1 | 4/2006 | Ananthamurthy |
| 2006/0090048 A1 | 4/2006 | Okumoto et al. |
| 2006/0090948 A1 | 5/2006 | Allen |
| 2006/0095659 A1 | 5/2006 | New et al. |
| 2006/0095661 A1 | 5/2006 | Fleiner et al. |
| 2006/0106514 A1 | 5/2006 | Liebl et al. |
| 2006/0106968 A1 | 5/2006 | Wooi Teoh |
| 2006/0106990 A1 | 5/2006 | Benhase et al. |
| 2006/0107097 A1 | 5/2006 | Zohar et al. |
| 2006/0107127 A1 | 5/2006 | Park et al. |
| 2006/0112297 A1 | 5/2006 | Davidson |
| 2006/0114917 A1 | 6/2006 | Raisch |
| 2006/0117056 A1 | 6/2006 | Havewala et al. |
| 2006/0117153 A1 | 6/2006 | Tran et al. |
| 2006/0117155 A1 | 6/2006 | Ware et al. |
| 2006/0120235 A1* | 6/2006 | Jensen ............... G06F 3/0652 369/47.1 |
| 2006/0129556 A1 | 6/2006 | Reuter |
| 2006/0129778 A1 | 6/2006 | Clark et al. |
| 2006/0136464 A1 | 6/2006 | Rossmann |
| 2006/0136507 A1 | 6/2006 | Bangalore |
| 2006/0136657 A1 | 6/2006 | Rudelic et al. |
| 2006/0136685 A1 | 6/2006 | Griv et al. |
| 2006/0136687 A1 | 6/2006 | Conley et al. |
| 2006/0136749 A1 | 6/2006 | Satou et al. |
| 2006/0136779 A1 | 6/2006 | Lee et al. |
| 2006/0139069 A1 | 6/2006 | Frank et al. |
| 2006/0139330 A1 | 6/2006 | Kutch et al. |
| 2006/0143209 A1 | 6/2006 | Zimmer et al. |
| 2006/0143396 A1 | 6/2006 | Cabot |
| 2006/0149893 A1 | 7/2006 | Barfuss et al. |
| 2006/0149902 A1 | 7/2006 | Yun et al. |
| 2006/0149916 A1 | 7/2006 | Nase |
| 2006/0149954 A1 | 7/2006 | Hageman et al. |
| 2006/0152981 A1 | 7/2006 | Ryu |
| 2006/0153026 A1 | 7/2006 | Blacquiere et al. |
| 2006/0155921 A1 | 7/2006 | Gorobets et al. |
| 2006/0159456 A1 | 7/2006 | Gumaste et al. |
| 2006/0161725 A1 | 7/2006 | Lee et al. |
| 2006/0164111 A1 | 7/2006 | Lopez et al. |
| 2006/0168154 A1 | 7/2006 | Zhang et al. |
| 2006/0179263 A1 | 8/2006 | Song et al. |
| 2006/0184349 A1 | 8/2006 | Goud et al. |
| 2006/0184722 A1 | 8/2006 | Sinclair |
| 2006/0184736 A1 | 8/2006 | Benhase et al. |
| 2006/0190552 A1 | 8/2006 | Henze et al. |
| 2006/0206286 A1 | 9/2006 | Mugunda et al. |
| 2006/0206603 A1 | 9/2006 | Rajan et al. |
| 2006/0206664 A1 | 9/2006 | Umemura |
| 2006/0212644 A1 | 9/2006 | Acton et al. |
| 2006/0224849 A1 | 10/2006 | Rezaul Islam et al. |
| 2006/0230295 A1 | 10/2006 | Schumacher et al. |
| 2006/0236061 A1 | 10/2006 | Koclanes |
| 2006/0242330 A1 | 10/2006 | Torudbakken et al. |
| 2006/0248387 A1 | 11/2006 | Nicholson et al. |
| 2006/0253767 A1 | 11/2006 | Winarski et al. |
| 2006/0265624 A1 | 11/2006 | Moshayedi et al. |
| 2006/0265635 A1 | 11/2006 | Tokita et al. |
| 2006/0265636 A1 | 11/2006 | Hummler |
| 2006/0271725 A1 | 11/2006 | Wong |
| 2006/0271740 A1 | 11/2006 | Mark et al. |

(56) References Cited

U.S. PATENT DOCUMENTS

| | | |
|---|---|---|
| 2006/0280048 A1 | 12/2006 | Jung et al. |
| 2006/0288156 A1 | 12/2006 | Fish et al. |
| 2006/0293045 A1 | 12/2006 | LaDue |
| 2006/0294300 A1 | 12/2006 | Lubbers |
| 2006/0294336 A1 | 12/2006 | Gibble et al. |
| 2007/0005928 A1 | 1/2007 | Trika et al. |
| 2007/0006048 A1 | 1/2007 | Zimmer et al. |
| 2007/0011563 A1 | 1/2007 | Tsang |
| 2007/0016699 A1 | 1/2007 | Minami |
| 2007/0016730 A1 | 1/2007 | Cousin et al. |
| 2007/0016754 A1 | 1/2007 | Testardi |
| 2007/0016827 A1 | 1/2007 | Lopez, Jr. et al. |
| 2007/0027948 A1 | 2/2007 | Engebretsen |
| 2007/0028035 A1 | 2/2007 | Nishihara |
| 2007/0028051 A1 | 2/2007 | Williamson et al. |
| 2007/0028053 A1 | 2/2007 | Shet et al. |
| 2007/0030734 A1 | 2/2007 | Sinclair et al. |
| 2007/0033318 A1 | 2/2007 | Gilday et al. |
| 2007/0033324 A1 | 2/2007 | Sinclair |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033330 A1 | 2/2007 | Sinclair et al. |
| 2007/0033362 A1 | 2/2007 | Sinclair |
| 2007/0033371 A1 | 2/2007 | Dunshea et al. |
| 2007/0033376 A1 | 2/2007 | Sinclair et al. |
| 2007/0043900 A1 | 2/2007 | Yun |
| 2007/0043915 A1 | 2/2007 | Moir et al. |
| 2007/0050548 A1 | 3/2007 | Bali et al. |
| 2007/0050571 A1 | 3/2007 | Nakamura et al. |
| 2007/0055853 A1 | 3/2007 | Hatasaki et al. |
| 2007/0058610 A1 | 3/2007 | Brandstatter |
| 2007/0061508 A1 | 3/2007 | Zweighaft |
| 2007/0061515 A1 | 3/2007 | Kano |
| 2007/0061597 A1 | 3/2007 | Holtzman et al. |
| 2007/0067326 A1 | 3/2007 | Morris et al. |
| 2007/0069318 A1 | 3/2007 | Takeuchi et al. |
| 2007/0073975 A1 | 3/2007 | Lee et al. |
| 2007/0074092 A1 | 3/2007 | Dammann et al. |
| 2007/0083530 A1 | 4/2007 | Lakshmi et al. |
| 2007/0086260 A1 | 4/2007 | Sinclair |
| 2007/0088666 A1 | 4/2007 | Saito |
| 2007/0088974 A1 | 4/2007 | Chandwani et al. |
| 2007/0106870 A1 | 5/2007 | Bonwick et al. |
| 2007/0113150 A1 | 5/2007 | Resnick et al. |
| 2007/0118676 A1 | 5/2007 | Kano et al. |
| 2007/0118713 A1 | 5/2007 | Guterman et al. |
| 2007/0124474 A1 | 5/2007 | Margulis |
| 2007/0124533 A1 | 5/2007 | Estakh |
| 2007/0124540 A1 | 5/2007 | Van Riel |
| 2007/0136555 A1 | 6/2007 | Sinclair |
| 2007/0141895 A1 | 6/2007 | Karstens |
| 2007/0143532 A1 | 6/2007 | Gorobets et al. |
| 2007/0143560 A1 | 6/2007 | Gorobets |
| 2007/0143561 A1 | 6/2007 | Gorobets |
| 2007/0143566 A1 | 6/2007 | Gorobets |
| 2007/0143567 A1 | 6/2007 | Gorobets |
| 2007/0143571 A1 | 6/2007 | Sinclair et al. |
| 2007/0143606 A1 | 6/2007 | Bandholz et al. |
| 2007/0147356 A1 | 6/2007 | Malas et al. |
| 2007/0147366 A1 | 6/2007 | Babbar et al. |
| 2007/0150689 A1 | 6/2007 | Pandit et al. |
| 2007/0156998 A1 | 7/2007 | Gorobets |
| 2007/0162830 A1 | 7/2007 | Stek et al. |
| 2007/0168564 A1 | 7/2007 | Conley et al. |
| 2007/0168625 A1 | 7/2007 | Cornwell et al. |
| 2007/0168641 A1 | 7/2007 | Hummel et al. |
| 2007/0168698 A1 | 7/2007 | Coulson et al. |
| 2007/0169030 A1 | 7/2007 | Tarditi et al. |
| 2007/0169088 A1 | 7/2007 | Lambert et al. |
| 2007/0169106 A1 | 7/2007 | Douglas et al. |
| 2007/0171714 A1 | 7/2007 | Wu et al. |
| 2007/0174437 A1 | 7/2007 | Kraus |
| 2007/0174574 A1 | 7/2007 | Kano |
| 2007/0174686 A1 | 7/2007 | Douglas et al. |
| 2007/0174705 A1 | 7/2007 | Shih |
| 2007/0185902 A1 | 8/2007 | Messinger et al. |
| 2007/0186086 A1 | 8/2007 | Lambert et al. |
| 2007/0198770 A1 | 8/2007 | Horii et al. |
| 2007/0198852 A1 | 8/2007 | Choi et al. |
| 2007/0204100 A1 | 8/2007 | Shin et al. |
| 2007/0204128 A1 | 8/2007 | Lee et al. |
| 2007/0204197 A1 | 8/2007 | Yokokawa |
| 2007/0204199 A1 | 8/2007 | Chung et al. |
| 2007/0204270 A1 | 8/2007 | Shin |
| 2007/0204332 A1 | 8/2007 | Pan |
| 2007/0206630 A1 | 9/2007 | Bird |
| 2007/0208790 A1 | 9/2007 | Reuter et al. |
| 2007/0220227 A1 | 9/2007 | Long |
| 2007/0220369 A1 | 9/2007 | Fayad et al. |
| 2007/0220396 A1 | 9/2007 | Jackson |
| 2007/0230253 A1 | 10/2007 | Kim |
| 2007/0233455 A1 | 10/2007 | Zimmer et al. |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0239728 A1 | 10/2007 | Smits |
| 2007/0239926 A1 | 10/2007 | Gyl et al. |
| 2007/0245068 A1 | 10/2007 | Yero |
| 2007/0245076 A1 | 10/2007 | Chang et al. |
| 2007/0245094 A1 | 10/2007 | Lee et al. |
| 2007/0245217 A1 | 10/2007 | Valle |
| 2007/0250660 A1 | 10/2007 | Gill et al. |
| 2007/0255430 A1 | 11/2007 | Sharma et al. |
| 2007/0255891 A1 | 11/2007 | Chow et al. |
| 2007/0260608 A1 | 11/2007 | Hertzberg et al. |
| 2007/0260811 A1 | 11/2007 | Merry, Jr. et al. |
| 2007/0260813 A1 | 11/2007 | Lin |
| 2007/0260821 A1 | 11/2007 | Zeffer et al. |
| 2007/0261030 A1 | 11/2007 | Wadhwa |
| 2007/0263514 A1 | 11/2007 | Iwata et al. |
| 2007/0266037 A1 | 11/2007 | Terry et al. |
| 2007/0266196 A1 | 11/2007 | Torii |
| 2007/0266219 A1 | 11/2007 | Hsieh et al. |
| 2007/0266276 A1 | 11/2007 | Gatzemeier et al. |
| 2007/0268754 A1 | 11/2007 | Lee et al. |
| 2007/0271468 A1 | 11/2007 | McKenney et al. |
| 2007/0271572 A1 | 11/2007 | Gupta et al. |
| 2007/0274150 A1 | 11/2007 | Gorobets |
| 2007/0276897 A1 | 11/2007 | Tameshige et al. |
| 2007/0276994 A1 | 11/2007 | Caulkins et al. |
| 2007/0283357 A1 | 12/2007 | Jeter et al. |
| 2007/0294474 A1 | 12/2007 | Panabaker et al. |
| 2007/0300008 A1 | 12/2007 | Rogers et al. |
| 2007/0300009 A1 | 12/2007 | Rogers et al. |
| 2008/0005220 A1 | 1/2008 | Tsunakawa et al. |
| 2008/0005222 A1 | 1/2008 | Lambert et al. |
| 2008/0005446 A1 | 1/2008 | Frantz et al. |
| 2008/0005465 A1 | 1/2008 | Matthews |
| 2008/0005468 A1 | 1/2008 | Faibish et al. |
| 2008/0005748 A1 | 1/2008 | Mathew et al. |
| 2008/0010395 A1 | 1/2008 | Mylly et al. |
| 2008/0010580 A1 | 1/2008 | Anderson et al. |
| 2008/0016294 A1 | 1/2008 | Hillier, III et al. |
| 2008/0016301 A1 | 1/2008 | Chen |
| 2008/0022187 A1 | 1/2008 | Bains |
| 2008/0025126 A1 | 1/2008 | Jewell et al. |
| 2008/0028058 A1 | 1/2008 | Shaw et al. |
| 2008/0031030 A1 | 2/2008 | Rajan et al. |
| 2008/0034153 A1 | 2/2008 | Lee et al. |
| 2008/0034259 A1 | 2/2008 | Ko et al. |
| 2008/0040522 A1 | 2/2008 | Matthews |
| 2008/0043769 A1 | 2/2008 | Hirai |
| 2008/0046443 A1 | 2/2008 | Fachan et al. |
| 2008/0046737 A1 | 2/2008 | Mihm et al. |
| 2008/0052377 A1 | 2/2008 | Light |
| 2008/0052477 A1 | 2/2008 | Lee et al. |
| 2008/0052483 A1 | 2/2008 | Rangarajan et al. |
| 2008/0052576 A1 | 2/2008 | Brandyberry et al. |
| 2008/0059752 A1 | 3/2008 | Serizawa |
| 2008/0059820 A1 | 3/2008 | Vaden et al. |
| 2008/0065815 A1 | 3/2008 | Nasu et al. |
| 2008/0077767 A1 | 3/2008 | Khosravi et al. |
| 2008/0080243 A1 | 4/2008 | Edahiro et al. |

(56) References Cited

U.S. PATENT DOCUMENTS

| | | |
|---|---|---|
| 2008/0082724 A1 | 4/2008 | Dunlop et al. |
| 2008/0082736 A1 | 4/2008 | Chow et al. |
| 2008/0082774 A1 | 4/2008 | Tomlin et al. |
| 2008/0086580 A1 | 4/2008 | Zhang et al. |
| 2008/0091876 A1 | 4/2008 | Fujibayashi et al. |
| 2008/0098083 A1 | 4/2008 | Shergill et al. |
| 2008/0098159 A1 | 4/2008 | Song et al. |
| 2008/0104344 A1 | 5/2008 | Shimozono et al. |
| 2008/0109090 A1 | 5/2008 | Esmaili et al. |
| 2008/0109647 A1 | 5/2008 | Gavens et al. |
| 2008/0114962 A1 | 5/2008 | Holt |
| 2008/0117686 A1 | 5/2008 | Yamada |
| 2008/0120303 A1 | 5/2008 | Selkirk et al. |
| 2008/0120469 A1 | 5/2008 | Kornegay et al. |
| 2008/0120518 A1 | 5/2008 | Ritz et al. |
| 2008/0123211 A1 | 5/2008 | Chng et al. |
| 2008/0126507 A1 | 5/2008 | Wilkinson |
| 2008/0126682 A1 | 5/2008 | Zhao et al. |
| 2008/0126686 A1 | 5/2008 | Sokolov et al. |
| 2008/0126700 A1 | 5/2008 | El-Batal et al. |
| 2008/0126704 A1 | 5/2008 | Ulrich et al. |
| 2008/0126852 A1 | 5/2008 | Brandyberry et al. |
| 2008/0133963 A1 | 6/2008 | Katano et al. |
| 2008/0137284 A1 | 6/2008 | Flynn et al. |
| 2008/0137658 A1 | 6/2008 | Wang |
| 2008/0140737 A1 | 6/2008 | Garst et al. |
| 2008/0140819 A1 | 6/2008 | Bailey et al. |
| 2008/0140918 A1 | 6/2008 | Sutardja |
| 2008/0140919 A1 | 6/2008 | Torabi et al. |
| 2008/0141043 A1 | 6/2008 | Flynn et al. |
| 2008/0144826 A1 | 6/2008 | Chang |
| 2008/0155051 A1 | 6/2008 | Moshayedi |
| 2008/0160899 A1 | 7/2008 | Henry et al. |
| 2008/0162590 A1 | 7/2008 | Kundu et al. |
| 2008/0162787 A1 | 7/2008 | Tomlin et al. |
| 2008/0163007 A1 | 7/2008 | Shaeffer et al. |
| 2008/0163220 A1 | 7/2008 | Wang et al. |
| 2008/0183882 A1 | 7/2008 | Flynn et al. |
| 2008/0183965 A1 | 7/2008 | Shiga et al. |
| 2008/0183968 A1 | 7/2008 | Huang |
| 2008/0195798 A1 | 8/2008 | Lee et al. |
| 2008/0195801 A1 | 8/2008 | Cheon et al. |
| 2008/0201535 A1 | 8/2008 | Hara |
| 2008/0205286 A1 | 8/2008 | Li et al. |
| 2008/0209090 A1 | 8/2008 | Kano et al. |
| 2008/0222309 A1 | 9/2008 | Shanbhogue |
| 2008/0228862 A1 | 9/2008 | Mackey |
| 2008/0228992 A1 | 9/2008 | Dumitru et al. |
| 2008/0229045 A1 | 9/2008 | Qi |
| 2008/0229046 A1 | 9/2008 | Raciborski |
| 2008/0229079 A1 | 9/2008 | Flynn et al. |
| 2008/0229381 A1 | 9/2008 | Sikka et al. |
| 2008/0235443 A1 | 9/2008 | Chow et al. |
| 2008/0235528 A1 | 9/2008 | Kim et al. |
| 2008/0243966 A1 | 10/2008 | Croisettier et al. |
| 2008/0244181 A1 | 10/2008 | Walz et al. |
| 2008/0256316 A1 | 10/2008 | Evanchik et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0266973 A1 | 10/2008 | Sekar et al. |
| 2008/0270714 A1 | 10/2008 | Van Den Bosch |
| 2008/0276040 A1 | 11/2008 | Moritoki |
| 2008/0282031 A1 | 11/2008 | Tanoue |
| 2008/0288819 A1 | 11/2008 | Heller, Jr. |
| 2008/0294847 A1 | 11/2008 | Maruyama et al. |
| 2008/0301475 A1 | 12/2008 | Felter et al. |
| 2008/0303692 A1 | 12/2008 | Hirai |
| 2008/0307192 A1 | 12/2008 | Sinclair et al. |
| 2008/0313364 A1 | 12/2008 | Flynn et al. |
| 2008/0320209 A1 | 12/2008 | Lee et al. |
| 2008/0320253 A1 | 12/2008 | Tomlin et al. |
| 2008/0320323 A1 | 12/2008 | Brittain et al. |
| 2009/0013056 A1 | 1/2009 | Weinstock et al. |
| 2009/0031072 A1 | 1/2009 | Sartore |
| 2009/0031098 A1 | 1/2009 | Sartore |
| 2009/0037651 A1 | 2/2009 | Gorobets |
| 2009/0037778 A1 | 2/2009 | Resnick |
| 2009/0043952 A1 | 2/2009 | Estakh et al. |
| 2009/0044078 A1 | 2/2009 | Vogan et al. |
| 2009/0070526 A1 | 3/2009 | Tetrick et al. |
| 2009/0070541 A1 | 3/2009 | Yochai |
| 2009/0083478 A1 | 3/2009 | Kunimatsu et al. |
| 2009/0083485 A1 | 3/2009 | Cheng |
| 2009/0089485 A1 | 4/2009 | Yeh |
| 2009/0089518 A1 | 4/2009 | Hobbet et al. |
| 2009/0091979 A1 | 4/2009 | Shalvi |
| 2009/0091996 A1 | 4/2009 | Chen et al. |
| 2009/0094676 A1 | 4/2009 | Burugula et al. |
| 2009/0100194 A1 | 4/2009 | Bhadri et al. |
| 2009/0106479 A1 | 4/2009 | Okin et al. |
| 2009/0113235 A1 | 4/2009 | Selinger |
| 2009/0125650 A1 | 5/2009 | Sebire |
| 2009/0125671 A1 | 5/2009 | Flynn et al. |
| 2009/0125700 A1 | 5/2009 | Kisel |
| 2009/0132760 A1 | 5/2009 | Flynn et al. |
| 2009/0141606 A1 | 6/2009 | Liu et al. |
| 2009/0144496 A1 | 6/2009 | Kawaguchi |
| 2009/0144818 A1 | 6/2009 | Kumar et al. |
| 2009/0150599 A1 | 6/2009 | Bennett |
| 2009/0150605 A1 | 6/2009 | Flynn et al. |
| 2009/0150621 A1 | 6/2009 | Lee |
| 2009/0150639 A1 | 6/2009 | Ohata |
| 2009/0150641 A1 | 6/2009 | Flynn et al. |
| 2009/0157956 A1 | 6/2009 | Kano |
| 2009/0157989 A1 | 6/2009 | Karam et al. |
| 2009/0172250 A1 | 7/2009 | Allen et al. |
| 2009/0172253 A1 | 7/2009 | Rothman et al. |
| 2009/0193183 A1 | 7/2009 | Kudo et al. |
| 2009/0204649 A1 | 8/2009 | Wong et al. |
| 2009/0204750 A1 | 8/2009 | Estakh et al. |
| 2009/0207649 A1 | 8/2009 | Tang et al. |
| 2009/0210636 A1 | 8/2009 | Karam et al. |
| 2009/0216944 A1 | 8/2009 | Gill et al. |
| 2009/0222596 A1 | 9/2009 | Flynn et al. |
| 2009/0228637 A1 | 9/2009 | Moon et al. |
| 2009/0235017 A1 | 9/2009 | Estakh et al. |
| 2009/0239468 A1 | 9/2009 | He et al. |
| 2009/0240873 A1 | 9/2009 | Yu et al. |
| 2009/0248763 A1* | 10/2009 | Rajan ............... H04L 67/1097 |
| 2009/0248922 A1 | 10/2009 | Hinohara et al. |
| 2009/0276588 A1 | 11/2009 | Murase |
| 2009/0276654 A1 | 11/2009 | Butterworth et al. |
| 2009/0287850 A1 | 11/2009 | Furukawa et al. |
| 2009/0287887 A1 | 11/2009 | Matsuki et al. |
| 2009/0292861 A1 | 11/2009 | Kanevsky et al. |
| 2009/0300277 A1 | 12/2009 | Jeddeloh |
| 2009/0307424 A1 | 12/2009 | Galloway et al. |
| 2009/0313453 A1 | 12/2009 | Stefanus et al. |
| 2009/0327602 A1 | 12/2009 | Moore et al. |
| 2009/0327804 A1 | 12/2009 | Moshayedi |
| 2010/0005228 A1 | 1/2010 | Fukutomi et al. |
| 2010/0005255 A1 | 1/2010 | Kaushik et al. |
| 2010/0011147 A1 | 1/2010 | Hummel et al. |
| 2010/0011150 A1 | 1/2010 | Klein |
| 2010/0017441 A1 | 1/2010 | Todd |
| 2010/0017556 A1 | 1/2010 | Chin et al. |
| 2010/0017568 A1 | 1/2010 | Wadhawan et al. |
| 2010/0023674 A1 | 1/2010 | Aviles |
| 2010/0023676 A1 | 1/2010 | Moon et al. |
| 2010/0023682 A1 | 1/2010 | Lee et al. |
| 2010/0030946 A1 | 2/2010 | Kano et al. |
| 2010/0031000 A1 | 2/2010 | Flynn et al. |
| 2010/0049913 A1 | 2/2010 | Marcu et al. |
| 2010/0070698 A1 | 3/2010 | Ungureanu et al. |
| 2010/0076936 A1 | 3/2010 | Rajan |
| 2010/0077133 A1 | 3/2010 | Jeon |
| 2010/0077194 A1 | 3/2010 | Zhao et al. |
| 2010/0082529 A1 | 4/2010 | Mace et al. |
| 2010/0082890 A1 | 4/2010 | Heo et al. |
| 2010/0082922 A1 | 4/2010 | George et al. |
| 2010/0091535 A1 | 4/2010 | Sommer et al. |
| 2010/0095059 A1 | 4/2010 | Kisley et al. |
| 2010/0100670 A1 | 4/2010 | Jeddeloh |

(56) References Cited

U.S. PATENT DOCUMENTS

| | | |
|---|---|---|
| 2010/0102999 A1 | 4/2010 | Lee et al. |
| 2010/0106917 A1 | 4/2010 | Ruberg et al. |
| 2010/0110748 A1 | 5/2010 | Best |
| 2010/0122017 A1 | 5/2010 | Toyama |
| 2010/0124123 A1 | 5/2010 | Lee |
| 2010/0131826 A1 | 5/2010 | Shalvi et al. |
| 2010/0146187 A1 | 6/2010 | Grimsrud et al. |
| 2010/0153617 A1 | 6/2010 | Miroshnichenko et al. |
| 2010/0153651 A1 | 6/2010 | Kushwah |
| 2010/0153660 A1 | 6/2010 | Lasser |
| 2010/0153680 A1 | 6/2010 | Baum et al. |
| 2010/0169542 A1 | 7/2010 | Sinclair |
| 2010/0174870 A1 | 7/2010 | Banerjee |
| 2010/0180161 A1 | 7/2010 | Kern et al. |
| 2010/0199020 A1 | 8/2010 | Lin et al. |
| 2010/0205231 A1 | 8/2010 | Cousins |
| 2010/0205335 A1 | 8/2010 | Phan et al. |
| 2010/0205368 A1 | 8/2010 | Gregg et al. |
| 2010/0211737 A1 | 8/2010 | Flynn et al. |
| 2010/0217916 A1 | 8/2010 | Gao et al. |
| 2010/0217948 A1 | 8/2010 | Mason et al. |
| 2010/0228936 A1 | 9/2010 | Wright et al. |
| 2010/0229005 A1 | 9/2010 | Herman et al. |
| 2010/0235597 A1 | 9/2010 | Arakawa |
| 2010/0250831 A1 | 9/2010 | O'Brien et al. |
| 2010/0251068 A1 | 9/2010 | Lin et al. |
| 2010/0257304 A1 | 10/2010 | Rajan et al. |
| 2010/0262738 A1 | 10/2010 | Swing et al. |
| 2010/0262740 A1 | 10/2010 | Borchers et al. |
| 2010/0262757 A1 | 10/2010 | Sprinkle et al. |
| 2010/0262758 A1 | 10/2010 | Swing et al. |
| 2010/0262759 A1 | 10/2010 | Borchers et al. |
| 2010/0262760 A1 | 10/2010 | Swing et al. |
| 2010/0262761 A1 | 10/2010 | Borchers et al. |
| 2010/0262762 A1 | 10/2010 | Borchers et al. |
| 2010/0262766 A1 | 10/2010 | Sprinkle et al. |
| 2010/0262767 A1 | 10/2010 | Borchers et al. |
| 2010/0262773 A1 | 10/2010 | Borchers et al. |
| 2010/0262894 A1 | 10/2010 | Swing et al. |
| 2010/0262979 A1 | 10/2010 | Borchers et al. |
| 2010/0268869 A1 | 10/2010 | Roh et al. |
| 2010/0268974 A1 | 10/2010 | Floyd et al. |
| 2010/0269542 A1 | 10/2010 | Nishiura et al. |
| 2010/0281207 A1 | 11/2010 | Miller et al. |
| 2010/0287347 A1 | 11/2010 | Cameron et al. |
| 2010/0293348 A1 | 11/2010 | Ye et al. |
| 2010/0318744 A1 | 12/2010 | Benhase et al. |
| 2010/0332871 A1 | 12/2010 | Allalouf et al. |
| 2010/0332897 A1 | 12/2010 | Wilson |
| 2011/0004722 A1 | 1/2011 | Jeddeloh |
| 2011/0016260 A1 | 1/2011 | Lomelino et al. |
| 2011/0022819 A1 | 1/2011 | Post et al. |
| 2011/0029728 A1 | 2/2011 | Popovski et al. |
| 2011/0035562 A1 | 2/2011 | Gaither |
| 2011/0047437 A1 | 2/2011 | Flynn |
| 2011/0055458 A1 | 3/2011 | Kuehne |
| 2011/0060861 A1 | 3/2011 | Warren |
| 2011/0066792 A1 | 3/2011 | Shaeffer et al. |
| 2011/0072207 A1 | 3/2011 | Jin et al. |
| 2011/0078415 A1 | 3/2011 | Johnson et al. |
| 2011/0093687 A1 | 4/2011 | Chen et al. |
| 2011/0099323 A1 | 4/2011 | Syu |
| 2011/0119441 A1 | 5/2011 | Peake et al. |
| 2011/0119446 A1 | 5/2011 | Blumrich et al. |
| 2011/0126045 A1 | 5/2011 | Bennett |
| 2011/0131231 A1 | 6/2011 | Haas et al. |
| 2011/0182119 A1 | 7/2011 | Strasser et al. |
| 2011/0191534 A1 | 8/2011 | Ash et al. |
| 2011/0208911 A1 | 8/2011 | Taguchi et al. |
| 2011/0208915 A1 | 8/2011 | Bannon et al. |
| 2011/0209028 A1 | 8/2011 | Post et al. |
| 2011/0214011 A1 | 9/2011 | Grube et al. |
| 2011/0219169 A1 | 9/2011 | Zhang et al. |
| 2011/0225347 A1 | 9/2011 | Goss et al. |
| 2011/0225364 A1 | 9/2011 | Edwards |
| 2011/0240749 A1 | 10/2011 | Naddor |
| 2011/0258391 A1 | 10/2011 | Atkisson et al. |
| 2011/0258512 A1 | 10/2011 | Flynn et al. |
| 2011/0295969 A1 | 12/2011 | Bernstein et al. |
| 2011/0296133 A1 | 12/2011 | Flynn et al. |
| 2011/0314071 A1 | 12/2011 | Johnson et al. |
| 2011/0320733 A1 | 12/2011 | Sanford et al. |
| 2012/0011340 A1 | 1/2012 | Flynn et al. |
| 2012/0030408 A1 | 2/2012 | Flynn et al. |
| 2012/0036309 A1 | 2/2012 | Dillow et al. |
| 2012/0041992 A1 | 2/2012 | Sutardja |
| 2012/0042224 A1 | 2/2012 | Wu et al. |
| 2012/0059978 A1 | 3/2012 | Rosenband et al. |
| 2012/0084489 A1 | 4/2012 | Gorobets et al. |
| 2012/0096217 A1 | 4/2012 | Son et al. |
| 2012/0102298 A1 | 4/2012 | Sengupta et al. |
| 2012/0110108 A1 | 5/2012 | Li et al. |
| 2012/0117304 A1 | 5/2012 | Worthington et al. |
| 2012/0124315 A1 | 5/2012 | Wang |
| 2012/0151118 A1 | 6/2012 | Flynn et al. |
| 2012/0191667 A1 | 7/2012 | Kopylovitz et al. |
| 2012/0203980 A1 | 8/2012 | Flynn et al. |
| 2012/0239860 A1 | 9/2012 | Atkisson et al. |
| 2012/0239868 A1 | 9/2012 | Ryan et al. |
| 2012/0254515 A1 | 10/2012 | Melik-Martirosian et al. |
| 2012/0297140 A1 | 11/2012 | Wu et al. |
| 2012/0320209 A1 | 12/2012 | Vico et al. |
| 2012/0331206 A1 | 12/2012 | Flynn et al. |
| 2013/0166820 A1 | 6/2013 | Batwara et al. |
| 2013/0166829 A1 | 6/2013 | Dumitru et al. |
| 2013/0166855 A1 | 6/2013 | Batwara et al. |
| 2013/0173997 A1 | 7/2013 | Suzumura et al. |
| 2013/0191705 A1 | 7/2013 | Watanabe et al. |
| 2014/0215175 A1 | 7/2014 | Kasorla et al. |
| 2014/0365707 A1 | 12/2014 | Talagala et al. |
| 2014/0372679 A1 | 12/2014 | Flynn et al. |
| 2015/0248922 A1 | 9/2015 | Hyun et al. |
| 2015/0268864 A1 | 9/2015 | Bernat et al. |
| 2016/0018991 A1 | 1/2016 | Flynn et al. |

FOREIGN PATENT DOCUMENTS

| | | |
|---|---|---|
| CN | 1632765 A | 6/2005 |
| CN | 1771495 A | 5/2006 |
| CN | 101266829 A | 9/2008 |
| EP | 0747822 A2 | 12/1996 |
| EP | 0747822 A3 | 4/1997 |
| EP | 1100001 A2 | 5/2001 |
| EP | 0747822 B1 | 10/2001 |
| EP | 1280047 A2 | 1/2003 |
| EP | 1418502 A2 | 5/2004 |
| EP | 1594064 A2 | 11/2005 |
| EP | 1607868 A1 | 12/2005 |
| EP | 1814039 A2 | 8/2007 |
| EP | 1871040 A1 | 12/2007 |
| EP | 1814039 A3 | 3/2009 |
| GB | 123416 | 9/2001 |
| GB | 2431750 A | 5/2007 |
| JP | H04242848 A | 8/1992 |
| JP | H08153014 A | 6/1996 |
| JP | H096706 A | 1/1997 |
| JP | H09198336 A | 7/1997 |
| JP | H10301719 A | 11/1998 |
| JP | H10320270 A | 12/1998 |
| JP | 2000259525 A | 9/2000 |
| JP | 2001296974 A | 10/2001 |
| JP | 2004086295 A | 3/2004 |
| JP | 4242848 B2 | 3/2009 |
| JP | 2009122850 A | 6/2009 |
| KR | 20000026300 A | 5/2000 |
| KR | 20010034476 A | 4/2001 |
| KR | 20050024278 A | 3/2005 |
| KR | 20060107728 A | 10/2006 |
| KR | 20100022811 A | 3/2010 |
| TW | 200825696 A | 6/2008 |
| WO | WO-9419746 A1 | 9/1994 |
| WO | WO-9518407 A1 | 7/1995 |
| WO | WO-9612225 A1 | 4/1996 |
| WO | WO-9828684 A1 | 7/1998 |

(56) References Cited

FOREIGN PATENT DOCUMENTS

| WO | WO-9828685 A1 | 7/1998 |
|---|---|---|
| WO | WO-9829684 A1 | 7/1998 |
| WO | WO-0131512 A2 | 5/2001 |
| WO | WO-020561 1 A1 | 1/2002 |
| WO | WO-0201365 A2 | 1/2002 |
| WO | WO-02067529 A2 | 8/2002 |
| WO | WO-2004077219 A2 | 9/2004 |
| WO | WO-2004099989 A2 | 11/2004 |
| WO | WO-2005010773 A1 | 2/2005 |
| WO | WO-2005103878 A2 | 11/2005 |
| WO | WO-2006050455 A2 | 5/2006 |
| WO | WO-2006062511 A1 | 6/2006 |
| WO | WO-2006065626 A1 | 6/2006 |
| WO | WO-2006113334 A2 | 10/2006 |
| WO | WO-2007132457 A2 | 11/2007 |
| WO | WO-2008070173 A1 | 6/2008 |
| WO | WO-2008070796 A2 | 6/2008 |
| WO | WO-2008070799 A2 | 6/2008 |
| WO | WO-2008073421 A2 | 6/2008 |
| WO | WO-2008130799 A1 | 10/2008 |
| WO | WO-2008070796 A3 | 12/2009 |
| WO | WO-2010036757 A1 | 4/2010 |
| WO | WO-2010053756 A2 | 5/2010 |
| WO | WO-2011106394 A2 | 9/2011 |
| WO | WO-2011106394 A3 | 11/2011 |
| WO | WO-2012050934 A2 | 4/2012 |
| WO | WO-2012082792 A2 | 6/2012 |

OTHER PUBLICATIONS 2380.2.13pct, Application No. PCT/US2007/025188, International Preliminary Reporton Patentability, dated Feb. 3, 2009.
2380.2.15, U.S. Appl. No. 11/952,123, Notice of Allowance, dated May 5, 2011.
2380.2.15pct, Application No. PCT/US2007/025049, International Preliminary Reporton Patentability, dated Mar. 11, 2009, 12 pages.
2380.2.19, Notice of Allowance, U.S. Appl. No. 12/098,435, dated Feb. 17, 2010.
2380.2.19, Notice of Allowance, U.S. Appl. No. 12/098,435, dated Jul. 8, 2010.
2380.2.192, Final Office Action, U.S. Appl. No. 13/456,119, dated Nov. 4, 2014.
2380.2.192, Notice of Allowance, U.S. Appl. No. 13/456,119, dated Feb. 20, 2015.
2380.2.192, Notice of Allowance, U.S. Appl. No. 13/456,119, dated Jun. 10, 2015.
2380.2.19EP Office Action, EP Application No. 09730535.3; dated Dec. 3, 2010.
2380.2.20 U.S. Appl. No. 12/098,427, Office Action received from USPTO, dated Aug. 5, 2011.
2380.2.21 Office Action, U.S. Appl. No. 12/098,431, dated Aug. 10, 2011.
2380.2.21US2, U.S. Appl. No. 13/442,638, Notice of Allowance, dated Nov. 13, 2012.
2380.2.21US2, U.S. Appl. No. 13/442,638, Office Action dated Jul. 2, 2012.
2380.2.26, U.S. Appl. No. 12/467,914, Office Action, dated Oct. 14, 2011.
2380.2.34pct2, PCT/US2010/048320, International Search Report and Written Opinion, dated Apr. 28, 2011.
2380.2.3EP, Application No. 07865334.2, Office Action, dated Nov. 23, 2012.
2380.2.3US2 Office Action, U.S. Appl. No. 13/174,449, dated Sep. 6, 2011.
2380.2.4EP Office Action, EP Application No. 07865335.9, dated Nov. 18, 2010.
2380.25, U.S. Appl. No. 11/952,106, Final Office Action, dated Aug. 30, 2012.
2380.25, U.S. Appl. No. 11/952,106, Notice of Allowance, dated Mar. 21, 2013.
2380.25, U.S. Appl. No. 11/952,106, Office Action, dated Dec. 20, 2011.
2380.2.5, U.S. Appl. No. 11/952,106, Office Action, dated Jan. 25, 2011.
2380.2.5, U.S. Appl. No. 11/952,106, Office Action, dated Sep. 7, 2011.
2380.2.58pct2, P201017pct2, Application No. PCT/US2012/023373, International Search Report and Written Opinion, dated Jul. 30, 2012, 8 pages.
2380.2.60, Notice of Allowance, U.S. Appl. No. 12/900,336, dated Jun. 16, 2011.
2380.2.60, Office Action, U.S. Appl. No. 12/900,336, dated Jan. 13, 2011.
2380.2.7 Office Action, U.S. Appl. No. 11/952,112, dated Mar. 5, 2010.
2380.2.7EP Office Action, EP Application No. 07865345.8, dated Nov. 17, 2010.
3430.2.123, U.S. Appl. No. 13/784,705, Office Action, dated May 22, 2015.
3430.2.2, Office Action, U.S. Appl. No. 11/952,095, dated Apr. 22, 2015.
3430.2.4US3, U.S. Appl. No. 13/296,834, Final Office Action, dated Jun. 18, 2015.
"Actel fusion FPGAs supporting Intelligent Peripheral Management Interface (IPMI) Applications," Application Note, Oct. 1, 2006, Actel Corporation, pp. 1-17.
Adaptec, "Understanding Read and Write Caching," http://ask.adaptec.com/app/answers/detail/a.sub.--id/2046/.about./und- erstanding-read-and-write-caching, 2 pgs. Published Mar. 12, 2001.
"Adaptive Replacement Cache", Wikipedia, last modified Apr. 2010, pp. 3, http://en.wikipedia.org/wiki/Adaptive.sub.--replacement-cache.
Ajanovic, Jasmin, "PCI Express* (PCIe*) 3.0 Accelerator Features", Intel Corporation, pp. 10, Mar. 7, 2013.
Application No. 10816110.0, Extended European Search Report, dated Jun. 3, 2013, 9 pages.
Application No. PCT/US2007/025048, International Preliminary Reporton Patentability, dated Jun. 18, 2009, 8 pages.
Application No. 10816043.3, Extended European Search Report, dated Jun. 21, 2013, 6 pages.
Application No. 07865334.2, Examination Report, dated Jan. 30, 2012.
Application No. 07865334.2, Office Action, dated Nov. 17, 2010.
Application No. 07865334.2, Summons, Aug. 17, 2012.
Application No. 07865345.8, Examination Report, dated Jan. 30, 2012.
Application No. 07867661.6, Office Action, dated Oct. 6, 2011.
Application No. 09731243.3, Examination Report, dated May 25, 2012.
Application No. 10816108.4, Office Action, dated Sep. 30, 2015.
Application No. 10816108.4, PCT/U.S. Pat. No. 2010048321, Search Report, dated Feb. 4, 2014.
Application No. 10816108.4, Search Report, dated Apr. 2, 2014.
Application No. 11848174.6, Examination Report, dated Jun. 30, 2015.
Application No. 11848174.6, Search Report, dated Apr. 2, 2014.
Application No. 12176826.1, Search Report, dated Dec. 10, 2012.
U.S. Appl. No. 12/877,971, Office Action, dated Apr. 18, 2013.
U.S. Appl. No. 13/088,211, 3430.257, Notice of Allowance, dated May 29, 2015.
Application No. EP11813216, Search Report, dated Nov. 20, 2013.
Application No. PCT/US2007/025048, 2380.2.16pct, International Search Report and Written Opinion, dated May 27, 2008, 12 pages.
Application No. PCT/US2007/025049, International Search Report and Written Opinion, dated May 14, 2008, 13 pages.
Application No. PCT/US2007/086683, 2380.2.1pct, International Preliminary Report on Patentability, dated Nov. 5, 2009, 10 pages.
Application No. PCT/US2007/086683, 2380.2.1pct, International Search Report and Written Opinion, dated Oct. 26, 2009, 14 pages.
Application No. PCT/US2007/086686, 2380.2.2pct, International Preliminary Report on Patentability, dated Dec. 16, 2008, 12 pages.
Application No. PCT/US2007/086686, 2380.2.2pct, International Search Report and Written Opinion, dated Apr. 28, 2008, 14 pages.

(56) References Cited

OTHER PUBLICATIONS

Application No. PCT/US2007/086687, 2380.2.3pct, International Preliminary Report on Patentability, dated Mar. 18, 2009, 15 pages.
Application No. PCT/US2007/086688, 2380.2.4pct, International Preliminary Report on Patentability, dated Mar. 16, 2009, 13 pages.
Application No. PCT/US2007/086688, 2380.2.4pct, International Search Report and Written Opinion, dated Apr. 28, 2008, 13 pages.
Application No. PCT/US2007/086691, 2380.2.6pct, International Search Report and Written Opinion, dated May 8, 2008, 13 pages.
Application No. PCT/US2007/086701, 2380.2.7pct, International Preliminary Report on Patentability, dated Mar. 16, 2009, 15 pages.
Application No. PCT/US2007/086701, 2380.2.7pct, International Search Report and Written Opinion, dated Jun. 5, 2008, 13 pages.
Application No. PCT/US2007/086702, International Preliminary Report on Patentability, dated Nov. 19, 2009, pp. 10.
Application No. PCT/US2007/086702, International Search Report and Written Opinion, dated Nov. 4, 2009.
Application No. PCT/US2007/086703, International Search Report and Written Opinion, dated Nov. 9, 2009.
Application No. PCT/US2009/039570, 2380.2.18pct, International Preliminary Report on Patentability, dated Oct. 21, 2010, 8 pages.
Application No. PCT/US2009/039570, 2380.2.18pct, International Search Report and Written Opinion, dated Aug. 7, 2009, 14 pages.
Application No. PCT/US2009/039572, 2380.2.20pct, International Preliminary Report on Patentability, dated Oct. 14, 2010, 14 pages.
Application No. PCT/US2009/039572, 2380.2.20pct, International Search Report and Written Opinion, dated Jul. 30, 2009, 18 pages.
Application No. PCT/US2009/039626, 2380.2.21pct, International Preliminary Report on Patentability, dated Oct. 21, 2010, 10 pages.
Application No. PCT/US2009/039626, 2380.2.21pct, International Search Report and Written Opinion, dated Aug. 27, 2009, 15 pages.
Application No. PCT/US2009/039673, 23802.17pct, International Preliminary Report on Patentability, dated Oct. 21, 2010, 10 pages.
Application No. PCT/US2009/039673, International Search Report and Written Opinion, dated Jul. 6, 2009.
Application No. PCT/US2010/048321, International Search Report and Written Opinion, dated Apr. 28, 2011, 10 pages.
Application No. PCT/US2010/048325, 2380.2.41pct, International Preliminary Report on Patentability, dated Mar. 13, 2012, 4 pages.
Application No. PCT/US2011/025885, 2380.2.43pct, International Preliminary Report on Patentability, dated Sep. 7, 2012, 8 pages.
Application No. PCT/US2011/045801, International Search Report and Written Opinion dated Apr. 6, 2012.
Application No. PCT/US2011/046005, International Search Report and Written Opinion, dated Apr. 6, 2012, 8 pages.
Application No. PCT/US2011/047659, 2380.2.51 PCT, International Preliminary Report on Patentability, dated Feb. 21, 2013, 5 pages.
Application No. PCT/US2011/047659, International Search Report and Written Opinion, dated Apr. 9, 2012, 8 pages.
Application No. PCT/US2011/053792, International Preliminary Report on Patentability, dated Apr. 2, 2013.
Application No. PCT/US2011/053792, International Search Report, dated May 4, 2012.
Application No. PCT/US2011/053792, Written Opinion, dated May 4, 2012.
Application No. PCT/US2011/053795, International Search Report and Written Opinion, dated May 4, 2012.
Application No. PCT/US2011/065927, International Preliminary Report on Patentability, dated Jun. 18, 2013, 4 pages.
Application No. PCT/US2012/021094, International Search Report, dated Sep. 24, 2012, 12 pages.
Application No. PCT/US2012/024927, 2380.2.62PCT, International Preliminary Report on Patentability and Written Opinion, dated Aug. 13, 2013.
Application No. PCT/US2012/024927, P201102PCT, International Search Report, dated Oct. 12, 2012.
Application No. PCT/US2012/024927, P201102PCT, Written Opinion, dated Oct. 12, 2012.

Application No. PCT/US2012/026790, 2380.2.59pct, P201018pct, International Preliminary Report on Patentability, dated Sep. 6, 2013, 8 pages.
Application No. PCT/US2012/026790, International Search Report and Written Opinion, dated Dec. 27, 2012, 11 pages.
Application No. PCT/US2014/048129, International Search Report and Written Opinion, dated Nov. 7, 2014.
Ari Gottwals, Henze, "Performance Boosting and Workload Isolation in Storage Area Networks with SanCache", Hewlett Packard Laboratories, Proceedings of the 23rd IEEE/14th NASA Goddard Conference on Mass Storage Systems and Technologies (MSST 2006) May 2006, pp. 263-227.
Arie Tal, NAND vs. NOR flash technology, Feb. 1, 2002, M-Systems, pp. 1-4, retrived fromhttp://www2.electronicproducts.com/NAND vs_NOR_flash_technology-article-FEBMSY1-feb2002-html.aspx on Nov. 10, 2010.
Arpaci-Dusseau, Andrea C., "Removing the Costs of Indirection in Flash-based SSDs with Nameless Writes", HotStorage, Jun. 2010, pp. 5.
Atsuo Kawaguchi, Shingo Nishioka, Hiroshi Motoda, A Flash-Memory Based File System, Advanced Research Laboratory, Hitachi, Ltd., Japan, 1995.
Bad Block Management in NAND Flash Memories, AN1819 Application Note, May 19, 2004, downloaded from www.datasheetarchive.com on Jul. 2, 2009.
Bandulet, Christian, "The Evolution of File Systems", Sun Microsystems, 2009, pp. 24, SNIA Education.
Barral et al., U.S. Appl. No. 60/625,495, "Dynamically Expandable and Contractible Fault-Tolerant Storage System Permitting Variously Sized Storage Devices and Method," filed Nov. 5, 2004.
Barral et al., U.S. Appl. No. 60/718,768, "Dynamically Adaptable Fault-Tolerant Storage System," filed Sep. 20, 2005.
Batwara, et al., Non-Final Office Action dated May 21, 2015 for U.S. Appl. No. 13/725,728.
Batwara, et al., Notice of Allowance dated Oct. 19, 2015 for U.S. Appl. No. 13/725,728.
Benjauthrit, B.; Coady, L.; Trcka, M.; , "An overview of error control codes for data storage," Nonvolatile Memory Technology Conference, 1996., Sixth Biennial IEEE International , vol., No., pp. 120-126, Jun. 24-26, 1996.
Bhaniramka et al., "OpenGI Multipipe SDK: A Toolkit for Scalable Parallel Rendering", 2005.
Bonnet, "Flash Device Support for Database Management," published Jan. 9, 2011.
Cardarilli, et al., "Design of fault-tolerant solid state mass memory", Defect and Fault Tolerance in VLSI Systems, 1999, DFT 1999, International Symposium, vol. No. pp. 302-310, Nov. 1999.
Casey, Michael, "SAN Cash: SSD in the SAN," Computer Technology Review's Storage Inc., Quarter 1, Mar. 2000, 4 pages.
Casey, "Solid State File-Caching for Performance and Scalability," Solid Data Quarter 1 2000, http://www/storagesearch.com/3dram.html, visited May 20, 2011.
Chao, Chia, et al. Mime: a high performance parallel storage device with strong recovery guarantees. Technical Report HPL-CSP-92-9, Hewlett-Packard Laboratories, 1992.
Coburn, Joel, "From ARIES to MARS: Reengineering Transaction Management for Next-Generation. Solid-State Drives" UCSD CSE Technical Report, downloaded Jul. 11, 2013, pp. 17, San Diego, California, US.
Coburn, Joel, "NV-Heaps: Making Persistent Objects Fast and Safe with Next-Generation, Non-Volatile Memories", University of California San Diego, 2011, pp. 13, ACM 978-1-4503-0266.Jan. 11, 2003, Newport Beach, California, US.
Condit, Jeremy, "Better I/O Through Byte-Addressable, Persistent Memory", Microsoft Research, UCLA, Oct. 11-14, 2009, pp. 14, ACM 978-1-60558-752—Mar. 9, 2010, Big Sky, Montana, US.
Damian Yerrick, Block Device, http://www.pineight.com/ds/block/, "visited" Mar. 1, 2010.
Dan, et al., "Implementing MLC NAND Flash for Cost-Effective, High-Capacity Memory," M-Systems: Flash Disk Pioneers—White Paper, 91-SR-014-02-8L, Rev 1.1, Sep. 2003, pp. 2-13.

(56) References Cited

OTHER PUBLICATIONS

"Data Management Software (DMS) for AMD Simultaneous Read/Write Flash Memory Devices", Spansion, Jul. 2003, pp. 10, Technology Background, Publication No. 22274, Revision A, Amendment 0.
"Datadirect Storage Systems Selected for NCSA Cluster", High Performance Computing, Aug. 15, 2003, vol. 12, No. 32, http://www.hpcwire.com/hpcwire/hpcwire/03/0815/105731.html, 13 pages.
David Morgenstern, "Is there a Flash Memory RAID in your Future?", Nov. 8, 2006, http://www.eweek.com-eWeek, Ziff Davis Enterprise Holdings Inc., 4 pages. [Retrieved Mar. 18, 2010].
David Woodhouse, Red Hat, Inc., JFFS: The Journaling Flash File System, Linux Symposium Jul. 2001 http://sourceware.org/jffs2/jffs2/pdf, "visited" Jun. 11, 2010.
Eric Van Hensbergen, "Dynamic Policy Disk Caching for Storage Networking," IBM Research Repor—RC24123 (W0611-189), Nov. 28, 2006, 13 pages.
Final Office Action for U.S. Appl. No. 13/539,235, filed Jun. 29, 2012, and mailed from the USPTO dated Nov. 9, 2015, 20 pgs.
Final Office Action, U.S. Appl. No. 11/952,109, filed Nov. 29, 2011.
Final Office Action, U.S. Appl. No. 14/866,461, dated Mar. 24, 2016.
"Finding the Perfect Memory", Agiga Tech, White Paper, Sep. 3, 2009, pp. 15, Poway, California, US.
Flynn, et al., Final Office Action dated May 31, 2016 for U.S. Appl. No. 13/837,628.
Flynn, et al., Final Office Action dated Nov. 26, 2014 for U.S. Appl. No. 14/087,297.
Flynn, et al., Final Office Action dated Nov. 28, 2016 for U.S. Appl. No. 13/193,559.
Flynn, et al., Non-Final Office Action dated Aug. 14, 2014 for U.S. Appl. No. 14/087,297.
Flynn, et al., Non-Final Office Action dated Jan. 12, 2017 for U.S. Appl. No. 13/837,628.
Flynn, et al., Non-Final Office Action dated Mar. 11, 2015 for U.S. Appl. No. 14/087,297.
Flynn, et al., Non-Final Office Action dated Mar. 18, 2016 for U.S. Appl. No. 13/193,559.
Flynn, et al., Non-Final Office Action dated Oct. 19, 2015 for U.S. Appl. No. 13/837,628.
Flynn, et al., Notice of Allowance dated Oct. 25, 2017 for U.S. Appl. No. 13/837,628.
Flynn, et al., Office Action dated Aug. 31, 2017 for U.S. Appl. No. 13/193,559.
Flynn, et al., Office Action dated Jul. 25, 2017 for U.S. Appl. No. 14/994,452.
Flynn,David et al., Final Office Action dated Sep. 16, 2016 for U.S. Appl. No. 14/309,751.
Flynn,David et al., Notice of Allowance dated Dec. 5, 2016 for U.S. Appl. No. 14/309,751.
Friedman, Mark, "File Cache Performance and Tuning," http://msdn.microsoft.com/en-us/library/bb742613.aspx, published Jan. 2002.
Gal, Eran, et al., "A Transactional Flash File System for Microcontrollers," School of Computer Science, Tel-Aviv University, USENIX Association, 2005 USENIX Annual Technical Conference, pp. 89-104.
Ganger, Gregory R., et al. "Soft updates: a solution to the metadata update problem in file systems." ACM Transactions on Computer Systems (TOCS)18.2 (2000): 127-153.
Garfinkel, One Big File Is Not Enough: A Critical Evaluation of the Dominant Free-Space Sanitization Technique, 2006, pp. 135-151.
Gill, Binny S., "STOW: Spatially and Temporally Optimized Write Caching Algorithm", IBM Almaden Research Center, 2009, pp. 21, http://www.usenix.org/event/usenix09/tech/slides/gill.pdf.
Gill, "WOW: Wise Ordering for Writes—Combining Spatial and Temporal Locality in Non-Volatile Caches", IBM, Fast '05: 4th USENIX Conference on File and Storage Technologies, 2005.
Guerra Jorge, "Software Persistent Memory", Florida International University, downloaded Jul. 11, 2013, pp. 13.

Gutmann P., "Secure Deletion of Data from Magnetic and Solid-State Memory," Proceedings of the Sixth USENIX Security Symposium, Jul. 1996, XP-002190890, San Jose, California, 15 pages.
Hauck et al., "Abstract: Runlength Compression Techniques for FPGA Configurations".
"High Speed, Elevated Board Stacking", Samtec, 2007, pp. 1.
Huffman, "Non-Volatile Memory Host Controller Interface," Apr. 14, 2008, 65 pgs.
Hutsell, Woody, "An In-depth Look at the RamSan-500 Cached Flash Solid State Disk", Texas Memory Systems, White Paper, Mar. 2008, pp. 16.
"Hynix 48-GB Flash MCP", Barracuda Networks, Sep. 6, 2007, http://hardware.slashdot.org/story/07/09/06/146218/hynix-48-gb-flash.mcp, 23 pages.
Hynix Semiconductor, Intel Corporation, Micron Technology, Inc. Phison Electronics Corp., Sony Corporation, Spansion, Stmicroelectronics, "Open NAND Flash Interface Specification," Revision 2.0, Feb. 27, 2008.
Hynix Semiconductor, Intel Corporation, Micron Technology, Inc. Phison Electronics Corp., Sony Corporation, Spansion, STMicroelectronics, "Open NAND Flash Interface Specification," Revision 2.1, Jan. 14, 2009.
"Intel Turbo Memory with User Pinning", Intel NAND Storage Solutions, 2008, pp. 4, www.intel.com/go/nand.
International Preliminary Report in Application No. PCT/US2010/048174 dated Mar. 22, 2012, 6 pages.
International Preliminary Report in Application No. PCT/US2010/048320, dated Mar. 22, 2012, 6 pages.
International Preliminary Report in Application No. PCT/US2010/048321, dated Mar. 22, 2012, 7 pages.
International Preliminary Report in Application No. PCT/US2011/045801 dated Feb. 14, 2013, 5 pages.
International Preliminary Report in Application No. PCT/US2012/022244 dated Aug. 1, 2013, 5 pages.
International Search Report and Written Opinion in Application No. PCT/US2010/048174 dated Apr. 29, 2011, 7 pages.
International Search Report and Written Opinion in Application No. PCT/US2011/036539 dated Jan. 2, 2012, 6 pages.
International Bureau, International Report on Patentability for PCT/US2011/036539, dated Nov. 22, 2012.
International Preliminary Report in Application No. PCT/US2007/086690 dated Mar. 11, 2009, 12 pages.
International Preliminary Report in Application No. PCT/US2007/086703 dated Nov. 19, 2009, 10 pages.
International Preliminary Report in Application No. PCT/US2007/086705 dated Dec. 10, 2009, 10 pages.
International Preliminary Report in Application No. PCT/US2011/045801 dated Feb. 7, 2013, 6 pages.
International Search Report and Written Opinion in Application No. PCT/US2007/086690 dated Aug. 7, 2008, 8 pages.
International Search Report and Written Opinion in Application No. PCT/US2007/086705 dated Nov. 16, 2009, 15 pages.
"Introducing Box Hill's Fibre Box", Fibre Channel News, Jan. 16, 1997, p. 5, http://hsi.web.cern.ch/HSI/fcs/news/jandec97.htm.
Jagmohan, "Write Amplification Reduction in NAND Flash through Multi-Write Coding", .COPYRGT.2010, IBM T.J. Watson Research Center.
James S. Plank, "A Tutorial on Reed-Solomon coding for Fault Tolerance in RAID-like Systems," Technical Report CS-96-332, Department of Computer Science, Univ. of Tennessee, Sep. 1997, 19 pages.
John Ayer et al., "Dynamic Bus Mode Reconfiguration of PCI-X and PCI Designs", Mar. 2007.
Johnson et al., "Single-Event Upset Simulation on an FPGA", 2002.
Johnson, Michael K., "An Introduction to Block Device Drivers", Jan. 1, 1995, pp. 6.
Josephson et al., "DFS: A file system for virtualized flash storage." ACM Trans. Storage 6, 3, Article 14 (Sep. 2010), 25 pages.
Kazmi, "Non-Transparent Bridging Makes PCI-Express HA Friendly," PLX Technology, EEtimes.com, Aug. 14, 2003.
Kennedy, "Exploiting Redundancy to Speedup Reconfiguration of an FPGA", 2003.

(56) References Cited

OTHER PUBLICATIONS

Kim, Jin-Ki, "Low Stress Program and Single Wordline Erase Schemes for NAND Flash Memory", MOSAID Technologies Incorporated, 2007, pp. 2, Ottawa, Ontario, Canada.
Kleiman, S. R., "Vnodes: An Architecture for Multiple File System Types in Sun UNIX", Sun Microsystems, Jan. 1, 1986, pp. 10.
Lattice Semiconductor Corporation, "Parallel Flash Programming and FPGA Configuration", Aug. 2007.
Leventhal, "Flash Storage Memory, Communications of the ACM", http://arstechnica.com/hardware/news/2009/09/intels-new-flash-tech-to-bri- ng-back-turbo-memory-for-real, ACM, vol. 51, No. 7, p. 47-51, Jul. 2008.
Li, Shu, "Improving Multi-Level NAND Flash Memory Storage Reliability Using Concatenated BCH-TCM Coding", IEEE Transactions on Very Large Scale Integration Systems, Oct. 2010, pp. 9, vol. 18, No. 10.
Lottiaux, Renaud, "OpenMosix, OpenSSI and Kerrighed: A Comparative Study", INRIA Institut National De Recherche en Informatique et en Automatique, Nov. 2004, pp. 23, No. 5399.
Macko P., et al., "Tracking Back References in a Write-Anywhere File System," Proceedings of the 8th USENIX Conference on File and Storage Technologies, 2010, 14 pages.
Makulowich J., "Strategies, Players and Emerging Markets," Washington Technology, Feb. 19, 1998, http://washingtontechnology.com/articles/1997/06/26/strategies-players-an-d-emerging-markets.aspx, 6 pages.
Malventano, Allyn, "DDRdrive Hits the Ground Running—PCI-E RAM-based SSD", PC Perspective, May 4, 2009, pp. 2, http://www.pcper.com/article.php?aid=704.
Matthias Nubling, OMF—an object request broker for the process control application domain, 1999, pp. 126-134, available at http://ieeexplore.ieee.org/xplore/login.jsp?urk/iel5/6433/17161/00792056-.pdf?arnumber=792056 (last visited on Mar. 11, 2010).
Megiddo, Nimrod, "ARC: A Self-Tuning, Low Overhead Replacement Cache", USENIX Association, Mar. 31-Apr. 2, 2003, pp. 17, Proceedings of FAST '03: 2nd USENIX Conference on File and Storage Technologies, San Francisco, California, US.
Mellor C, "New RAM Shunts Data into Flash in Power Cuts," The Channel, Oct. 19, 2011, http://www.channelregister.co.uk/2011/10/19/viing.sub.--hybrid.sub.--dram-.sub.--nand/, 6 pages.
Mesnier, Mike, "Object-based Storage", IEEE Communications Magazine, Aug. 2003, pp. 7, Storage Area Networking, 0163-6804/03.
Michael Burrows et al., On line Data Compression in a Log Structured File system, Apr. 15, 1992.
Michael Factor et al., Object Storage: The Future Building Block For Storage Systems, Global Data Interoperability—Challenges and Technologies, (Sardinia, Italy) Jun. 2005; also published as LGDI '05: Proceedings of the 2005IEEE International Symposium on Mass Storage Systems and Technology (Washington, DC, USA), pp. 119-123, 2005, IEEE Computer Society.
Micron Technology, Inc., "NAND Flash 101: An Introduction to NAND Flash and How to Design It in to Your Next Product (TN-29-19)," http://www.micron.com/.about./media/Documents/Products/Technical%20Note/N-AND%20Flash/145tn2919.sub.--nand .sub.--101.pdf, 2006, visited May 10, 2010.
Micron Technology, Inc., "Technical Note: Design and Use Considerations for NAND Flash Memory (TN-29-17)," http://download.micron.com/pdf/technotes/nand/tn2917.pdf, 2006, visited May 10, 2010.
Micron Technology, Inc., "Technical Note: Hamming Codes for NAND Flash Memory Devices (TN-29-08)," 2005, http://www.micron.com/.about./media/Documents/Products/Technical%20Note/N-AND%20Flash/tn2908.sub.--NAND.sub.-hamming.sub.--ECC.sub.--code.pdf, visited May 10, 2010.
Micron, "TN-29-42: Wear-Leveling Techniques in NAND Flash Devices," Mar. 10, 2010.
More X-Files, http://savolainen.wordpress.com/2008/12/, Dec. 7, 2008, visited Aug. 16, 2012.

"NAND Flash Memories and Programming NAND Flash Memories Using ELNEC Device Programmers", ELNEC, Aug. 2008, pp. 44, Application Note, an.sub.--elnec.sub.--nand.sub.--flash, version 2.10.
Non-Final Office Action for U.S. Appl. No. 14/045,605, filed Oct. 3, 2013, and mailed from the USPTO dated Sep. 24, 2015, 29 pgs.
Notice of Allowance Received from USPTO, U.S. Appl. No. 12/981,394, dated Oct. 12, 2011.
Notice of Allowance, U.S. Appl. No. 13/830,652, dated Apr. 14, 2015.
NUMONYX NAND Flash Translation Layer (NFTL), http://d1.amobbs.com/bbs.sub.--upload782111/files.sub.--46/purdev.sub.--6-84405XFKZAB.pdf, 2011 visited Jun. 12, 2015.
Office Action, U.S. Appl. No. 11/952,116, dated Jun. 24, 2010.
Office Action in EP Application No. 07869018.7 dated Nov. 17, 2010, 2 pages.
Office Action in European Patent Application No. 07869020.3 dated Oct. 21, 2010, 8 pages.
Office Action Received from USPTO, U.S. Appl. No. 11/952,091, dated Feb. 7, 2012.
Office Action, U.S. Appl. No. 12/098,433, dated Mar. 29, 2011.
Office Action, U.S. Appl. No. 12/098,433, dated Nov. 10, 2010.
Office Action, U.S. Appl. No. 14/866,461, dated Jul. 26, 2016.
Office Action, U.S. Appl. No. 14/866,461, dated Nov. 4, 2015.
P201014PCT (2380.2.57pct), Application No. PCT/US2012/022244, International Search Report and Written Opinion, dated Jul. 30, 2012, 12 pages.
P201021PCT, Application No. PCT/US2011/064728, International Search Report and Written Opinion, dated Jul. 31, 2012.
PCT/US2007/025050, 2380.2.14pct, International Preliminary Report on Patentability, dated Aug. 20, 2009.
PCT/US2007/025050, 2380.2.14pct, International Search Report and Written Opinion, dated Jul. 30, 2009.
PCT/US2007/025054, International Preliminary Report on Patentability, dated Jun. 18, 2009.
PCT/US2007/025054, International Search Report and Written Opinion, dated Oct. 29, 2008.
PCT/US2007/025188, International Search Report and Written Opinion, dated May 30, 2008.
PCT/US2007/086704, International Preliminary Report on Patentability, dated Jun. 18, 2009.
PCT/US2007/086704, International Search Report and Written Opinion, dated Sep. 29, 2008.
Pei Cao, et al., "The TicklerTAIP parallel RAID architecture," The Annual International Symposium on Computer Architecture, May 1993, pp. 52-63.
Peterson, et al., Final Office Action dated May 4, 2017 for U.S. Appl. No. 13/539,235.
Peterson, et al., Non-Final Office Action dated Jul. 14, 2016 for U.S. Appl. No. 13/539,235.
Porter, Donald E., et al., "Operating System Transactions," Department of Computer Sciences, The University of Texas at Austin, SOSP '09, Oct. 11-14, 2009, Big Sky, Montana, ACM 978-1-60558-752-3/09/10, Oct. 2009.
Prado et al., "A Standard Product Approach to Spaceborne Payload Processing", 2001.
Probert, David B., "Windows Kernel Internals Cache Manager", Microsoft Corporation, May 13, 2010, pp. 48.
Probert, David B., "Windows Kernel Internals", Microsoft Corporation, May 13, 2010, pp. 48.
Probert, "Windows Kernel Internals Cache Manager," Microsoft Corporation, http://www.i.u-tokyo.co.jp/edu/training/ss/lecture/new-documents/Lecture- s/15-CacheManager/CacheManager.pdf, printed May 15, 2010.
Ralph O. Weber, SCSI Object-Based Storage Device Commands (ODS), ANSI, Jul. 30, 2004, pp. 0-74, Part 1 of 3.
Ralph O. Weber, SCSI Object-Based Storage Device Commands (OSD), ANSI, Jul. 30, 2004, pp. 165-171, Part 3 of 3.
Ralph O. Weber, SCSI Object-Based Storage Device Commands (OSD), ANSI, Jul. 30, 2004, pp. 75-164, Part 2 of 3.
Ranaweera, 05-270RO, SAT: Write Same (10) command (41h), T10/05, Jul. 7, 2005, www.t10.org/ftp/t10/document.05/05-270r0.pdf, last visited Apr. 11, 2013.

(56) References Cited

OTHER PUBLICATIONS

Randal, Paul S., "Understanding Logging and Recovery in SQL Server," Published Feb. 2009; URL https://technet.microsoft.com/en-us/magazine/2009.02.logging.aspx; accessed Sep. 11, 2015.
Renato R., "A Tutorial of the RDMA Model," HPC wire, The Leading Source for Global News and Information Covering the Ecosystem of High Productivity Computing, Sep. 15, 2006, http://archive.hpcwire.com/hpc/885757.html, 16 pages.
Rose, Mike, "FPGA PCIe Bandwidth", University of California San Diego, Jun. 9, 2010, pp. 7, Department of Computer Science and Engineering.
Rosenblum, et al., The Design and Implementation of a Log-Structured File System, ACM Transactions on computer Systems (TOCS) 10.1 (1992): 26-52.
Russinovich, Mark E., "Windows Internals, Fifth Edition," Chapters 11-12: "Common Log File System," "NTFS Design Goals and Features," Published Jun. 17, 2009, 183 pages.
Salcic, "PROTOS—A microcontroller/FPGA-based prototyping system for embedded applications", 1997.
SanDisk, SanDisk Extreme FFS Significantly Improves SSD performance, http://www.gadgetadvisor.com/computer-hardware/sandisk-extremeffs-sig . . . , last visited Dec. 18, 2009.
SanDisk, "SanDisk Extreme FFS speeds SSDs," http://www.semiaccurate.com/2009/06/08/sandisk-extreme-ffs-speeds-ssds/, last visited Dec. 18, 2009.
Sandisk, "SanDisk Introduces Extreme FFS, Aims 100 Times Faster SSDs", http://www.physorg.com/news145186489.html, last visited Dec. 18, 2009.
Savov V., "Viking Modular's SATADIMM Jacks an SSD into Your Memory Slot," Aug. 27, 2010, 11 pages.
Sears, Russell C., "Stasis: Flexible Transactional Storage", University of California at Berkeley, Jan. 8, 2010, pp. 176, Technical Report No. UCB/EECS-2010-2, http://www.eecs.berkeley.edu/Pubs/TechRpts/2010/EECS-2010-2.html.
Sears, Russell, et al., "Stasis: Flexible Transactional Storage," University of California, Berkeley, USENIX Association, OSDI '06: 7.sup.th USENIX Symposium on Operating Systems Design and Implementation, pp. 29-44, Nov. 6, 2006.
Seltzer, Margo, et al., "Transaction Support in Read Optimized and Write Optimized File Systems," Department of Electrical Engineering and Computer Science, University of California Berkeley, California 94720, Proceedings of the 16.sup.th VLDB Conference, Brisbane, Australia, 1990.
Seltzer, Margo Ilene, "File System Performance and Transaction Support," A.B. (Harvard/Radcliffe College) 1983, A dissertation submitted in partial satisfaction of the requirements of the degree of Doctor of Philosophy in Computer Science in the Graduate Division of the University of California at Berkeley, 1992.
Seltzer, Margo Ilene, "Transaction Support in a Log-Structured File System", Harvard University, pp. 8, Mar. 7, 2013.
Seltzer, "Transaction Support in a Log-Structured File System", Harvard University Division of Applied Sciences, published Jan. 1, 1993 (Chapter 5, pp. 52-69).
Shimpi A.L., "The SSD Anthology Understanding SSDs and New Drives," Revised Mar. 18, 2009, 5 pages.
Shrout R., "Gigabyte iRAM Solid State SATA Storage Review," PC Perspective, Apr. 5, 2006, http://www.pcper.com/article.php?aid=224&type=expert, 8 pages.
Shu, "Data Set Management Commands Proposal for ATA8-ACS2", Oct. 5, 2007, Revision 3.
Small et al., "PCI Bus Master in a Quicklogic 8000 Gate FPGA".
Spillane, Richard P., "Enabling Transactional File Access via Lightweight Kernel Extensions", USENIX Association, published Feb. 25, 2009, pp. 14, 7th USENIX Conference on File and Storage Technologies.
Staf, "Adaptation of OSEck for an FPGA-Based Soft Processor Platform", Aug. 2007.
Stodolsky, D., "Parity Logging Overcoming the Small Write Problem in Redundant Disk Arrays", Proceedings of the Annual International Symposium on Computer Architecture, May 16-19, 1993, pp. 12, XP010095790 ISBN: 978-0-8186-3810-7, San Diego, California, US.
Stokes, Jon, "Intel's New Flash Tech to Bring Back Turbo Memory, for Real", http://arstechnica.com/hardware/news/2009/09/intels-new-flash-tech- -to-bring-back-turbo-memory-for-real.ars, retrieved Apr. 23, 2012.
Suh, Kang-Deog, "A 3.3 V 32 Mb NAND Flash Memory with Incremental Step Pulse Programming Scheme", IEEE Journal of Solid-State Circuits, Nov. 30, 1995, pp. 8, vol. 30, No. 11, New York, US.
Sunita Jain et al., "Point-to-Point Connectivity Using Integrated Endpoint Block for PCI Express Design", Oct. 4, 2007.
"T10/05-270r0 SAT—Write Same (10) command (41h)", Network Appliance, Jul. 7, 2005, pp. 2.
"(Take 2): Transcendent Memory ("tmem") for Linux", LWN Merchandise, 2009, pp. 3, http://lwn.net/Articles/340409/.
Tal, et al., NAND vx. NOR Flash Technology, M-Systems, www2.electronicproducts.com/PrintArticle.aspx?ArticleURL-FEBMSY1.feb2002.- html, visited Nov. 22, 2010.
Tal, "NAND vs. NOR Flash Technology", M-Systems, published Feb. 1, 2002 (http://www2.electronicproducts.com/NAND.sub.--vs.sub.--NOR.sub.--flash.s- ub.--technology-article-FEBMSY1-feb2002-html.aspx) accessed May 29, 2012.
Terry et al., U.S. Appl. No. 60/797,127, "Filesystem-aware Block Storage System, Apparatus, and Method," filed May 3, 2006.
United States Patent Office, Office Action, U.S. Appl. No. 11/952,113, dated Mar. 6, 2012 2380.2.7).
United States Patent and Trademark Office, Notice of Allowance, U.S. Appl. No. 12/878,981, dated Jun. 25, 2012.
United States Patent Office, Final Office Action, U.S. Appl. No. 13/193,559, dated Dec. 16, 2014, 32 pages.
United States Patent Office, Non-Final Office Action, U.S. Appl. No. 13/107,820, dated Feb. 22, 2013.
United States Patent Office, Non-Final Office Action, U.S. Appl. No. 13/335,922, dated Aug. 29, 2013, 8 pages.
United States Patent Office, Non-Final Office Action, U.S. Appl. No. 13/539,235, dated Feb. 13, 2015, 16 pages.
United States Patent Office, Notice of Allowance, U.S. Appl. No. 13/694,000, dated Feb. 4, 2015, 22 pages.
United States Patent Office, Notice of Allowance, U.S. Appl. No. 14/866,461, dated Nov. 8, 2016, 6 pages.
United States Patent Office, Office Action, U.S. Appl. No. 14/042,189, dated Jun. 4, 2015, 31 pages.
United States Patent Office, Pre-Interview Communication, U.S. Appl. No. 13/193,559, dated Jul. 8, 2014.
United States Patent Office, U.S. Appl. No. 13/480,791, Office Action, dated Aug. 3, 2012.
U.S. Appl. No. 11/952,091, 2380.2.1, Notice of Allowance, dated Jun. 28, 2012.
U.S. Appl. No. 11/952,095, 2380.2.2, Office Action, dated Feb. 14, 2012.
U.S. Appl. No. 11/952,095, 2380.2.2, Office Action, dated Jun. 8, 2011.
U.S. Appl. No. 11/952,095, 2380.2.2, Office Action, dated Sep. 4, 2013.
U.S. Appl. No. 11/952,095, Office Action, dated Oct. 29, 2010.
U.S. Appl. No. 11/952,095, Final Office Action, dated Sep. 18, 2012.
U.S. Appl. No. 11/952,098, Office Action, dated Jan. 13, 2012.
U.S. Appl. No. 11/952,098, Office Action, dated Jan. 7, 2011.
U.S. Appl. No. 11/952,098, Office Action, dated Oct. 8, 2013.
U.S. Appl. No. 11/952,101, 2380.2.4, Office Action, dated Dec. 22, 2011.
U.S. Appl. No. 11/952,101, 2380.2.4, Office Action, dated Jan. 6, 2011.
U.S. Appl. No. 11/952,109, Office Action, dated Jul. 1, 2011.
U.S. Appl. No. 11/952,109, Office Action, dated Mar. 17, 2011.
U.S. Appl. No. 11/952,115, Notice of Allowance, dated Apr. 26, 2011.
U.S. Appl. No. 11/952,115, Office Action, dated Mar. 10, 2010.
U.S. Appl. No. 11/952,120, Notice of Allowance, dated Dec. 20, 2010.
U.S. Appl. No. 11/952,120, Office Action, dated Apr. 20, 2010.

(56) References Cited

OTHER PUBLICATIONS

U.S. Appl. No. 11/952,120, Office Action, dated Aug. 13, 2010.
U.S. Appl. No. 11/952,121 Non-Final Office Action dated Dec. 19, 2016.
U.S. Appl. No. 11/952,123, Final Office Action, dated Oct. 5, 2010.
U.S. Appl. No. 11/952,123, Notice of Allowance, dated Apr. 8, 2011.
U.S. Appl. No. 11/952,123, Notice of Allowance, dated Jan. 19, 2011.
U.S. Appl. No. 11/952,123, Office Action, dated May 5, 2010.
U.S. Appl. No. 12/098,427, 2380.2.20, Office Action, dated Jun. 19, 2012.
U.S. Appl. No. 12/098,427, Notice of Allowance, dated Sep. 27, 2012.
U.S. Appl. No. 12/098,431, Notice of Allowance, dated Dec. 16, 2011.
U.S. Appl. No. 12/098,431, Office Action, dated Aug. 12, 2011.
U.S. Appl. No. 12/098,433, Notice of Allowance, dated Nov. 23, 2011.
U.S. Appl. No. 12/098,434, 2380.2.18, Office Action, dated Oct. 29, 2010.
U.S. Appl. No. 12/273,532, 2380.2.4CIP1, Notice of Allowance, dated Apr. 6, 2011.
U.S. Appl. No. 12/273,532, 2380.2.4CIP1, Notice of Allowance, dated Jul. 29, 2011.
U.S. Appl. No. 12/790,920, Office Action, dated Sep. 4, 2012.
U.S. Appl. No. 12/877,971, Notice of Allowance, dated Jan. 17, 2014.
U.S. Appl. No. 12/877,971, Notice of Allowance, dated Sep. 20, 2013.
U.S. Appl. No. 12/877,971, Office Action, dated Sep. 27, 2012.
U.S. Appl. No. 12/878,981, Notice of Allowance, dated Aug. 28, 2012.
U.S. Appl. No. 12/878,987, Notice of Allowance, dated Mar. 21, 2013.
U.S. Appl. No. 12/878,987, Office Action, dated Oct. 18, 2012.
U.S. Appl. No. 12/879,004, Notice of Allowance, dated Aug. 13, 2013.
U.S. Appl. No. 12/879,004, Office Action, dated Sep. 28, 2012.
U.S. Appl. No. 12/885,285, Notice of Allowance, dated Feb. 4, 2013.
U.S. Appl. No. 12/885,285, Notice of Allowance, dated Oct. 17, 2012.
U.S. Appl. No. 12/981,394, Notice of Allowance, dated Feb. 6, 2012.
U.S. Appl. No. 12/986,117, Office Action, dated Nov. 1, 2013.
U.S. Appl. No. 13/015,458, Notice of Allowance, dated Sep. 19, 2012.
U.S. Appl. No. 13/015,458, Office Action, dated Sep. 7, 2012.
U.S. Appl. No. 13/075,000, Notice of Allowance, dated Sep. 27, 2012.
U.S. Appl. No. 13/075,000, Office Action, dated Apr. 23, 2012.
U.S. Appl. No. 13/075,000, Office Action, dated Nov. 16, 2011.
U.S. Appl. No. 13/075,000, Office Action, dated Sep. 1, 2011.
U.S. Appl. No. 13/088,211, 3430.257, Final Office Action, dated Dec. 29, 2014.
U.S. Appl. No. 13/088,211, 3430.257, Notice of Allowance, dated Apr. 15, 2015.
U.S. Appl. No. 13/107,820, Notice of Allowance, dated Jul. 31, 2013.
U.S. Appl. No. 13/174,449, Office Action, dated Sep. 11, 2012.
U.S. Appl. No. 13/182,315, Notice of Allowance, dated Dec. 17, 2012.
U.S. Appl. No. 13/189,402, Notice of Allowance, dated Nov. 15, 2012.
U.S. Appl. No. 13/204,551, Notice of Allowance, dated Jul. 12, 2012.
U.S. Appl. No. 13/204,551, Office Action, dated Jan. 13, 2012.
U.S. Appl. No. 13/209,007, Notice of Allowance, dated Apr. 4, 2013.
U.S. Appl. No. 13/248,006, Notice of Allowance, dated Nov. 8, 2013.
U.S. Appl. No. 13/248,006, Office Action, dated Aug. 30, 2013.
U.S. Appl. No. 13/324,942, Notice of Allowance, dated May 2, 2013.
U.S. Appl. No. 13/372,430, 2380.2.62, Notice of Allowance, dated Nov. 3, 2014.
U.S. Appl. No. 13/372,430, Advisory Action, dated Aug. 6, 2014.
U.S. Appl. No. 13/372,430, Final Office Action, dated Apr. 21, 2014.
U.S. Appl. No. 13/372,430, Office Action, dated Nov. 7, 2013.
U.S. Appl. No. 13/406,287, Office Action, dated Jun. 2, 2014.
U.S. Appl. No. 13/406,287, Pre-Office Action, dated Dec. 16, 2013.
U.S. Appl. No. 13/600,077, Notice of Allowance, dated Apr. 30, 2013.
U.S. Appl. No. 13/600,077, Office Action, dated Jan. 7, 2013.
U.S. Appl. No. 13/607,486, Notice of Allowance, dated Jul. 11, 2013.
U.S. Appl. No. 13/607,486, Office Action, dated Jan. 10, 2013.
U.S. Appl. No. 13/652,427, Office Action, dated Nov. 20, 2014.
U.S. Appl. No. 13/730,602, 3430.2.127, Office Action, dated Jan. 15, 2015.
U.S. Appl. No. 13/776,389, Final Office Action, dated Jun. 20, 2014.
U.S. Appl. No. 13/776,389, Office Action, dated Dec. 16, 2013.
U.S. Appl. No. 13/776,406, Notice of Allowance, dated May 13, 2014.
U.S. Appl. No. 13/776,406, Office Action, dated Nov. 6, 2013.
U.S. Appl. No. 13/800,628, 2380.2.147, Office Action, dated Dec. 5, 2014.
U.S. Appl. No. 13/830,652, Final Office Action, dated Jan. 7, 2015.
U.S. Appl. No. 13/830,652, Office Action, dated Aug. 12, 2014.
U.S. Appl. No. 13/834,955, Final Office Action, dated Sep. 8, 2014.
U.S. Appl. No. 13/834,955, Office Action, dated Apr. 4, 2014.
U.S. Appl. No. 13/836,826, Notice of Allowance, dated Jul. 30, 2015.
U.S. Appl. No. 13/836,826, Office Action, dated Feb. 24, 2015.
U.S. Appl. No. 13/838,070, Notice of Allowance, dated Aug. 26, 2015.
U.S. Appl. No. 13/931,897, Notice of Allowance, dated Dec. 23, 2013.
U.S. Appl. No. 13/931,897, Office Action, dated Sep. 6, 2013.
U.S. Appl. No. 14/011,395, Final Office Action, dated Jun. 26, 2014.
U.S. Appl. No. 14/011,395, Final Office Action, dated May 18, 2015.
U.S. Appl. No. 14/011,395, Notice of Allowance, dated Aug. 19, 2015.
U.S. Appl. No. 14/011,395, Office Action, dated Jan. 16, 2014.
U.S. Appl. No. 14/011,395, Office Action, dated Oct. 31, 2014.
U.S. Appl. No. 60/718,768, Provisional, filed Aug. 20, 2005.
USPTO, Notice of Allowance for U.S. Appl. No. 12/986,117 dated Jun. 5, 2013.
USPTO, Notice of Allowance, U.S. Appl. No. 11/952,109, dated Aug. 31, 2012.
USPTO, Office Action for U.S. Appl. No. 11/952,113, dated Dec. 15, 2010.
USPTO, Office Action for U.S. Appl. No. 12/711,113, dated Jun. 6, 2012—P200905US1.
USPTO, Office Action for U.S. Appl. No. 12/711,113, dated Nov. 23, 2012—P200905US1.
USPTO, Office Action for U.S. Appl. No. 12/879,004 dated Feb. 25, 2013.
USPTO, Office Action for U.S. Appl. No. 12/986,117, dated Apr. 4, 2013.
USPTO, Office Action for U.S. Appl. No. 13/118,237 dated Apr. 22, 2013.
USPTO, Office Action for U.S. Appl. No. 13/607,486 dated May 2, 2013.
USPTO, Office Action, U.S. Appl. No. 11/952,109, dated May 1, 2012.
Volos, Haris, et al., "Mnemosyne: Lightweight Persistent Memory," Computer Sciences Department, University of Wisconsin—Madison, Skype Limited, ASPLOS '11, Mar. 5-11, 2011, Newport Beach, California, ACM 978-1-4503-0266-1/11/03, Mar. 5, 2011.

(56) References Cited

OTHER PUBLICATIONS

Wang, Feng, "OBFS: A File System for Object-based Storage Devices", 21st IEEE/12th NASA Goddard Conference on Mass Storage Systems and Technologies (MSST2004), Apr. 2004, pp. 18, College Park, Maryland, US.
Weissel, Andreas, "Revisiting Log-Structured File Systems for Low-Power Portable Storage," Published Mar. 2005; Accessed at URL: https://www4.cs.fau.de/weissei/Publications/Papers/IWSSPS05.pdf.
Whyte, Barry, "IBM San Volune Controller 4.2.1 Cache Partitioning", Redpaper IBM Corporation, Apr. 30, 2008, pp. 12, REDP-4426-00, Poughkeepsie, New York, US.
Wikipedia, "Adaptive Replacement Cache", last modified Jun. 25, 2012, http://en.wikipedia.org/wiki/Adaptive.sub.--l replacement.sub.--cache.
Wikipedia, "Journaling File System". Published on Jul. 4, 2009. URL: https://en.wikipedia.org/wiki/Journaling.sub.--file.sub.--system.
Wikipedia, Lustre (file system), http://en.wikipedia.org/wiki/Lustre.sub.--(file system), last visited Apr. 29, 2010.
Wikipedia. "Transaction log". Published on Jul. 4, 2009. URL: https://en.wikipedia.org/wiki/Transaction.sub.--log.
WIPO, International Preliminary Report on Patentability for PCT/US2008/059048, dated Oct. 20, 2009.
WIPO, International Preliminary Report on Patentability for PCT/US2009/039618, dated Oct. 12, 2010.
WIPO, International Search Report and Written Opinion for PCT/US2007/086687, dated Sep. 5, 2008, 21 pages.
WIPO, International Search Report and Written Opinion for PCT/US2008/059048, dated Aug. 25, 2008.
WIPO, International Search Report and Written Opinion for PCT/US2009/039618, dated Jul. 3, 2009.
WIPO, International Search Report and Written Opinion for PCT/US2010/048325, dated Jun. 1, 2011, 6 pages.
WIPO, International Search Report and Written Opinion for PCT/US2011/025885, dated Sep. 28, 2011 (P200905PCT), 9 pages.
WIPO, International Search Report and Written Opinion for PCT/US2011/65927, dated Aug. 28, 2012.
WIPO, International Search Report and Written Opinion for PCT/US2012/029722, dated Oct. 30, 2012.
WIPO, Preliminary Report on Patentability for PCT/US2007/086691, dated Feb. 16, 2009, 15 pages.
Wright, Charles P "Amino: Extending ACID Semantics to the File System", p. 1, Mar. 7, 2013.
Wright, Charles P. et al., Extending ACID Semantics to the File System, IBM T.J. Watson Research Center, Stony Brook University, ACM Transactions on Storage, vol. 3, No. 2, May 2007, pp. 1-40.
Wu, Michael, et al., "eNVy: A Non-Volatile, Main Memory Storage System," Department of Electrical and Computer Engineering, Department of Computer Science, Rice University, ASPLOS VI-10/94 San Jose, California, 1994, ACM 0-89791-660-3/94/0010, pp. 86-97, 1994.
Yehuda, et al.,Atomicity of Restful Radosgw Operations, The Ceph Blog, Nov. 7, 2011, (Nov. 7, 2011), XP055148638, Retrieved from the Internet: URL:http://ceph.com/dev-notes/atomicity-of-restful-radosgw-operations/, [retrieved on Feb. 23, 2016], 3 pgs.
Zhang, Yiying, "De-indirection for Flash-based SSDs with Nameless Writes", University of Wisconsin—Madison, 2012, pp. 16, www.usenix.org/event/fast12/tech/full.sub.--papers/Zhang.
Amended Scheduling Order, *Unification Techs. LLC* v. *Micron Tech. Inc.*, No. 6:20-cv-500 (W.D. Tex. 2020), ECF No. 48. (Nov. 24, 2020).
American National Standard for Information Technology—AT Attachment with Packet Interface—6 (ATA/ATAPI-6), ANSI INCITS 361-2002 (Sep. 2002) (excerpts filed with permission).
American National Standard for Information Technology—AT Attachment with Packet Interface—7 vol. 1—Register Delivered Command Set, Logical Register Set (ATA/ATAPI-7 V1), ANSI INCITS 397-2005 (Feb. 7, 2005) (excerpts filed with permission).
American National Standard for Information Technology—ATA/ATAPI Command Set—2 (ACS-2), ANSI INCITS 482-2012 (May 30, 2012) (excerpts filed with permission).
Apr. 2007 Plenary Minutes 2, e07156r0 (T13 and INCITS, Apr. 24, 2007).
Brian Dipert & Markus Levy, Designing With Flash Memory (Annabooks 1994).
Claim Construction Order, *Unification Techs. LLC* v. *Micron Tech. Inc.*, No. 6:20-cv-500 (W.D. Tex. 2020), ECF No. 67. Mar. 12, 2021.
Computer generated redline comparison of changes from the Shu Provisional to the Shu Patent, Jun. 4, 2021.
Curriculum vitae of Jacob Baker, Ph.D., P.E. (Jun. 2021).
Curriculum vitae of Sylvia Hall-Ellis, Ph.D. Nov. 2020.
Declaration of Frank Shu Regarding Publication of Proposals (Ex. 1018 and 1019) dated Jun. 2, 2021.
Declaration of R. Jacob Baker, Ph.D., P.E., Regarding U.S. Pat. No. 9,632,727. (Dec. 22, 2020).
Docket Report for *Unification Techs. LLC* v. *Micron Tech. Inc.*, No. 6:20-cv-500 (W.D. Tex. 2020) (accessed Dec. 22, 2020).
Eran Gal et al., Mapping Structures for Flash Memories: Techniques and Open Problems, Proceedings of the IEEE International Conference on Software—Science, Technology & Engineering ("SwSTE'05") (digital version), Herzlia, Israel, 2005, pp. 83-92, doi: 10.1109/SWSTE.2005.14.
Excerpt of Plaintiff's Responses to Defendant's First Set of Interrogatories (No. 16) (Apr. 26, 2021), *Unification Techs. LLC* v. *Micron Tech. Inc.*, No. 6:20-cv-500 (W.D. Tex. 2020). Apr. 26, 2021.
Exhibit A to Plaintiff's First Amended Infringement Contentions: Unification Technologies' Allegations of Infringement with Respect to U.S. Pat. No. 8,762,658, *Unification Techs. LLC* v. *Micron Tech. Inc.*, No. 6:20-cv-500 (W.D. Tex. 2020).
Exhibit B to Plaintiff's First Amended Infringement Contentions: Unification Technologies' Allegations of Infringement with Respect to U.S. Pat. No. 8,533,406, *Unification Techs. LLC* v. *Micron Tech. Inc.*, No. 6:20-cv-500 (W.D. Tex. 2020).
Exhibit C to Plaintiff's First Amended Infringement Contentions: Unification Technologies' Allegations of Infringement with Respect to U.S. Pat. No. 9,632,727, *Unification Techs. LLC* v. *Micron Tech. Inc.*, No. 6:20-cv-500 (W.D. Tex. 2020).
Expert Declaration of Jacob Baker, Ph.D., P.E., Regarding U.S. Pat. No. 8,533,406 (Dec. 22, 2020).
Expert Declaration of Jacob Baker, Ph.D., P.E., Regarding U.S. Pat. No. 8,762,658 (Jun. 4, 2021).
Expert Declaration of Jacob Baker, Ph.D., P.E., Regarding U.S. Pat. No. 9,632,727 (Jun. 4, 2021).
Expert Report of Sylvia D. Hall-Ellis, Ph.D., Regarding Public Availability of the IBM Journal Publication (Ex. 1027), dated May 26, 2021.
Expert Report of Sylvia Hall-Ellis, Ph.D. in Support of Public Availability of the Gal Publication. (Dec. 17, 2020).
Filed Stipulations of Petitioners for U.S. Pat. No. 8,533,406. Dec. 22, 2020.
Filed Stipulations of Petitioners for U.S. Pat. No. 8,762,658. (Dec. 22, 2020).
Filed Stipulations of Petitioners for U.S. Pat. No. 9,632,727. (Dec. 22, 2020).
Frank Shu & Nathan Obr, Data Set Management Commands Proposal for ATA8-ACS2 Revision 1, T13 (Jul. 26, 2007).
Frank Shu & Nathan Obr, Notification of Deleted Data Proposal for ATA8-ACS2 Revision 0, T13 (Apr. 21, 2007, 2007).
Frank Shu & Nathan Obr, Notification of Deleted Data Proposal for ATA8-ACS2 Revision 1, T13 (Jul. 26, 2007).
Frank Shu & Nathan Obr, Notification of Deleted Data Proposal for ATA8-ACS2 Revision 2, T13 (Sep. 5, 2007).
Frank Shu, Notification of Deleted Data Proposal for ATA8-ACS2, T13 (rev. 0 Apr. 21, 2007).
Frank Shu, Solid-State Drives: Next-Generation Storage, Microsoft WinHEC 2007 (May 14-17, 2007).
Frank Shu, Windows 7 Enhancements for Solid-State Drives, Microsoft WinHEC 2008 (Nov. 4-6, 2008).

(56) References Cited

OTHER PUBLICATIONS

H. Niijima, Design of a Solid-State File Using Flash EEPROM, IBM Journal of Research and Development, vol. 39, No. 5, pp. 531-545, Sep. 1995.

IDS submitted on Sep. 25, 2013 during prosecution U.S. Pat. No. 8,762,658.

Institute for the Advancement of the American Legal System, Civil Case Processing in the Federal District Courts (2009).

Judge Albright, Order Governing Proceedings—Patent Case (rev. 3.2). Nov. 12, 2020.

Mapping Structures for Flash Memories: techniques and open problems, IEEE Xplore, https://ieeexplore.IEEE.org/document/1421068 (last visited Dec. 18, 2020).

MARC record for Library of Congress, Nov. 30, 2020.

MARC record for the print digital version of the IEEE International Conference on Software—Science, Technology & Engineering Proceedings in the Linda Hall Library (Sep. 1, 2008).

MARC record for the print version of the IEEE International Conference on Software—Science, Technology & Engineering Proceedings obtained from the OCLC bibliographic database, 2005.

Micron's Preliminary Identification of Extrinsic Evidence, *Unification Techs. LLC v. Micron Tech. Inc.*, No. 6:20-cv-500 (W.D. Tex. 2020).

Original Complaint for Patent Infringement, *Unification Techs. LLC v. Micron Tech. Inc.*, No. 6:20-cv-500 (W.D. Tex. 2020), ECF No. 1. Jun. 5, 2020.

Plaintiff's Reply Claim Construction Brief, *Unification Techs. LLC v. Micron Tech. Inc.*, No. 6:20-cv-500 (W.D. Tex. 2020), ECF No. 57. Feb. 3, 2021.

Plaintiff's Revised Claim Constructions, *Unification Techs. LLC v. Micron Tech. Inc.*, No. 6:20-cv-500 (W.D. Tex. 2020). Dec. 9, 2020.

Proceedings. IEEE International Conference on Software—Science, Technology and Engineering, IEEE Computer Society, www.computer.org/csdl/proceedings/swste/2005/12OmNC17hWm (last visited Oct. 30, 2020).

Public file history of U.S. Pat. No. 8,533,406, titled "Apparatus, System, and Method for Identifying Data That is No Longer in Use," to Flynn et al. (Sep. 7, 2012).

Public file history of U.S. Pat. No. 8,762,658, titled "Systems and Methods for Persistent Deallocation," to Flynn et al. Aug. 3, 2012.

Public file history of U.S. Pat. No. 9,632,727 B2, titled "Systems and Methods for Identifying Storage Resources That Are Not in Use" to Flynn et al. (Jun. 19, 2014).

SD Specifications Part 1 Physical Layer Simplified Specification Version 1.10, SD Group and SD Card Association Technical Committee (Mar. 18, 2005).

Serial ATA: High Speed Serialized AT Attachment Revision 1.0, Serial ATA International Organization (Aug. 29, 2001).

Serial ATA (SATA) Revision 2.5, Serial ATA International Organization (Oct. 27, 2005).

U.S. Appl. No. 60/974,470 for "Apparatus, System, and Method for Object-Oriented Solid-State Storage," to Flynn et al. ("Sep. '07 provisional"). Sep. 22, 2007.

U.S. Appl. No. 60/912,728, titled "Remove-On-Delete Technologies for Solid State Drive Optimization," to Frank Shu et al. ("Shu Provisional"). (Apr. 19, 2007).

U.S. Appl. No. 60/873,111 titled "Elemental Blade System," to Flynn et al. (Dec. 6, 2006).

Wayback Machine Archive of Microsoft WinHEC 2007 Conference Presentations Website, captured Sep. 12, 2007, https://web.archive.org/web/20070214023104/http://www.microsoft.com/whdc/winhec.

William D. Brown & Joe E. Brewer, Nonvolatile Semiconductor Memory Technology (IEEE 1998).

* cited by examiner

SYSTEMS AND METHODS FOR IDENTIFYING STORAGE RESOURCES THAT ARE NOT IN USE

CROSS-REFERENCES TO RELATED APPLICATIONS

This application is a continuation of U.S. application Ser. No. 15/460,126 filed Mar. 15, 2017, which is a continuation U.S. application Ser. No. 15/228,893 filed Aug. 4, 2016, now U.S. Pat. No. 10,387,327, which is a continuation of U.S. application Ser. No. 14/309,751 filed Jun. 19, 2014, now U.S. Pat. No. 9,632,727, which is a continuation of U.S. application Ser. No. 13/566,471 filed Aug. 3, 2012, now U.S. Pat. No. 8,762,658, which is a continuation of U.S. application Ser. No. 11/952,113 filed Dec. 6, 2007, now U.S. Pat. No. 8,261,005, which claims priority to U.S. Provisional Application No. 60/974,470 filed Sep. 22, 2017 and U.S. Provisional Application No. 60/873,111, filed on Dec. 6, 2006. Each of the above-referenced applications are incorporated herein by references in their entirety.

BACKGROUND OF THE INVENTION

Field of the Invention

This invention relates to managing data in a data storage device and more particularly relates to managing data in a storage device using an empty data segment directive.

Description of the Related Art

Typically, when data is no longer useful it may be erased. In many file systems, an erase command deletes a directory entry in the file system while leaving the data in place in the storage device containing the data. Typically, a data storage device is not involved in this type of erase operation. Another method of erasing data is to write zeros, ones, or some other null data character to the data storage device to actually replace the erased file. However, this is inefficient because valuable bandwidth is used while transmitting the data is being overwritten. In addition, space in the storage device is taken up by the data used to overwrite invalid data.

In some storage devices, like the solid-state storage device 102 described herein, updating previously stored data does not overwrite existing data. Attempting to overwrite data with a string of ones or a string of zeros on such a device takes up valuable space without fulfilling the desired intent of overwriting the existing data. For these devices, such as solid-state storage devices 102, a client 114 typically does not have an ability to overwrite data to erase it.

When receiving a string of repeated characters or character strings, the received data is highly compressible, but typically compression is done by a file system prior to transmission to a storage device. A typical storage device cannot distinguish between compressed data and uncompressed data. The storage device may also receive a command to read the erased file so the storage device may transmit a stream of zeros, ones, or a null character to the requesting device. Again, bandwidth is required to transmit data representing the erased file.

SUMMARY OF THE INVENTION

From the foregoing discussion, it should be apparent that a need exists for an apparatus, system, and method for a storage device to receive a directive that data is to be erased so that the storage device can store a data segment token that represents an empty data segment or data with repeated characters or character strings. The apparatus, system, and method may also erase the existing data so that the resulting used storage space comprises the small data segment token. An apparatus, system, and method are presented that overcome some or all of the shortcomings of the prior art.

The present invention has been developed in response to the present state of the art, and in particular, in response to the problems and needs in the art that have not yet been fully solved by currently available data management systems. Accordingly, the present invention has been developed to provide an apparatus, system, and method for managing data that overcome many or all of the above-discussed shortcomings in the art.

Embodiments of methods for managing a non-volatile storage media are disclosed. The methods may comprise receiving a message comprising a logical identifier corresponding to data that does not need to be preserved on a non-volatile storage medium, and indicating that that contents of a physical storage location on the non-volatile storage medium corresponding to the logical identifier do not need to be preserved on the non-volatile storage medium in response to the message.

Indicating that the contents of the physical storage location do not need to be preserved may comprise deleting an index entry that associates the logical identifier with the physical storage location, deleting a mapping between the logical identifier and the physical storage location, invalidating an association between the logical identifier and an address of the physical storage location, and/or marking the contents of the physical storage location invalid.

The methods may further comprise maintaining an index of mappings between logical identifiers and physical storage locations, and that the contents of the physical storage location do not need to be preserved may comprise removing a mapping between the logical identifier and the physical storage location from the index.

Methods for managing a non-volatile storage medium may further comprise receiving a hint or other indication that data of a specified logical identifier does not need to be preserved on a non-volatile storage device, and removing a mapping between the specified logical identifier and a physical address of the data of the specified logical identifier on the non-volatile storage device in response to the hint, wherein removal of the mapping indicates that the data does not need to be preserved on the non-volatile storage device. The methods may further comprise invalidating a data packet in response to the hint.

In some embodiments, the methods disclosed herein may further comprise erasing the contents of the physical storage location in a storage recovery process, such as garbage collection or the like. The storage recovery process may comprise erasing a storage division comprising the physical storage location (e.g., erase block, logical erase block, or the like).

In some embodiments, the methods disclosed herein may further comprise receiving the message from a block storage client, such as a file system, operating system, application, client, or the like. The message may be received through a block storage application programming interface, block storage protocol, or the like.

Disclosed herein are embodiments of apparatuses and/or systems for managing a non-volatile storage medium, comprising a request receiver module configured to receive an indication identifying data that can be erased from a non-volatile storage medium, wherein the indication identifies the data using a logical identifier associated with the data, and a marking module configured to record that data stored at a physical address on the non-volatile storage medium can be erased from the non-volatile storage medium in response to receiving the indication.

The marking module may be configured to invalidate an association between the logical identifier and the physical address, delete a mapping between the logical identifier and the physical address, and/or mark a data packet at the physical address invalid.

The apparatuses and systems disclosed herein may further comprise an index comprising mappings between logical identifiers and physical addresses on the non-volatile storage medium, wherein the marking module is configured to remove a mapping between the logical identifier and the physical addresses of the data from the index. The marking module may be further configured to delete a reference to the physical address from an index entry of the logical identifier. Removal of the mapping may indicate that data stored at the physical address can be erased from the non-volatile storage medium.

The apparatuses and systems disclosed herein may further comprise a request receiver module configured to receive the hint. The request receiver module may comprise a driver. The request receiver module may be configured to receive the hint from a file system, the file system configured to send the hint in response to deletion of file system data associated with the logical identifier and/or removal of a file associated with the logical identifier.

In some embodiments, the request receiver module is configured to receive the hint from an application, wherein the application is configured to send the hint in response to determining that data associated with the logical identifier no longer needs to be retained on the non-volatile storage medium.

The apparatuses and systems disclosed herein may further comprise a storage recovery module configured to recover the physical storage location at the physical address, and a storage module configured to store data associated with another logical identifier on the physical storage location in response to recovering the physical storage location.

The apparatuses and systems disclosed herein may comprise, an index configured to contain a plurality of entries, wherein each entry associates a logical identifier with a physical storage location of a non-volatile storage medium that comprises valid data of the logical identifier, a request receiver module configured to receive an indication that a specified logical identifier is empty, and an index module configured to remove an entry from the index that associates the specified logical identifier with a physical storage location of the non-volatile storage medium in response to the indication. The request receiver module may be configured to receive the indication through one of a block device interface and via a block storage protocol.

The apparatuses and systems disclosed herein may further comprise a storage recovery module configured to erase a storage division comprising the physical storage location in response to removing the entry.

The apparatuses and systems disclosed herein may further comprise a read request response module configured to return an indication that the logical identifier is empty in response to a request to read data of the logical identifier while the data remains on the non-volatile storage medium.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
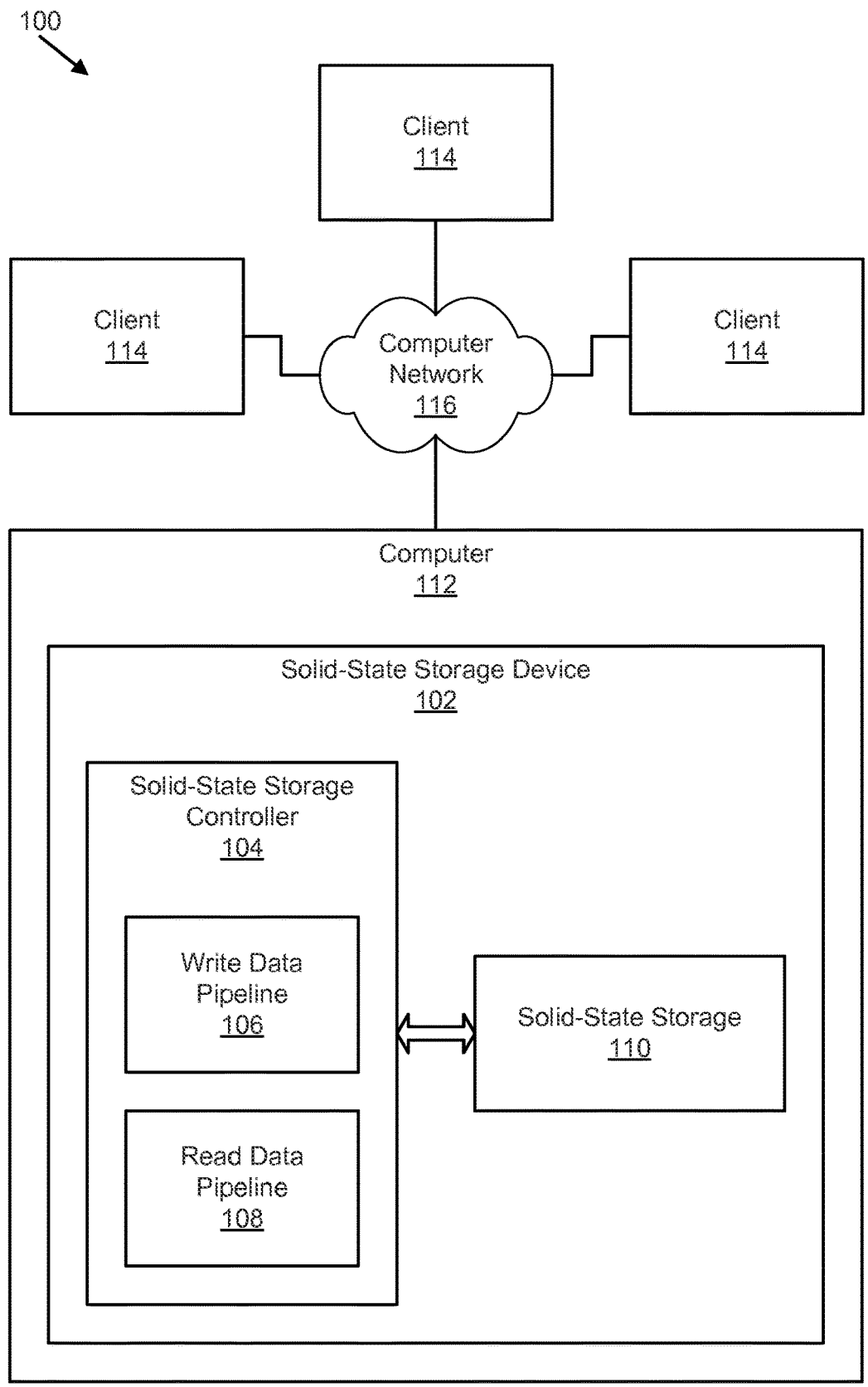
FIG. 1A is a schematic block diagram illustrating one embodiment of a system for data management in a solid-state storage device in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a signal bearing medium may take any form capable of generating a signal, causing a signal to be generated, or causing execution of a program of machine-readable instructions on a digital processing apparatus. A signal bearing medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1A is a schematic block diagram illustrating one embodiment of a system 100 for data management in a solid-state storage device in accordance with the present invention. The system 100 includes a solid-state storage device 102, a solid-state storage controller 104, a write data pipeline 106, a read data pipeline 108, a solid-state storage 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage 110, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

Storage Controller-Managed Objects

Figure 1B:
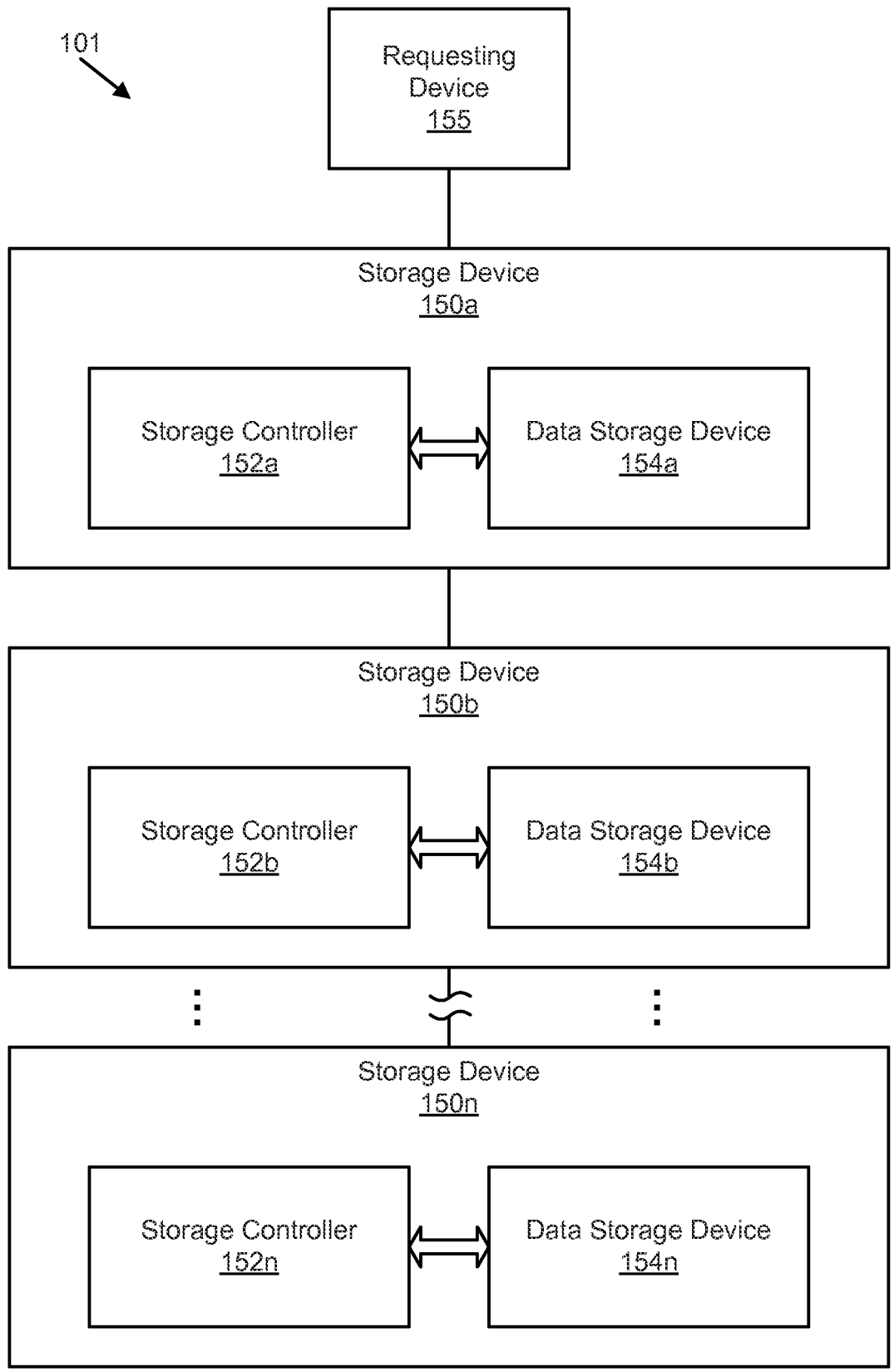
FIG. 1B is a schematic block diagram illustrating one embodiment of a system for object management in a storage device in accordance with the present invention.

FIG. 1B is a schematic block diagram illustrating one embodiment of a system 101 for object management in a storage device in accordance with the present invention. The system 101 includes one or more storage device 150, each with a storage controller 152 and one or more data storage devices 154, and one or more requesting devices 155. The storage devices 150 are networked together and coupled to one or more requesting devices 155. The requesting device 155 sends object requests to a storage device 150a. An object request may be a request to create an object, a request to write data to an object, a request to read data from an object, a request to delete an object, a request to checkpoint an object, a request to copy an object, and the like. One of skill in the art will recognize other object requests.

In one embodiment, the storage controller 152 and data storage device 154 are separate devices. In another embodiment, the storage controller 152 and data storage device 154 are integrated into one storage device 150. In another embodiment, a data storage device 154 is a solid-state storage 110 and the storage controller 152 is a solid-state storage device controller 202. In other embodiments, a data storage device 154 may be a hard disk drive, an optical drive, tape storage, or the like. In another embodiment, a storage device 150 may include two or more data storage devices 154 of different types.

In one embodiment, the data storage device 154 is a solid-state storage 110 and is arranged as an array of solid-state storage elements 216, 218, 220. In another embodiment, the solid-state storage 110 is arranged in two or more banks 214a-n. Solid-state storage 110 is described in more detail below with respect to FIG. 2B.

The storage devices 150a-n may be networked together and act as a distributed storage device. The storage device 150a coupled to the requesting device 155 controls object requests to the distributed storage device. In one embodiment, the storage devices 150 and associated storage controllers 152 manage objects and appear to the requesting device(s) 155 as a distributed object file system. In this context, a parallel object file system is an example of a type of distributed object file system. In another embodiment, the storage devices 150 and associated storage controllers 152 manage objects and appear to the requesting device 155(s) as distributed object file servers. In this context, a parallel object file server is an example of a type of distributed object file server. In these and other embodiments the requesting device 155 may exclusively manage objects or participate in managing objects in conjunction with storage devices 150; this typically does not limit the ability of storage devices 150 to fully manage objects for other clients 114. In the degenerate case, each distributed storage device, distributed object file system and distributed object file server can operate independently as a single device. The networked storage devices 150a-n may operate as distributed storage devices, distributed object file systems, distributed object file servers, and any combination thereof having images of one or more of these capabilities configured for one or more requesting devices 155. Fore example, the storage devices 150 may be configured to operate as distributed storage devices for a first requesting device 155a, while operating as distributed storage devices and distributed object file systems for requesting devices 155b. Where the system 101 includes one storage device 150a, the storage controller 152a of the storage device 150a manages objects may appear to the requesting device(s) 155 as an object file system or an object file server.

In one embodiment where the storage devices 150 are networked together as a distributed storage device, the storage devices 150 serve as a redundant array of independent drives ("RAID") managed by one or more distributed storage controllers 152. For example, a request to write a data segment of an object results in the data segment being stripped across the data storage devices 154a-n with a parity stripe, depending upon the RAID level. One benefit of such an arrangement is that such an object management system may continue to be available when a single storage device 150 has a failure, whether of the storage controller 152, the data storage device 154, or other components of storage device 150.

When redundant networks are used to interconnect the storage devices 150 and requesting devices 155, the object management system may continue to be available in the presence of network failures as long as one of the networks remains operational. A system 101 with a single storage device 150a may also include multiple data storage devices 154a and the storage controller 152a of the storage device 150a may act as a RAID controller and stripe the data segment across the data storage devices 154a of the storage device 150a and may include a parity stripe, depending upon the RAID level.

In one embodiment, where the one or more storage devices 150a-n are solid-state storage devices 102 with a solid-state storage device controller 202 and solid-state storage 110, the solid-state storage device(s) 102 may be configured in a DIMM configuration, daughter card, micromodule, etc. and reside in a computer 112. The computer 112 may be a server or similar device with the solid-state storage devices 102 networked together and acting as distributed RAID controllers. Beneficially, the storage devices 102 may be connected using PCI-e, PCIe-AS, Infiniband or other high-performance bus, switched bus, networked bus, or network and may provide a very compact, high performance RAID storage system with single or distributed solid-state storage controllers 202 autonomously striping a data segment across solid-state storage 110a-n.

In one embodiment, the same network used by the requesting device 155 to communicate with storage devices 150 may be used by the peer storage device 150a to communicate with peer storage devices 150b-n to accomplish RAID functionality. In another embodiment, a separate network may be used between the storage devices 150 for the purpose of RAIDing. In another embodiment, the requesting devices 155 may participate in the RAIDing process by sending redundant requests to the storage devices 150. For example, requesting device 155 may send a first object write request to a first storage device 150a and a second object write request with the same data segment to a second storage device 150b to achieve simple mirroring.

With the ability for object handling within the storage device(s) 102, the storage controller(s) 152 uniquely have the ability to store one data segment or object using one RAID level while another data segment or object is stored using a different RAID level or without RAID striping. These multiple RAID groupings may be associated with multiple partitions within the storage devices 150. RAID 0, RAID 1, RAID5, RAID6 and composite RAID types 10, 50, 60, can be supported simultaneously across a variety of RAID groups comprising data storage devices 154a-n. One skilled in the art will recognize other RAID types and configurations that may also be simultaneously supported.

Also, because the storage controller(s) 152 operate autonomously as RAID controllers, the RAID controllers can perform progressive RAIDing and can transform objects or portions of objects striped across data storage devices 154 with one RAID level to another RAID level without the requesting device 155 being affected, participating or even detecting the change in RAID levels. In the preferred embodiment, progressing the RAID configuration from one level to another level may be accomplished autonomously on an object or even a packet bases and is initiated by a distributed RAID control module operating in one of the storage devices 150 or the storage controllers 152. Typically, RAID progression will be from a higher performance and lower efficiency storage configuration such as RAID1 to a lower performance and higher storage efficiency configuration such as RAID5 where the transformation is dynamically initiated based on the frequency of access. But, one can see that progressing the configuration from RAID5 to RAID1 is also possible. Other processes for initiating RAID progression may be configured or requested from clients or external agents such a storage system management server request. One of skill in the art will recognize other features and benefits of a storage device 102 with a storage controller 152 that autonomously manages objects.

Apparatus for Storage Controller-Managed Objects

Figure 2A:
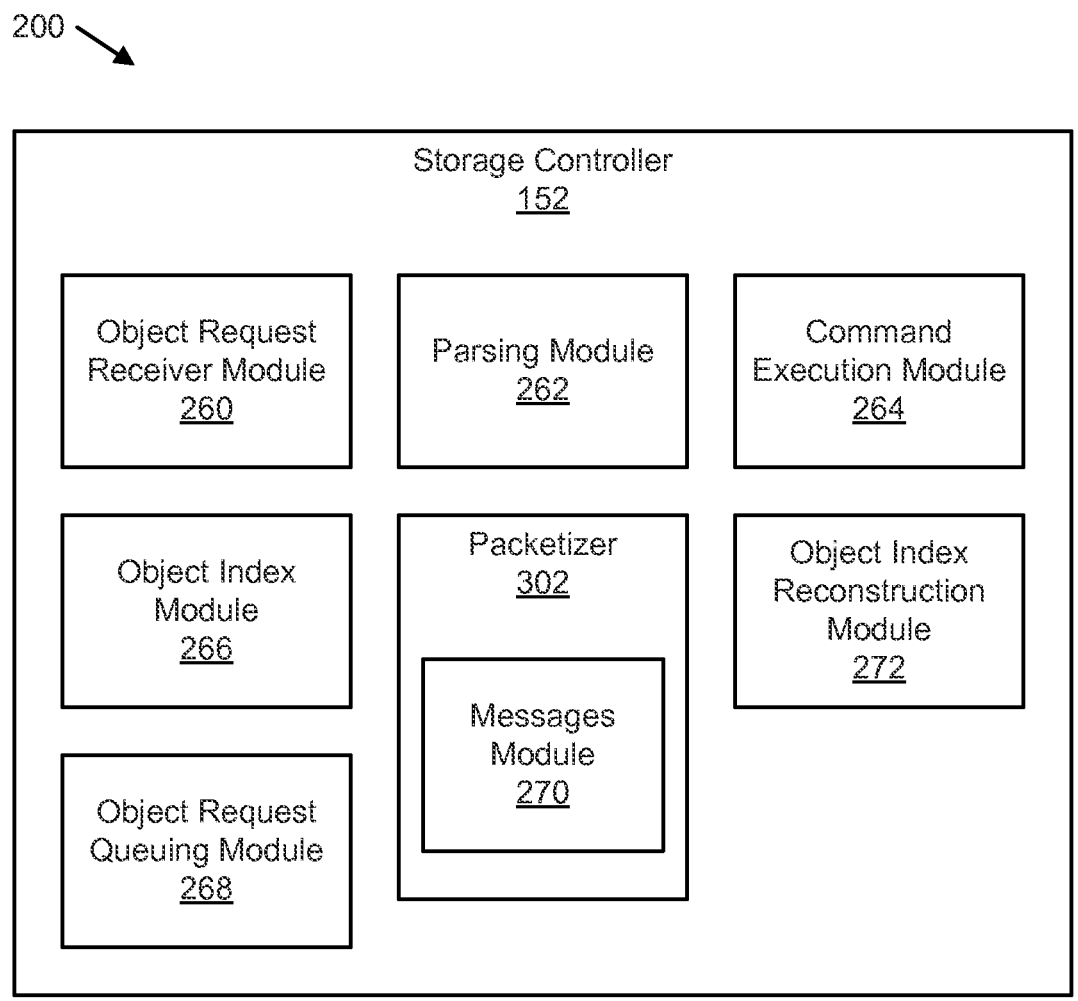
FIG. 2A is a schematic block diagram illustrating one embodiment of an apparatus for object management in a storage device in accordance with the present invention.

FIG. 2A is a schematic block diagram illustrating one embodiment of an apparatus 200 for object management in a storage device in accordance with the present invention. The apparatus 200 includes a storage controller 152 with an object request receiver module 260, a parsing module 262, a command execution module 264, an object index module 266, an object request queuing module 268, a packetizer 302 with a messages module 270, and an object index reconstruction module 272, which are described below.

The storage controller 152 is substantially similar to the storage controller 152 described in relation to the system 101 of FIG. 1B and may be a solid-state storage device controller 202 described in relation to FIG. 2. The apparatus 200 includes an object request receiver module 260 that receives an object request from one or more requesting devices 155. For example, for a store object data request, the storage controller 152 stores the data segment as a data packet in a data storage device 154 coupled to the storage controller 152. The object request is typically directed at a data segment stored or to be stored in one or more object data packets for an object managed by the storage controller 152. The object request may request that the storage controller 152 create an object to be later filled with data through later object request which may utilize a local or remote direct memory access ("DMA," "RDMA") transfer.

In one embodiment, the object request is a write request to write all or part of an object to a previously created object. In one example, the write request is for a data segment of an object. The other data segments of the object may be written to the storage device 150 or to other storage devices. In another example, the write request is for an entire object. In another example, the object request is to read data from a data segment managed by the storage controller 152. In yet another embodiment, the object request is a delete request to delete a data segment or object.

Advantageously, the storage controller 152 can accept write requests that do more than write a new object or append data to an existing object. For example, a write request received by the object request receiver module 260 may include a request to add data ahead of data stored by the storage controller 152, to insert data into the stored data, or to replace a segment of data. The object index maintained by the storage controller 152 provides the flexibility required for these complex write operations that is not available in other storage controllers, but is currently available only outside of storage controllers in file systems of servers and other computers.

The apparatus 200 includes a parsing module 262 that parses the object request into one or more commands. Typically, the parsing module 262 parses the object request into one or more buffers. For example, one or more commands in the object request may be parsed into a command buffer. Typically the parsing module 262 prepares an object request so that the information in the object request can be understood and executed by the storage controller 152. One of skill in the art will recognize other functions of a parsing module 262 that parses an object request into one or more commands.

The apparatus 200 includes a command execution module 264 that executes the command(s) parsed from the object request. In one embodiment, the command execution module 264 executes one command. In another embodiment, the command execution module 264 executes multiple commands. Typically, the command execution module 264 interprets a command parsed from the object request, such as a write command, and then creates, queues, and executes subcommands. For example, a write command parsed from an object request may direct the storage controller 152 to store multiple data segments. The object request may also include required attributes such as encryption, compression, etc. The command execution module 264 may direct the storage controller 152 to compress the data segments, encrypt the data segments, create one or more data packets and associated headers for each data packet, encrypt the data packets with a media encryption key, add error correcting code, and store the data packets a specific location. Storing the data packets at a specific location and other subcommands may also be broken down into other lower level subcommands. One of skill in the art will recognize other ways that the command execution module 264 can execute one or more commands parsed from an object request.

The apparatus 200 includes an object index module 266 that creates an object entry in an object index in response to the storage controller 152 creating an object or storing the data segment of the object. Typically, the storage controller 152 creates a data packet from the data segment and the location of where the data packet is stored is assigned at the time the data segment is stored. Object metadata received with a data segment or as part of an object request may be stored in a similar way.

The object index module 266 creates an object entry into an object index at the time the data packet is stored and the physical address of the data packet is assigned. The object entry includes a mapping between a logical identifier of the object and one or more physical addresses corresponding to where the storage controller 152 stored one or more data packets and any object metadata packets. In another embodiment, the entry in the object index is created before the data packets of the object are stored. For example, if the storage controller 152 determines a physical address of where the data packets are to be stored earlier, the object index module 266 may create the entry in the object index earlier.

Typically, when an object request or group of object requests results in an object or data segment being modified, possibly during a read-modify-write operation, the object index module 266 updates an entry in the object index corresponding the modified object. In one embodiment, the object index creates a new object and a new entry in the object index for the modified object. Typically, where only a portion of an object is modified, the object includes modified data packets and some data packets that remain unchanged. In this case, the new entry includes a mapping to the unchanged data packets as where they were originally written and to the modified objects written to a new location.

In another embodiment, where the object request receiver module 260 receives an object request that includes a command that erases a data block or other object elements, the storage controller 152 may store at least one packet such as an erase packet that includes information including a reference to the object, relationship to the object, and the size of the data block erased. Additionally, it may further indicate that the erased object elements are filled with zeros. Thus, the erase object request can be used to emulate actual memory or storage that is erased and actually has a portion of the appropriate memory/storage actually stored with zeros in the cells of the memory/storage.

Beneficially, creating an object index with entries indicating mapping between data segments and metadata of an object allows the storage controller 152 to autonomously handle and manage objects. This capability allows a great amount of flexibility for storing data in the storage device 150. Once the index entry for the object is created, subsequent object requests regarding the object can be serviced efficiently by the storage controller 152.

In one embodiment, the storage controller 152 includes an object request queuing module 268 that queues one or more object requests received by the object request receiver module 260 prior to parsing by the parsing module 262. The object request queuing module 268 allows flexibility between when an object request is received and when it is executed.

In another embodiment, the storage controller 152 includes a packetizer 302 that creates one or more data packets from the one or more data segments where the data packets are sized for storage in the data storage device 154. The packetizer 302 is described below in more detail with respect to FIG. 3. The packetizer 302 includes, in one embodiment, a messages module 270 that creates a header for each packet. The header includes a packet identifier and a packet length. The packet identifier relates the packet to the object for which the packet was formed.

In one embodiment, each packet includes a packet identifier that is self-contained in that the packet identifier contains adequate information to identify the object and relationship within the object of the object elements contained within the packet. However, a more efficient preferred embodiment is to store packets in containers.

A container is a data construct that facilitates more efficient storage of packets and helps establish relationships between an object and data packets, metadata packets, and other packets related to the object that are stored within the container. Note that the storage controller 152 typically treats object metadata received as part of an object and data segments in a similar manner. Typically "packet" may refer to a data packet comprising data, a metadata packet comprising metadata, or another packet of another packet type. An object may be stored in one or more containers and a container typically includes packets for no more than one unique object. An object may be distributed between multiple containers. Typically a container is stored within a single logical erase block (storage division) and is typically never split between logical erase blocks.

A container, in one example, may be split between two or more logical/virtual pages. A container is identified by a container label that associates that container with an object. A container may contain zero to many packets and the packets within a container are typically from one object. A packet may be of many object element types, including object attribute elements, object data elements, object index elements, and the like. Hybrid packets may be created that include more than one object element type. Each packet may contain zero to many elements of the same element type. Each packet within a container typically contains a unique identifier that identifies the relationship to the object.

Each packet is associated with one container. In a preferred embodiment, containers are limited to an erase block so that at or near the beginning of each erase block a container packet can be found. This helps limit data loss to an erase block with a corrupted packet header. In this embodiment, if the object index is unavailable and a packet header within the erase block is corrupted, the contents from the corrupted packet header to the end of the erase block may be lost because there is possibly no reliable mechanism to determine the location of subsequent packets. In another embodiment, a more reliable approach is to have a container limited to a page boundary. This embodiment requires more header overhead. In another embodiment, containers can flow across page and erase block boundaries. This requires less header overhead but a larger portion of data may be lost if a packet header is corrupted. For these several embodiments it is expected that some type of RAID is used to further ensure data integrity.

In one embodiment, the apparatus 200 includes an object index reconstruction module 272 that that reconstructs the entries in the object index using information from packet headers stored in the data storage device 154. In one embodiment, the object index reconstruction module 272 reconstructs the entries of the object index by reading headers to determine the object to which each packet belongs and sequence information to determine where in the object the data or metadata belongs. The object index reconstruction module 272 uses physical address information for each packet and timestamp or sequence information to create a mapping between the physical locations of the packets and the object identifier and data segment sequence. Timestamp or sequence information is used by the object index reconstruction module 272 to replay the sequence of changes made to the index and thereby typically reestablish the most recent state.

In another embodiment, the object index reconstruction module 272 locates packets using packet header information along with container packet information to identify physical locations of the packets, object identifier, and sequence number of each packet to reconstruct entries in the object index. In one embodiment, erase blocks are time stamped or given a sequence number as packets are written and the timestamp or sequence information of an erase block is used along with information gathered from container headers and packet headers to reconstruct the object index. In another embodiment, timestamp or sequence information is written to an erase block when the erase block is recovered.

Where the object index is stored in volatile memory, an error, loss of power, or other problem causing the storage controller 152 to shut down without saving the object index could be a problem if the object index cannot be reconstructed. The object index reconstruction module 272 allows the object index to be stored in volatile memory allowing the advantages of volatile memory, such as fast access. The object index reconstruction module 272 allows quick reconstruction of the object index autonomously without dependence on a device external to the storage device 150.

In one embodiment, the object index in volatile memory is stored periodically in a data storage device 154. In a particular example, the object index, or "index metadata," is stored periodically in a solid-state storage 110. In another embodiment, the index metadata is stored in a solid-state storage 110*n* separate from solid-state storage 110*a*-110*n*-1 storing packets. The index metadata is managed independently from data and object metadata transmitted from a requesting device 155 and managed by the storage controller 152/solid-state storage device controller 202. Managing and storing index metadata separate from other data and metadata from an object allows efficient data flow without the storage controller 152/solid-state storage device controller 202 unnecessarily processing object metadata.

In one embodiment, where an object request received by the object request receiver module 260 includes a write request, the storage controller 152 receives one or more data segments of an object from memory of a requesting device 155 as a local or remote direct memory access ("DMA," "RDMA") operation. In a preferred example, the storage controller 152 pulls data from the memory of the requesting device 155 in one or more DMA or RDMA operations. In another example, the requesting device 155 pushes the data segment(s) to the storage controller 152 in one or more DMA or RDMA operations. In another embodiment, where the object request includes a read request, the storage controller 152 transmits one or more data segments of an object to the memory of the requesting device 155 in one or more DMA or RDMA operations. In a preferred example, the storage controller 152 pushes data to the memory of the requesting device 155 in one or more DMA or RDMA operations. In another example, the requesting device 155 pulls data from the storage controller 152 in one or more DMA or RDMA operations. In another example, the storage controller 152 pulls object command request sets from the memory of the requesting device 155 in one or more DMA or RDMA operations. In another example, the requesting device 155 pushes object command request sets to the storage controller 152 in one or more DMA or RDMA operations.

In one embodiment, the storage controller 152 emulates block storage and an object communicated between the requesting device 155 and the storage controller 152 comprises one or more data blocks. In one embodiment, the requesting device 155 includes a driver so that the storage device 150 appears as a block storage device. For example, the requesting device 155 may send a block of data of a certain size along with a physical address of where the requesting device 155 wants the data block stored. The storage controller 152 receives the data block and uses the physical block address transmitted with the data block or a transformation of the physical block address as an object identifier. The storage controller 152 then stores the data block as an object or data segment of an object by packetizing the data block and storing the data block at will. The object index module 266 then creates an entry in the object index using the physical block-based object identifier and the actual physical location where the storage controller 152 stored the data packets comprising the data from the data block.

In another embodiment, the storage controller 152 emulates block storage by accepting block objects. A block object may include one or more data blocks in a block structure. In one embodiment, the storage controller 152 treats the block object as any other object. In another embodiment, an object may represent an entire block device, partition of a block device, or some other logical or physical sub-element of a block device including a track, sector, channel, and the like. Of particular note is the ability to remap a block device RAID group to an object supporting a different RAID construction such as progressive RAID. One skilled in the art will recognize other mappings of traditional or future block devices to objects.

Solid-State Storage Device

Figure 2B:
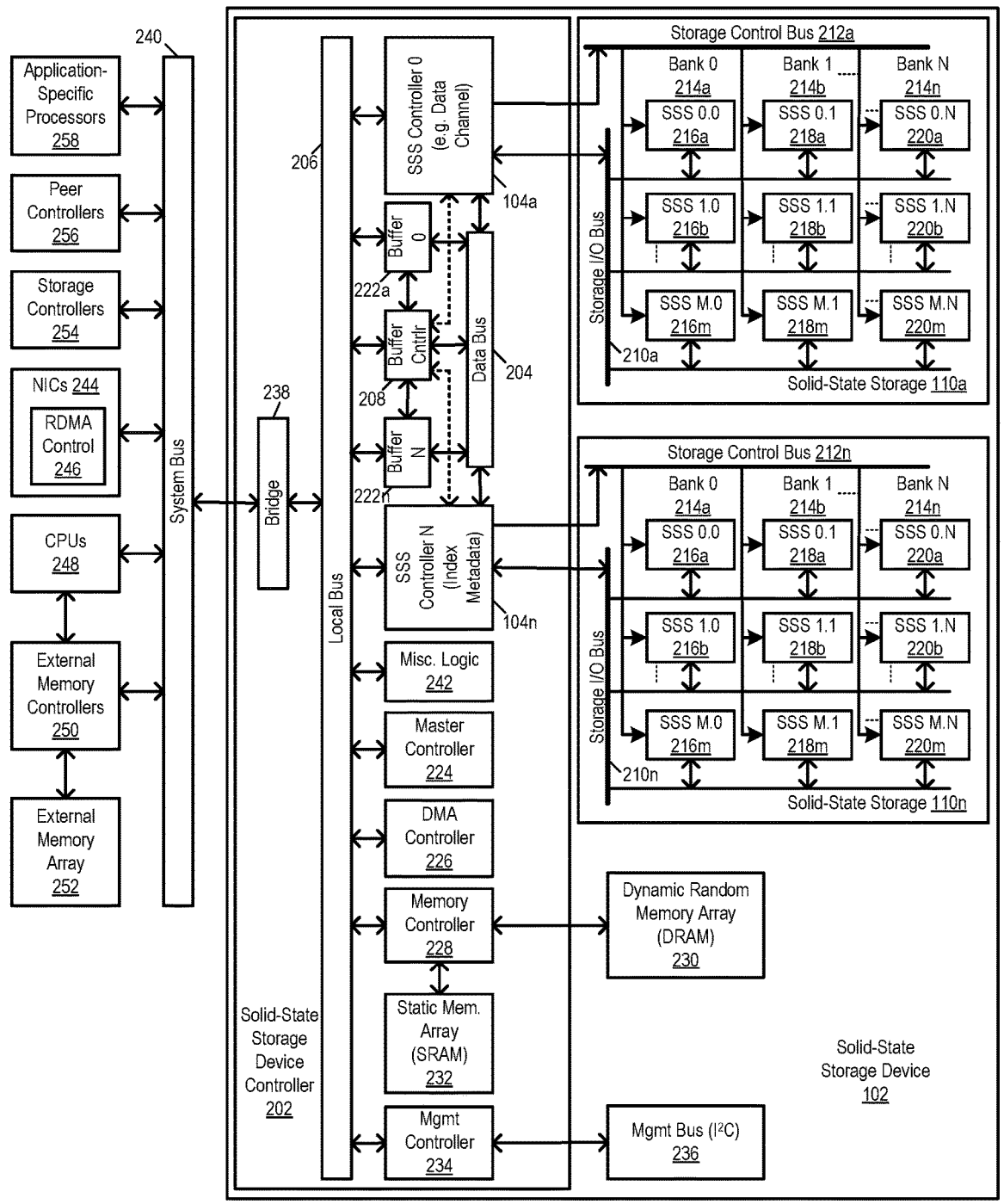
FIG. 2B is a schematic block diagram illustrating one embodiment of a solid-state storage device controller in a solid-state storage device in accordance with the present invention.

FIG. 2B is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage 110. In the depicted embodiment, two solid-state controllers are shown: solid-state controller 0 104a and solid-state storage controller N 104n, and each controls solid-state storage 110a-n. In the depicted embodiment, solid-state storage controller 0 104a controls a data channel so that the attached solid-state storage 110a stores data. Solid-state storage controller N 104n controls an index metadata channel associated with the stored data and the associated solid-state storage 110n stores index metadata. In an alternate embodiment, the solid-state storage device controller 202 includes a single solid-state controller 104a with a single solid-state storage 110a. In another embodiment, there are a plurality of solid-state storage controllers 104a-n and associated solid-state storage 110a-n. In one embodiment, one or more solid state controllers 104a-104n-1, coupled to their associated solid-state storage 110a-110n-1, control data while at least one solid-state storage controller 104n, coupled to its associated solid-state storage 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage 110, data cannot be read from the solid-state storage 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n.times.m solid-state storage elements 216, 218, 220 in a solid-state storage 110. In one embodiment, a solid-state storage 110a includes twenty solid-state storage elements 216, 218, 220 per bank 214 with eight banks 214 and a solid-state storage 110n includes 2 solid-state storage elements 216, 218 per bank 214 with one bank 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 storage elements (e.g. SSS0.0-SSS 20.8) 216, 218, 220. Data is sent to the solid-state storage 110 over the storage I/O bus 210 to all storage elements of a particular group of storage elements (SSS 0.0-SSS 0.8) 216a, 218a, 220a. The storage control bus 212a is used to select a particular bank (e.g. Bank-0 214a) so that the data received over the storage I/O bus 210 connected to all banks 214 is written just to the selected bank 214a.

In a preferred embodiment, the storage I/O bus 210 is comprised of one or more independent 110 buses ("IIOBa-m" comprising 210a.a-m, 210n.a-m) wherein the solid-state storage elements within each row share one of the independent 110 buses accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element 216, 218, 220 has a capacity of 4 kB. A bank 214 of 20 solid-state storage elements 216, 218, 220 would then have an 80 kB capacity of pages accessed with the same address going out the channels of the storage I/O bus 210.

This group of pages in a bank 214 of solid-state storage elements 216, 218, 220 of 80 kB may be called a virtual page. Similarly, an erase block of each storage element 216a-m of a bank 214a may be grouped to form a virtual erase block. In a preferred embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a of a particular erase block of a particular element of a particular bank, a physical address is sent on the storage I/O bus 210 and followed by the packet. The physical address contains enough information for the solid-state storage element 216, 218, 220 to direct the packet to the designated location within the page. Since all storage elements in a row of storage elements (e.g. SSS 0.0-SSS 0.N 216a, 218a, 220a) are accessed simultaneously by the appropriate bus within the storage I/O bus 210a.a, to reach the proper page and to avoid writing the data packet to similarly addressed pages in the row of storage elements (SSS 0.0-SSS 0.N 216a, 218a, 220a), the bank 214a that includes the solid-state storage element SSS 0.0 216a with the correct page where the data packet is to be written is simultaneously selected by the storage control bus 212.

Similarly, a read command traveling on the storage bus 210 requires a simultaneous command on the storage control bus 212 to select a single bank 214a and the appropriate page within that bank 214a. In a preferred embodiment, a read command reads an entire page, and because there are multiple solid-state storage elements 216, 218, 220 in parallel in a bank 214, an entire virtual page is read with a read command. However, the read command may be broken into subcommands, as will be explained below with respect to bank interleave. A virtual page may also be accessed in a write operation.

An erase block erase command may be sent out to erase an erase block over the storage bus 210 with a particular erase block address to erase a particular erase block. Typically, an erase block erase command may be sent over the parallel paths of the storage I/O bus 210 to erase a virtual erase block, each with a particular erase block address to erase a particular erase block. Simultaneously a particular bank (e.g. bank-0 214a) is selected over the storage control bus 212 to prevent erasure of similarly addressed erase blocks in all of the banks (banks 1-N 214b-n). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage 110. For example, packets are streamed to the storage write buffers of a bank 214a of storage elements 216 and when the buffers are full, the packets are programmed to a designated virtual page. Packets then refill the storage write buffers and, when full, the packets are written to the next virtual page. The next virtual page may be in the same bank 214a or another bank (e.g. 214b). This process continues, virtual page after virtual page, typically until a virtual erase block is filled. In another embodiment, the streaming may continue across virtual erase block boundaries with the process continuing, virtual erase block after virtual erase block.

In a read, modify, write operation, data packets associated with the object are located and read in a read operation. Data segments of the modified object that have been modified are not written to the location from which they are read. Instead, the modified data segments are again converted to data packets and then written to the next available location in the virtual page currently being written. The object index entries for the respective data packets are modified to point to the packets that contain the modified data segments. The entry or entries in the object index for data packets associated with the same object that have not been modified will include pointers to original location of the unmodified data packets. Thus, if the original object is maintained, for example to maintain a previous version of the object, the original object will have pointers in the object index to all data packets as originally written. The new object will have pointers in the object index to some of the original data packets and pointers to the modified data packets in the virtual page that is currently being written.

In a copy operation, the object index includes an entry for the original object mapped to a number of packets stored in the solid-state storage 110. When a copy is made, a new object is created and a new entry is created in the object index mapping the new object to the original packets. The new object is also written to the solid-state storage 110 with its location mapped to the new entry in the object index. The new object packets may be used to identify the packets within the original object that are referenced in case changes have been made in the original object that have not been propagated to the copy and the object index is lost or corrupted.

Beneficially, sequentially writing packets facilitates a more even use of the solid-state storage 110 and allows the solid-storage device controller 202 to monitor storage hot spots and level usage of the various virtual pages in the solid-state storage 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage 110 over a storage I/O bus 210. In a typical embodiment where the solid-state storage is arranged in banks 214 and each bank 214 includes multiple storage elements 216, 218, 220 accessed in parallel, the storage I/O bus 210 is an array of busses, one for each row of storage elements 216, 218, 220 spanning the banks 214. As used herein, the term "storage I/O bus" may refer to one storage I/O bus 210 or an array of data independent busses 204. In a preferred embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping allows a logical address mapped to a physical address of a storage division to be remapped to a different storage division if the first storage division fails, partially fails, is inaccessible, or has some other problem. Remapping is explained further in relation to the remapping module 430 of FIGS. 4A and 4B.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device 155 can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage 110 such as NAND flash or other storage media. In a preferred embodiment, data and associated out-of-band metadata ("object metadata") arriving with the data is communicated using one or more data channels comprising one or more solid-state storage controllers 104a-104n-1 and associated solid-state storage 110a-110n-1 while at least one channel (solid-state storage controller 104n, solid-state storage 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), Fire-Wire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage controller 152/solid-state storage device controller 202 manages multiple data storage devices/solid-state storage 110a-n, the master controller 224 divides the work load among internal controllers, such as the solid-state storage controllers 104a-n. For example, the master controller 224 may divide an object to be written to the data storage devices (e.g. solid-state storage 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246. DMA and RDMA are explained in more detail below.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I.sup.2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
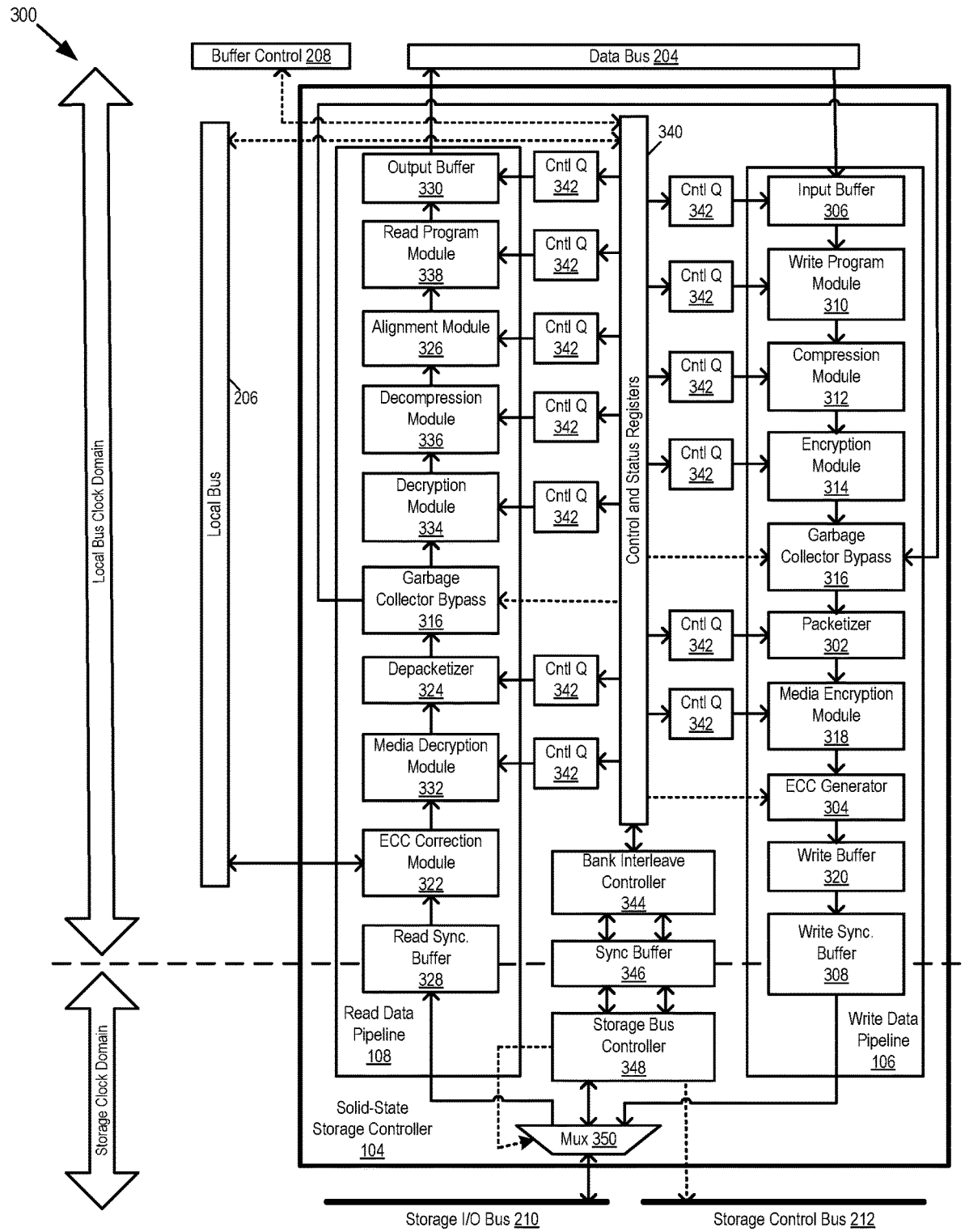
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage 110. The data or metadata segment is typically part of an object, but may also include an entire object. In another embodiment, the data segment is part of a block of data, but may also include an entire block of data. Typically, an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that generates one or more error-correcting codes ("ECC") for the one or more packets received from the packetizer 302. The ECC generator 304 typically uses an error correcting algorithm to generate ECC which is stored with the packet. The ECC stored with the packet is typically used to detect and correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In the preferred embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In the preferred embodiment, ECC algorithms are not dynamically modified. In a preferred embodiment, the ECC stored with the data packets is robust enough to correct errors in more than two bits.

Beneficially, using a robust ECC algorithm allowing more than single bit correction or even double bit correction allows the life of the solid-state storage 110 to be extended. For example, if flash memory is used as the storage medium in the solid-state storage 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage 110. The write synch buffer 308 is located at a boundary between a local clock domain and a solid-state storage clock domain and provides buffering to account for the clock domain differences. In other embodiments, synchronous solid-state storage 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from an embodiment that integrates the solid-state storage 110 and where the embodiment requires encryption protection. The media encryption module 318 and corresponding media decryption module 332 provide a level of security for data stored in the solid-state storage 110. For example, where data is encrypted with the media encryption module 318, if the solid-state storage 110 is connected to a different solid-state storage controller 104, solid-state storage device 102, or computer 112, the contents of the solid-state storage 110 typically could not be read without use of the same encryption key used during the write of the data to the solid-state storage 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm. The encryption key may be received from a client 114, a computer 112, key manager, or other device that manages the encryption key to be used by the solid-state storage controller 104. In another embodiment, the solid-state storage 110 may have two or more partitions and the solid-state storage controller 104 behaves as though it were two or more solid-state storage controllers 104, each operating on a single partition within the solid-state storage 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption module 314 differs from the media encryption module 318 in that the encryption keys used by the encryption module 314 to encrypt data may not be common to all data stored within the solid-state storage device 102 but may vary on an object basis and received in conjunction with receiving data segments as described below. For example, an encryption key for a data segment to be encrypted by the encryption module 314 may be received with the data segment or may be received as part of a command to write an object to which the data segment belongs. The solid-state storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm. In one embodiment, the nonce used by the media encryption module 318 is the same as that used by the encryption module 314.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In a preferred embodiment, the garbage collector bypass 316 is part of an autonomous garbage collector system that operates within the solid-state storage device 102. This allows the solid-state storage device 102 to manage data so that data is systematically spread throughout the solid-state storage 110 to improve performance, data reliability and to avoid overuse and underuse of any one location or area of the solid-state storage 110 and to lengthen the useful life of the solid-state storage 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 106 to fill the remainder of the virtual page in order to improve the efficiency of storage within the Solid-State Storage 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage 110. This allows a write operation to send an entire page of data to the solid-state storage 110 without interruption. By sizing the write buffer 320 of the write data pipeline 106 and buffers within the read data pipeline 108 to be the same capacity or larger than a storage write buffer within the solid-state storage 110, writing and reading data is more efficient since a single write command may be crafted to send a full virtual page of data to the solid-state storage 110 instead of multiple commands.

While the write buffer 320 is being filled, the solid-state storage 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage 110.

In another embodiment, the write buffer 320 is sized smaller than a virtual page so that less than a page of information could be written to a storage write buffer in the solid-state storage 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In the preferred embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another preferred embodiment, the solid-state storage controller 104 stores data using some type of RAID and is able to recover the corrupted data. In another embodiment, the ECC correction module 322 sends and interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage 110 may have two or more partitions and the solid-state storage controller 104 behaves as though it were two or more solid-state storage controllers 104 each operating on a single partition within the solid-state storage 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. Typically, the decryption module 334 uses a different encryption key to decrypt a data segment than the media decryption module 332 uses to decrypt requested packets. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In the preferred embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4A:
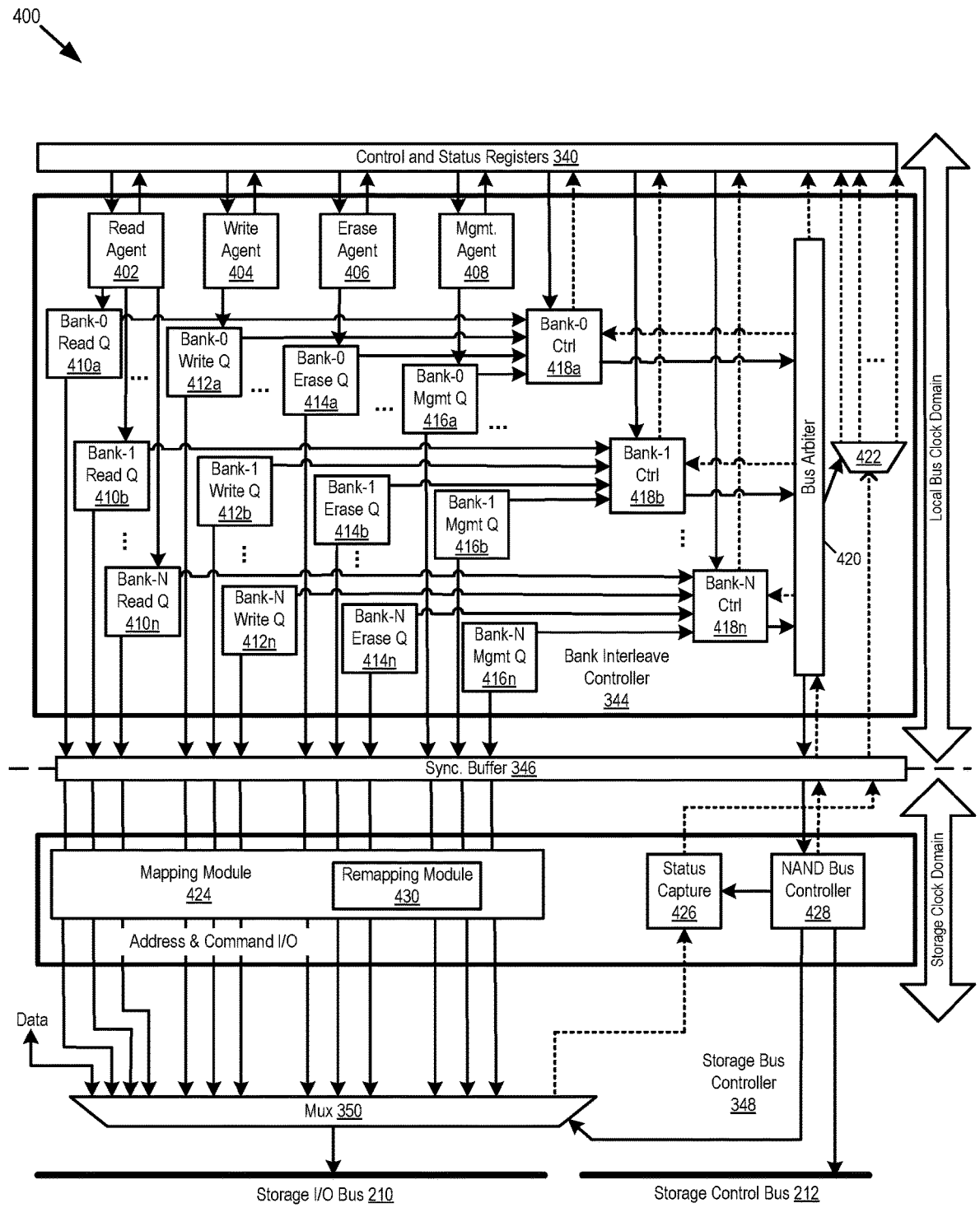
FIG. 4A is a schematic block diagram illustrating one embodiment of a bank interleave controller in the solid-state storage controller in accordance with the present invention.
Figure 4B:
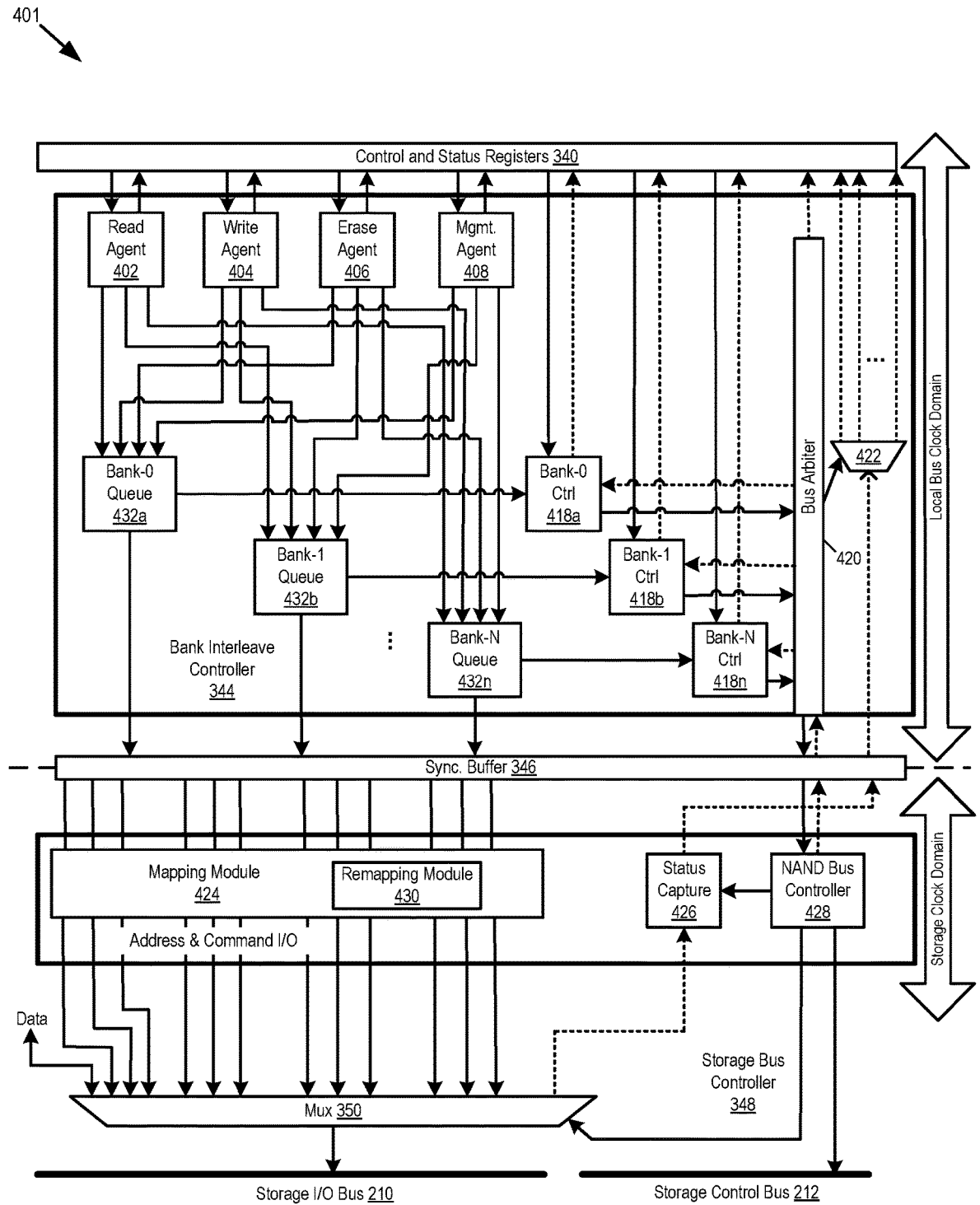
FIG. 4B is a schematic block diagram illustrating an alternate embodiment of a bank interleave controller in the solid-state storage controller in accordance with the present invention.

The solid-state storage controller 104 and or solid-state storage device 102 may also include a bank interleave controller 344, a synchronization buffer 346, a storage bus controller 348, and a multiplexer ("MUX") 350, which are described in relation to FIGS. 4A and 4B.

Bank Interleave

FIG. 4A is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 344 and coordinates among the banks 214 of the solid-state storage 110 execution of the commands stored in the queues, such that a command of a first type executes on one bank 214a while a command of a second type executes on a second bank 214b. The one or more commands are separated by command type into the queues. Each bank 214 of the solid-state storage 110 has a corresponding set of queues within the bank interleave controller 344 and each set of queues includes a queue for each command type.

The bank interleave controller 344 coordinates among the banks 214 of the solid-state storage 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4A, erase and management queues 414, 416 are included and would be appropriate for flash memory, NRAM, MRAM, DRAM, PRAM, etc.

For other types of solid-state storage 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4A, the bank interleave controller 344 includes, for each bank 214, a read queue 410 for reading data from the solid-state storage 110, a write queue 412 for write commands to the solid-state storage 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate subcommands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage 110 with an asynchronous, bi-directional serial storage I/O bus 210, only one command (control information) or set of data can be transmitted at a time. For example, when write commands or data are being transmitted to the solid-state storage 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write sub-command on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage 110. In another embodiment, the solid-state controller 104 includes a bank interleave controller 344 for each row of storage elements 216a-m, 218a-m, 220a-m. For example, one bank interleave controller 344 serves one row of storage elements SSS 0.0-SSS 0.N 216a, 218a, 220a, a second bank interleave controller 344 serves a second row of storage elements SSS 1.0-SSS 1.N 216b, 218b, 220b, etc.

FIG. 4B is a schematic block diagram illustrating an alternate embodiment 401 of a bank interleave controller 344 in the solid-state storage controller 104 in accordance with the present invention. The components 210, 212, 340, 346, 348, 350, 402-430 depicted in the embodiment shown in FIG. 4B are substantially similar to the bank interleave apparatus 400 described in relation to FIG. 4A except that each bank 214 includes a single queue 432a-n and the read commands, write commands, erase commands, management commands, etc. for a bank (e.g. Bank-0 214a) are directed to a single queue 432a for the bank 214a. The queues 432, in one embodiment, are FIFO. In another embodiment, the queues 432 can have commands pulled from the queues 432 in an order other than the order they were stored. In another alternate embodiment (not shown), the read agent 402, write agent 404, erase agent 406, and management agent 408 may be combined into a single agent assigning commands to the appropriate queues 432a-n.

In another alternate embodiment (not shown), commands are stored in a single queue where the commands may be pulled from the queue in an order other than how they are stored so that the bank interleave controller 344 can execute a command on one bank 214a while other commands are executing on the remaining banks 214b-n. One of skill in the art will easily recognize other queue configurations and types to enable execution of a command on one bank 214a while other commands are executing on other banks 214b-n.

Storage-Specific Components

The solid-state storage controller 104 includes a synchronization buffer 346 that buffers commands and status messages sent and received from the solid-state storage 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In the preferred embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage 110 and status messages received from the solid-state storage 110 based on the type of solid-state storage 110. For example, the storage bus controller 348 may have different timing requirements for different types of storage, storage with different performance characteristics, storage from different manufacturers, etc. The storage bus controller 348 also sends control commands to the storage control bus 212.

In the preferred embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage 110 via the storage I/O bus 210 and routes data and status messages from the solid-state storage 110 via the storage I/O bus 210 to the read data pipeline 108 and the control and status registers 340 through the storage bus controller 348, synchronization buffer 346, and bank interleave controller 344.

In the preferred embodiment, the solid-state storage controller 104 includes a MUX 350 for each row of solid-state storage elements (e.g. SSS 0.1 216a, SSS 0.2 218a, SSS 0.N 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.0 to SSS x.N 216, 218, 220) to the MUX 350 for each row of solid-state storage elements (SSS x.0 to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . 0.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Flow Charts

Figure 5:
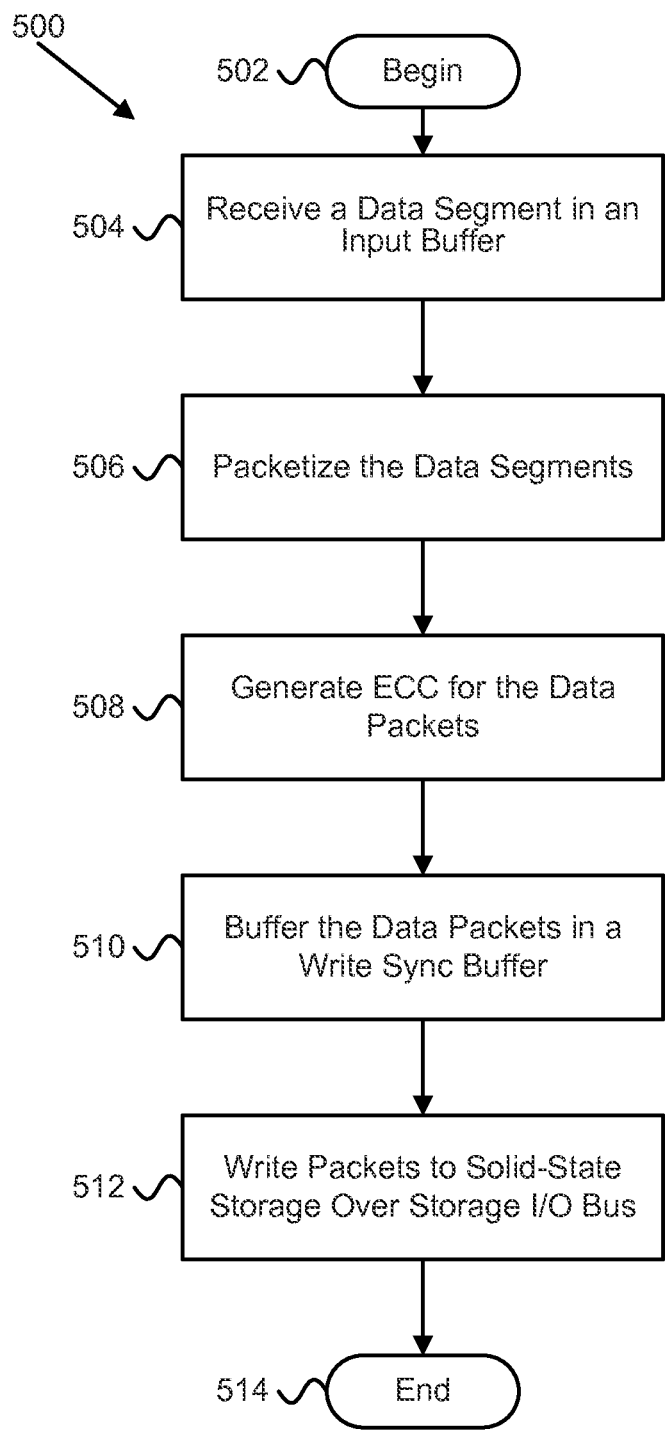
FIG. 5 is a schematic flow chart diagram illustrating one embodiment of a method for managing data in a solid-state storage device using a data pipeline in accordance with the present invention.

FIG. 5 is a schematic flow chart diagram illustrating one embodiment of a method 500 for managing data in a solid-state storage device 102 using a data pipeline in accordance with the present invention. The method 500 begins 502 and the input buffer 306 receives 504 one or more data segments to be written to the solid-state storage 110. The one or more data segments typically include at least a portion of an object but may be an entire object. The packetizer 302 may create one or more object specific packets in conjunction with an object. The packetizer 302 adds a header to each packet which typically includes the length of the packet and a sequence number for the packet within the object. The packetizer 302 receives 504 the one or more data or metadata segments that were stored in the input buffer 306 and packetizes 506 the one or more data or metadata segments by creating one or more packets sized for the solid-state storage 110 where each packet includes one header and data from the one or more segments.

Typically, a first packet includes an object identifier that identifies the object for which the packet was created. A second packet may include a header with information used by the solid-state storage device 102 to associate the second packet to the object identified in the first packet and offset information locating the second packet within the object, and data. The solid-state storage device controller 202 manages the bank 214 and physical area to which the packets are streamed.

The ECC generator 304 receives a packet from the packetizer 302 and generates 508 ECC for the data packets. Typically, there is no fixed relationship between packets and ECC blocks. An ECC block may comprise one or more packets. A packet may comprise one or more ECC blocks. A packet may start and end anywhere within an ECC block. A packet may start anywhere in a first ECC block and end anywhere in a subsequent ECC block.

The write synchronization buffer 308 buffers 510 the packets as distributed within the corresponding ECC blocks prior to writing ECC blocks to the solid-state storage 110 and then the solid-state storage controller 104 writes 512 the data at an appropriate time considering clock domain differences, and the method 500 ends 514. The write synch buffer 308 is located at the boundary between a local clock domain and a solid-state storage 110 clock domain. Note that the method 500 describes receiving one or more data segments and writing one or more data packets for convenience, but typically a stream of data segments is received and a group. Typically a number of ECC blocks comprising a complete virtual page of solid-state storage 110 are written to the solid-state storage 110. Typically the packetizer 302 receives data segments of one size and generates packets of another size. This necessarily requires data or metadata segments or parts of data or metadata segments to be combined to form data packets to capture all of the data of the segments into packets.

Figure 6:
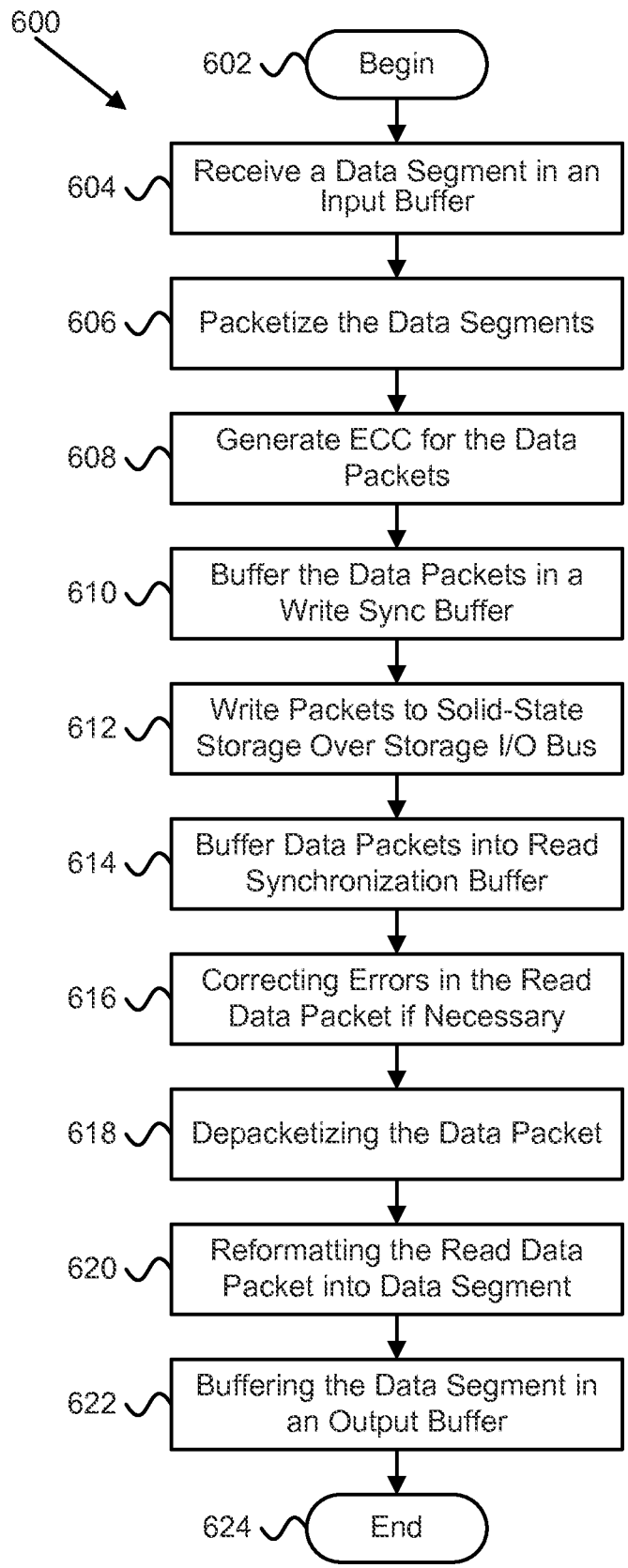
FIG. 6 is a schematic flow chart diagram illustrating another embodiment of a method for managing data in a solid-state storage device using a data pipeline in accordance with the present invention.

FIG. 6 is a schematic flow chart diagram illustrating another embodiment of a method 600 for managing data in a solid-state storage device 102 using a data pipeline in accordance with the present invention. The method 600 begins 602 and the input buffer 306 receives 604 one or more data or metadata segments to be written to the solid-state storage 110. The packetizer 302 adds a header to each packet which typically includes the length of the packet within the object. The packetizer 302 receives 604 the one or more segments that were stored in the input buffer 306 and packetizes 606 the one or more segments by creating one or more packets sized for the solid-state storage 110 where each packet includes a header and data from the one or more segments.

The ECC generator 304 receives a packet from the packetizer 302 and generates 608 one or more ECC blocks for the packets. The write synchronization buffer 308 buffers 610 the packets as distributed within the corresponding ECC blocks prior to writing ECC blocks to the solid-state storage 110 and then the solid-state storage controller 104 writes 612 the data at an appropriate time considering clock domain differences. When data is requested from the solid-state storage 110, ECC blocks comprising one or more data packets are read into the read synchronization buffer 328 and buffered 614. The ECC blocks of the packet are received over the storage I/O bus 210. Since the storage I/O bus 210 is bi-directional, when data is read, write operations, command operations, etc. are halted.

The ECC correction module 322 receives the ECC blocks of the requested packets held in the read synchronization buffer 328 and corrects 616 errors within each ECC block as necessary. If the ECC correction module 322 determines that one or more errors exist in an ECC block and the errors are correctable using the ECC syndrom, the ECC correction module 322 corrects 616 the error in the ECC block. If the ECC correction module 322 determines that a detected error is not correctable using the ECC, the ECC correction module 322 sends an interrupt.

The depacketizer 324 receives 618 the requested packet after the ECC correction module 322 corrects any errors and depacketizes 618 the packets by checking and removing the packet header of each packet. The alignment module 326 receives packets after depacketizing, removes unwanted data, and re-formats 620 the data packets as data or metadata segments of an object in a form compatible with the device requesting the segment or object. The output buffer 330 receives requested packets after depacketizing and buffers 622 the packets prior to transmission to the requesting device 155, and the method 600 ends 624.

Figure 7:
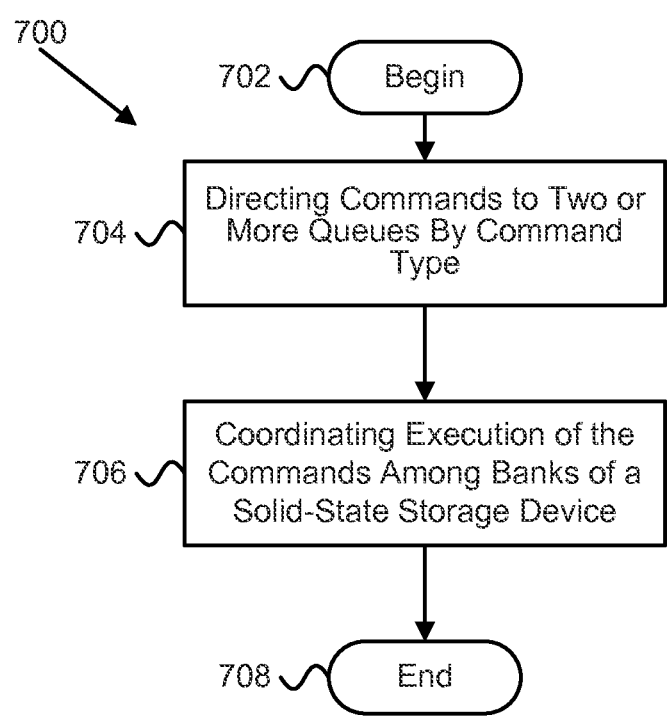
FIG. 7 is a schematic flow chart diagram illustrating an embodiment of a method for managing data in a solid-state storage device using a bank interleave in accordance with the present invention.

FIG. 7 is a schematic flow chart diagram illustrating an embodiment of a method 700 for managing data in a solid-state storage device 102 using a bank interleave in accordance with the present invention. The method 700 begins 702 and the bank interleave controller 344 directs 604 one or more commands to two or more queues 410, 412, 414, 416. Typically the agents 402, 404, 406, 408 direct 704 the commands to the queues 410, 412, 414, 416 by command type. Each set of queues 410, 412, 414, 416 includes a queue for each command type. The bank interleave controller 344 coordinates 706 among the banks 214 execution of the commands stored in the queues 410, 412, 414, 416 so that a command of a first type executes on one bank 214a while a command of a second type executes on a second bank 214b, and the method 700 ends 708.

Storage Space Recovery

Figure 8:
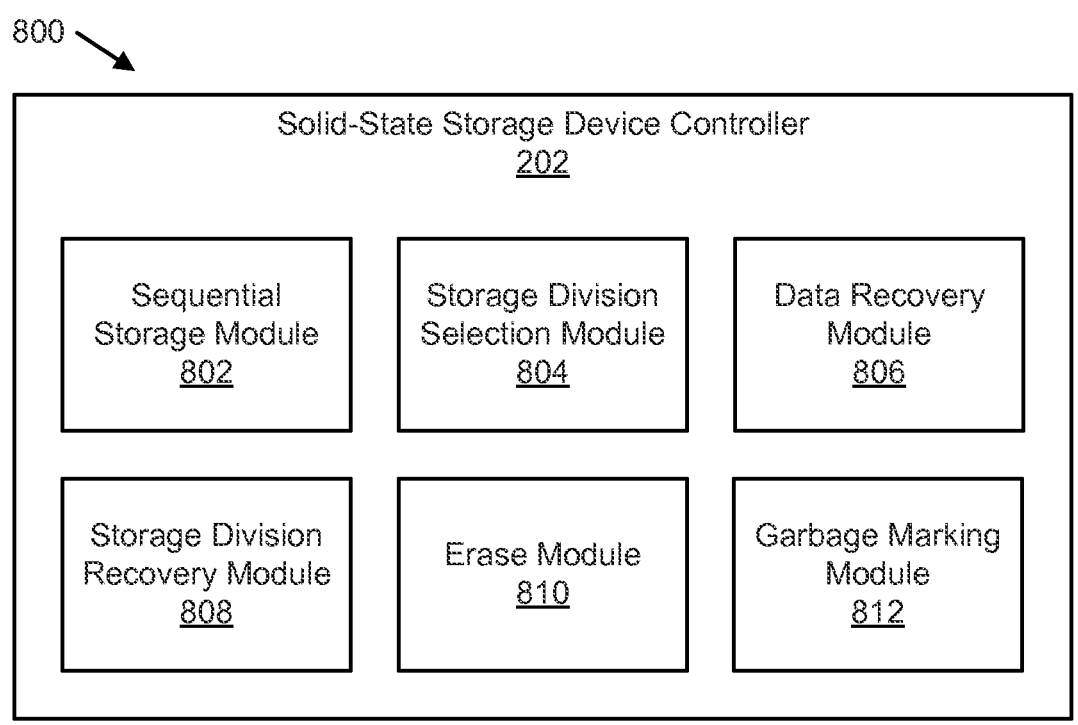
FIG. 8 is a schematic block diagram illustrating one embodiment of an apparatus for garbage collection in a solid-state storage device in accordance with the present invention.

FIG. 8 is a schematic block diagram illustrating one embodiment of an apparatus 800 for garbage collection in a solid-state storage device 102 in accordance with the present invention. The apparatus 800 includes a sequential storage module 802, a storage division selection module 804, a data recovery module 806, and a storage division recovery module 808, which are described below. In other embodiments, the apparatus 800 includes a garbage marking module 812 and an erase module 810.

The apparatus 800 includes a sequential storage module 802 that sequentially writes data packets in a page within a storage division. The packets are sequentially stored whether they are new packets or modified packets. Modified packets are in this embodiment are typically not written back to a location where they were previously stored. In one embodiment, the sequential storage module 802 writes a packet to a first location in a page of a storage division, then to the next location in the page, and to the next, and the next, until the page is filled. The sequential storage module 802 then starts to fill the next page in the storage division. This continues until the storage division is filled.

In a preferred embodiment, the sequential storage module 802 starts writing packets to storage write buffers in the storage elements (e.g. SSS 0.0 to SSS M.0 216) of a bank (bank-0 214*a*). When the storage write buffers are full, the solid-state storage controller 104 causes the data in the storage write buffers to be programmed into designated pages within the storage elements 216 of the bank 214*a*. Then another bank (e.g. bank-1 214*b*) is selected and the sequential storage module 802 starts writing packets to storage write buffers of the storage elements 218 of the bank 214*b* while the first bank-0 214*a* is programming the designated pages. When the storage write buffers of this bank 214*b* are full, the contents of the storage write buffers are programmed into another designated page in each storage element 218. This process is efficient because while one bank 214*a* is programming a page, storage write buffers of another bank 214*b* can be filling.

The storage division includes a portion of a solid-state storage 110 in a solid-state storage device 102. Typically the storage division is an erase block. For flash memory, an erase operation on an erase block writes ones to every bit in the erase block by charging each cell. This is a lengthy process compared to a program operation which starts with a location being all ones, and as data is written, some bits are changed to zero by discharging the cells written with a zero. However, where the solid-state storage 110 is not flash memory or has flash memory where an erase cycle takes a similar amount of time as other operations, such as a read or a program, the storage division may not be required to be erased.

As used herein, a storage division is equivalent in area to an erase block but may or may not be erased. Where erase block is used herein, an erase block may refer to a particular area of a designated size within a storage element (e.g. SSS 0.0 216*a*) and typically includes a certain quantity of pages. Where "erase block" is used in conjunction with flash memory, it is typically a storage division that is erased prior to being written. Where "erase block" is used with "solid-state storage," it may or may not be erased. As used herein, an erase block may include one erase block or a group of erase blocks with one erase block in each of a row of storage elements (e.g. SSS 0.0 to SSS M.0 216*a-n*), which may also be referred to herein as a virtual erase block. When referring to the logical construct associated with the virtual erase block, the erase blocks may be referred to herein as a logical erase block ("LEB").

Typically, the packets are sequentially stored by order of processing. In one embodiment, where a write data pipeline 106 is used, the sequential storage module 802 stores packets in the order that they come out of the write data pipeline 106. This order may be a result of data segments arriving from a requesting device 155 mixed with packets of valid data that are being read from another storage division as valid data is being recovered from a storage division during a recovery operation as explained below. Re-routing recovered, valid data packets to the write data pipeline 106 may include the garbage collector bypass 316 as described above in relation to the solid-state storage controller 104 of FIG. 3.

The apparatus 800 includes a storage division selection module 804 that selects a storage division for recovery. Selecting a storage division for recovery may be to reuse the storage division by the sequential storage module 802 for writing data, thus adding the recovered storage division to the storage pool, or to recover valid data from the storage division after determining that the storage division is failing, unreliable, should be refreshed, or other reason to take the storage division temporarily or permanently out of the storage pool. In another embodiment, the storage division selection module 804 selects a storage division for recovery by identifying a storage division or erase block with a high amount of invalid data.

In another embodiment, the storage division selection module 804 selects a storage division for recovery by identifying a storage division or erase block with a low amount of wear. For example, identifying a storage division or erase block with a low amount of wear may include identifying a storage division with a low amount of invalid data, a low number of erase cycles, low bit error rate, or low program count (low number of times a page of data in a buffer is written to a page in the storage division; program count may be measured from when the device was manufactured, from when the storage division was last erased, from other arbitrary events, and from combinations of these). The storage division selection module 804 may also use any combination of the above or other parameters to determine a storage division with a low amount of wear. Selecting a storage division for recovery by determining a storage division with a low amount of wear may be desirable to find storage divisions that are under used, may be recovered for wear leveling, etc.

In another embodiment, the storage division selection module 804 selects a storage division for recovery by identifying a storage division or erase block with a high amount of wear. For example, identifying a storage division or erase block with a high amount of wear may include identifying a storage division with a high number of erase cycles, high bit error rate, a storage division with a non-recoverable ECC block, or high program count. The storage division selection module 804 may also use any combination of the above or other parameters to determine a storage division with a high amount of wear. Selecting a storage division for recovery by determining a storage division with a high amount of wear may be desirable to find storage divisions that are over used, may be recovered by refreshing the storage division using an erase cycle, etc. or to retire the storage division from service as being unusable.

The apparatus 800 includes a data recovery module 806 that reads valid data packets from the storage division selected for recovery, queues the valid data packets with other data packets to be written sequentially by the sequential storage module 802, and updates an index with a new physical address of the valid data written by the sequential storage module 802. Typically, the index is the object index mapping data object identifiers of objects to physical addresses of where packets derived from the data object are stored in the solid-state storage 110.

In one embodiment the apparatus 800 includes a storage division recovery module 808 that prepares the storage division for use or reuse and marks the storage division as available to the sequential storage module 802 for sequentially writing data packets after the data recovery module 806 has completed copying valid data from the storage division. In another embodiment, the apparatus 800 includes a storage division recovery module 808 that marks the storage division selected for recovery as unavailable for storing data. Typically this is due to the storage division selection module 804 identifying a storage division or erase block with a high amount of wear such that the storage division or erase block is not in condition to be used for reliable data storage.

In one embodiment, the apparatus 800 is in a solid-state storage device controller 202 of a solid-state storage device 102. In another embodiment, the apparatus 800 controls a solid-state storage device controller 202. In another embodiment, a portion of the apparatus 800 is in a solid-state storage device controller 202. In another embodiment, the object index updated by the data recovery module 806 is also located in the solid-state storage device controller 202.

In one embodiment, the storage division is an erase block and the apparatus 800 includes an erase module 810 that erases an erase block selected for recovery after the data recovery module 806 has copied valid data packets from the selected erase block and before the storage division recovery module 808 marks the erase block as available. For flash memory and other solid-state storage with an erase operation taking much longer than read or write operations, erasing a data block prior to making it available for writing new data is desirable for efficient operation. Where the solid-state storage 110 is arranged in banks 214, the erase operation by the erase module 810 may be executed on one bank while other banks are executing reads, writes, or other operations.

In one embodiment, the apparatus 800 includes a garbage marking module 812 that identifies a data packet in a storage division as invalid in response to an operation indicating that the data packet is no longer valid. For example, if a data packet is deleted, the garbage marking module 812 may identify the data packet as invalid. A read-modify-write operation is another way for a data packet to be identified as invalid. In one embodiment, the garbage marking module 812 may identify the data packet as invalid by updating an index. In another embodiment, the garbage marking module 812 may identify the data packet as invalid by storing another data packet that indicates that the invalid data packet has been deleted. This is advantageous because storing, in the solid-state storage 110, information that the data packet has been deleted allows the object index reconstruction module 272 or similar module to reconstruct the object index with an entry indicating that the invalid data packet has been deleted.

In one embodiment, the apparatus 800 may be utilized to fill the remainder of a virtual page of data following a flush command in order to improve overall performance, where the flush command halts data flowing into the write pipeline 106 until the write pipeline 106 empties and all packets have been permanently written into non-volatile solid-state storage 110. This has the benefit of reducing the amount of garbage collection required, the amount of time used to erase storage divisions, and the amount of time required to program virtual pages. For example, a flush command may be received when only one small packet is prepared for writing into the virtual page of the solid-state storage 110. Programming this nearly empty virtual page might result in a need to immediately recover the wasted space, causing the valid data within the storage division to be unnecessarily garbage collected and the storage division erased, recovered and returned to the pool of available space for writing by the sequential storage module 802. Marking the data packet as invalid rather than actually erasing an invalid data packet is efficient because, as mentioned above, for flash memory and other similar storage an erase operation takes a significant amount of time. Allowing a garbage collection system, as described in the apparatus 800, to operate autonomously within the solid-state storage 110 provides a way to separate erase operations from reads, writes, and other faster operations so that the solid-state storage device 102 can operate much faster than many other solid-state storage systems or data storage devices.

Figure 9:
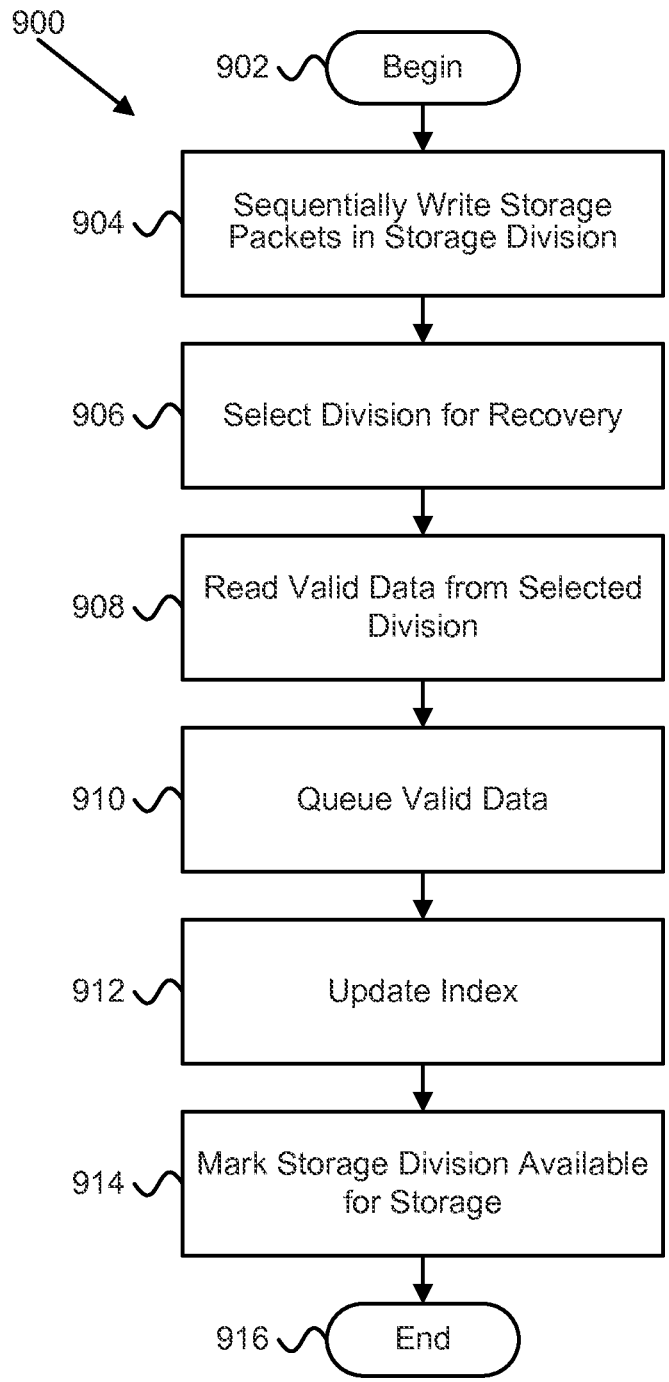
FIG. 9 is a schematic flow chart diagram illustrating one embodiment of a method for garbage collection in a solid state storage device in accordance with the present invention.

FIG. 9 is a schematic flow chart diagram illustrating an embodiment of a method 900 for storage recovery in accordance with the present invention. The method 900 begins 902 and the sequential storage module 802 sequentially writes 904 data packets in a storage division. The storage division is a portion of a solid-state storage 110 in a solid-state storage device 102. Typically a storage division is an erase block. The data packets are derived from an object and the data packets are sequentially stored by order of processing.

The storage division selection module 804 selects 906 a storage division for recovery and the data recovery module 806 reads 908 valid data packets from the storage division selected for recovery. Typically valid data packets are data packets that have not been marked for erasure or deletion or some other invalid data marking and are considered valid or "good" data. The data recovery module 806 queues 910 the valid data packets with other data packets scheduled to be written sequentially by the sequential storage module 802. The data recovery module 806 updates 912 an index with a new physical address of the valid data written by the sequential storage module 802. The index includes a mapping of physical addresses of data packets to object identifiers. The data packets are those stored in stored in the solid-state storage 110 and the object identifiers correspond to the data packets.

After the data recovery module 806 completes copying valid data from the storage division, the storage division recovery module 808 marks 914 the storage division selected for recovery as available to the sequential storage module 802 for sequentially writing data packets and the method 900 ends 916.

Empty Data Segment Directive

Typically, when data is no longer useful it may be erased. In many file systems, an erase command deletes a directory entry in the file system while leaving the data in place in the storage device containing the data. Typically, a data storage device is not involved in this type of erase operation. Another method of erasing data is to write zeros, ones, or some other null data character to the data storage device to actually replace the erased file. However, this is inefficient because valuable bandwidth is used while transmitting the data is being overwritten. In addition, space in the storage device is taken up by the data used to overwrite invalid data.

In some storage devices, like the solid-state storage device 102 described herein, updating previously stored data does not overwrite existing data. Attempting to overwrite data with a string of ones or a string of zeros on such a device takes up valuable space without fulfilling the desired intent of overwriting the existing data. For these devices, such as solid-state storage devices 102, a client 114 typically does not have an ability to overwrite data to erase it.

When receiving a string of repeated characters or character strings, the received data is highly compressible, but typically compression is done by a file system prior to transmission to a storage device. A typical storage device cannot distinguish between compressed data and uncompressed data. The storage device may also receive a command to read the erased file so the storage device may transmit a stream of zeros, ones, or a null character to the requesting device. Again, bandwidth is required to transmit data representing the erased file.

From the foregoing discussion, it should be apparent that a need exists for an apparatus, system, and method for a storage device to receive a directive that data is to be erased so that the storage device can store a data segment token that represents an empty data segment or data with repeated characters or character strings. The apparatus, system, and method may also erase the existing data so that the resulting used storage space comprises the small data segment token. An apparatus, system, and method are presented that overcome some or all of the shortcomings of the prior art.

Figure 10:
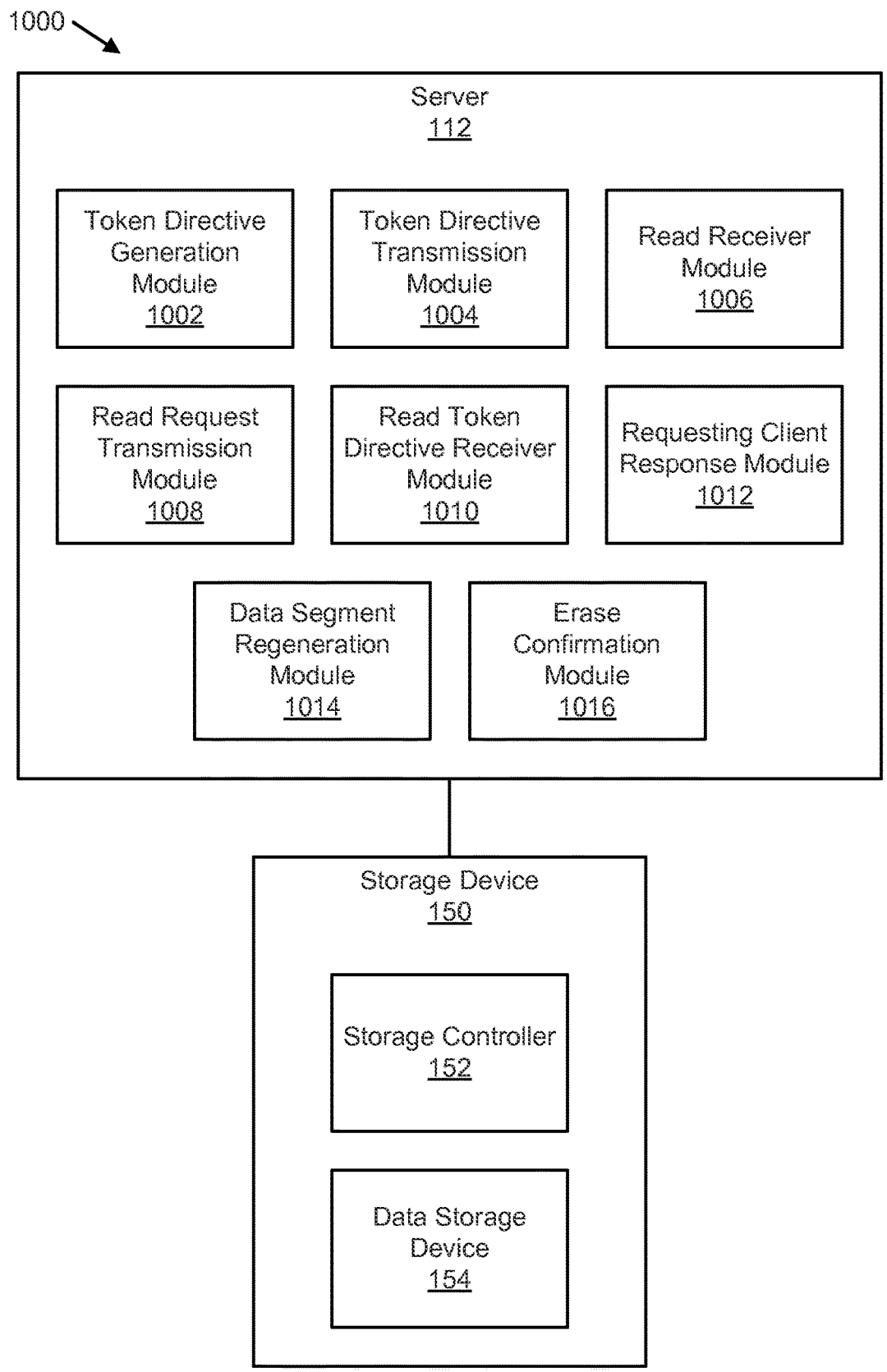
FIG. 10 is a schematic block diagram illustrating one embodiment of a system with an apparatus for generating a token directive in accordance with the present invention.

FIG. 10 is a schematic block diagram illustrating one embodiment of a system 1000 with an apparatus for generating a token directive in accordance with the present invention. The apparatus includes a token directive generation module 1002, a token directive transmission module 1004, a read receiver module 1006, a read request transmission module 1008, a read token directive receiver module 1010, a requesting client response module 1012, and data segment regeneration module 1014, which are described below. In one embodiment, the apparatus is in a server 112 connected to a storage device 150 with a storage controller 152 and a data storage device 154, which are substantially similar to those described above.

In one embodiment, the apparatus includes a token directive generation module 1002 that generates a storage request with a token directive. The token directive includes a request to store a data segment token on the storage device 150. The token directive is intended to be substituted for a series of repeated, identical characters or a series of repeated, identical character strings that would be sent to the storage device 150 and stored as a data segment if the data segment token was not sent in its place. In one embodiment, the series of repeated, identical characters indicate that the data segment is empty. For example, the series of repeated, identical characters may be zeros or ones and a data segment filled with zeros or ones may be interpreted as empty.

The token directive includes at least a data segment identifier and a data segment length. The data segment identifier is typically an object ID, file name, or other identifier known to a file system, application, server 112, etc. seeking to store the repeated, identical characters or character string on the storage device. The data segment length is typically the storage space required by the series of repeated, identical characters or character strings. The data segment token and the token directive typically do not include data of the data segment, such as the series of repeated, identical characters.

The token directive may, however, include other pertinent information for forming the data segment token, such as at least one instance of the repeated, identical character or character string. The token directive may also include metadata, such as a data segment location, an address from a file system, location on a data storage device corresponding to the data segment, etc. One of skill in the art will recognize other information that may be included with a token directive. In one embodiment, the token directive generation module 1002 generates a data segment token along with the token directive.

In one embodiment, the token directive generation module 1002 generates both a token directive and a secure erase command in response to a request to overwrite existing data on the storage device 150. The existing data includes data identified on the storage device 150 with the same data segment identifier as the data segment identifier in the token directive. Typically, a request to overwrite data is sent where it is not sufficient to merely mark data as invalid or garbage, delete a pointer to the data, or other typical delete operation, but where the data is required to be overwritten in such a way that that the data is not recoverable. For example, the request to overwrite the data may be required where data is considered sensitive information and must be destroyed for security reasons.

The secure erase command directs the storage device 150 to overwrite existing data so that the existing data is non-recoverable. The storage device 150 then creates the data segment token as well as overwrites, recovers, erases, etc. the existing data. As a result, the existing data is non-recoverable and the data segment token is stored on the storage device 150, which typically takes much less storage space than the existing data.

In a further embodiment, the apparatus includes an erase confirmation module 1016 that receives a confirmation that the existing data on the storage device 150 has been overwritten with characters so that the existing data is non-recoverable. The confirmation may be forwarded to a requesting device or client 114 and may be used to verify that the existing data has been put in a condition where it is non-recoverable. In other embodiments, the secure erase command may direct the storage device 150 to overwrite the existing data with a specific character or character string or the execute command may be executed multiple times. One of skill in the art will recognize other ways to configure one or more secure erase commands to ensure the existing data is non-recoverable.

Data may be encrypted and then stored on a storage device 150 where encryption is accomplished using an encryption key received by the storage device 150 in conjunction with storing the data. Where the existing data is encrypted with this received encryption key before being stored, in another embodiment the token directive generation module 1002 generates an encryption erase command along with generating a token directive in response to receiving a request to overwrite the existing data. The encryption erase command erases the encryption key used to store the existing data so that the encryption key is non-recoverable.

In one embodiment, erasing the encryption key includes erasing the encryption key from the requesting device. In another embodiment, erasing the encryption key includes erasing the encryption key from a server, key vault, or other location where the encryption key is stored. Erasing the encryption key may include replacing the encryption key with other data or with a series of characters so that the encryption key cannot be recovered in any way. Erasing the encryption key typically makes the existing data on the storage device 150 non-recoverable where an encryption routine was used to encrypt the existing data that is robust enough to thwart attempts to decrypt the existing data. The request to overwrite the existing data could be a secure erase directive where the data is overwritten for security reasons, a request to overwrite data to erase the data, a request that seeks to replace the existing data with the repeated, identical characters or character strings, or the like. In one embodiment, a secure erase directive causes devices to both securely erase the encryption key and securely erase the existing data. In one embodiment, erasure of the encryption key may allow secure erasure of the data on the storage device 150 to be postponed until a garbage collection process erases the data as part of a storage space recovery process. One of skill in the art will recognize other ways to erase an encryption key and other ways to receive a request to overwrite existing data.

In one embodiment, a token directive includes the data segment token and the token directive transmission module 1004 transmits the data segment token with the token directive. In another embodiment, a token directive does not include the data segment token and includes a command for the storage device 150 to generate the data segment token. In this embodiment, the token directive transmission module 1004 transmits the token directive with the command to generate a data segment token, but does not transmit a data segment token.

The apparatus includes a token directive transmission module 1004 that transmits the token directive to the storage device 150. Typically, the token directive transmission module 1004 transmits the token directive as part of a storage request. The storage request may be in the form of an object request, a data request, or other form known to those of skill in the art. Where the token directive generation module 1002 generates a secure erase directive, the token directive transmission module 1004 transmits the secure erase directive to the storage device 150. Where the token directive generation module 1002 generates an erase encryption key command, the erase encryption key command is transmitted, where necessary, to another device to execute the command.

In one embodiment, the token directive transmission module 1004 transmits a token directive without a data segment token. In this embodiment, the token directive includes instructions and information for the storage device 150 to create a data segment token. In another embodiment, the token directive transmission module 1004 transmits a token directive that includes a data segment token. In this embodiment, the storage device 150 is capable of recognizing that the data segment token received with the token directive represents a data segment and takes appropriate action to store the data segment token such that the data segment token represents the data segment rather than merely storing the data segment token as ordinary data.

The apparatus, in a particular embodiment, includes a read receiver module 1006 that receives a storage request to read the data segment from the storage device 150 and a read request transmission module 1008 that transmits the storage request to the storage device 150. Typically, the storage request is received from a requesting client 114, such as an external client 114, a client 114 internal to the server 112, such as an application or file server running on the server 112, etc. One of skill in the art will recognize other devices and software functioning as a requesting client 114 from which the read receiver module 1006 can receive a storage request.

The storage request includes a request to read the data segment corresponding to the data segment token requested to be stored in the token directive transmitted to the storage device 150 by the token directive transmission module 1004. The requesting client 114, in one embodiment, is unaware that the data segment has been stored in the form of a data segment token. In another embodiment, the requesting device is aware that the data segment has been stored as a data segment token but is unaware of the information stored in the data segment token.

The apparatus, in the particular embodiment, also includes a read token directive receiver module 1010 that receives a message corresponding to the requested data segment token from the storage device 150, where the message includes at least the data segment identifier and the data segment length. The message typically does not include data of the data segment. The message may also include other information stored in the data segment token, such as a data segment location or the repeated, identical character or character string. In the particular embodiment, the apparatus includes a requesting client response module 1012 that transmits a response to the requesting client 113 formulated from the message received from the storage device 150.

In one embodiment, read token directive receiver module 1010 also receives in the message a confirmation that existing data has been overwritten with characters such that the existing data is non-recoverable, where the existing data has been previously stored on the storage device 150 and referenced with the same data segment identifier from the data segment token received in the message. The confirmation may also be received from the storage device 150 independently from any storage request to read the data segment.

In another embodiment, where the requesting client 114 requires the data segment, the apparatus includes a data segment regeneration module 1014 that reconstitutes data of the data segment using information contained in the message. In this case, the response sent to the requesting client includes the reconstituted data segment. In another embodiment, the response sent to the requesting client includes information contained in the message received from the storage device 150. The requesting client 114 may then reconstitute the data segment or use the information in some other way. In another embodiment, the message includes the data segment token. The data segment token may be used by the data segment regeneration module 1014 to reconstitute the data segment before forwarding to the requesting client 114 or the requesting client response module 1012 may simply forward the data segment token.

In one embodiment, the storage request with the token directive also includes a request to reserve storage space on the storage device 150, where the requested reserved storage space is an amount of storage space that is about the same to the data segment length. In another embodiment, the request to reserve storage space is for an amount of storage space different than the data segment length. For example, if the storage device 150 is a solid-state storage device 102, the solid-state storage device 102 may be connected to a hard drive or other long-term, inexpensive storage while the solid-state storage 110 is configured as cache for the long-term storage. The request to reserve storage may cause the solid-state storage device 102 to flush a portion of the cache to the long-term storage in preparation for writing data to the solid-state storage device 102. One of skill in the art will recognize other situations were a request to reserve storage space is desired.

In one embodiment, an apparatus may be provided with a read receiver module 1006, a read request transmission module 1008, a read token directive receiver module 1010, and a requesting client response module 1012, which are substantially similar to those described above. In the embodiment, the modules 1006-1012 may be independent from an apparatus including a token directive generation module 1002 or a token directive transmission module 1004. In one embodiment, the apparatus includes a data segment regeneration module 1014, which is substantially similar to the data segment regeneration module 1014 described above.

Figure 11:
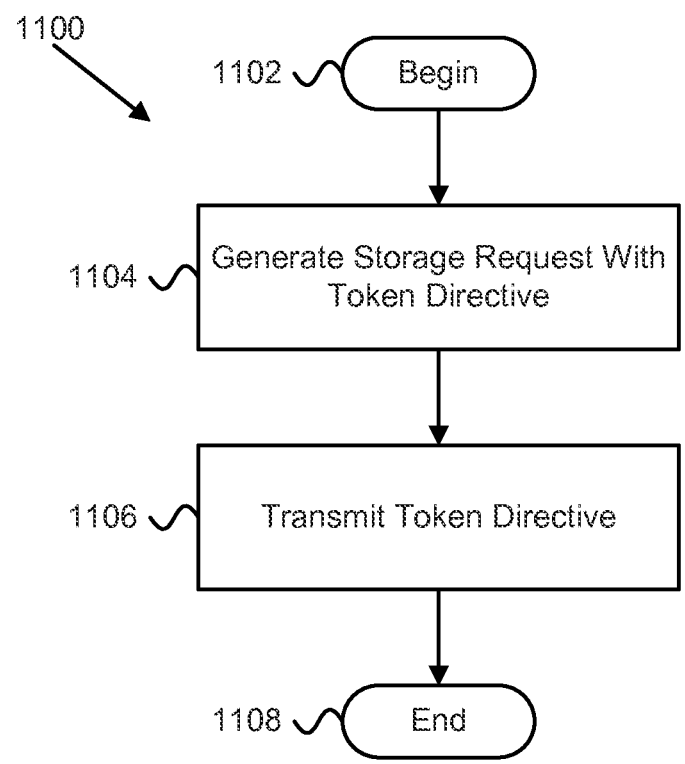
FIG. 11 is a schematic flow chart diagram illustrating an embodiment of a method for generating and transmitting a token directive in accordance with the present invention.

FIG. 11 is a schematic flow chart diagram illustrating an embodiment of a method 1100 for generating and transmitting a token directive in accordance with the present invention. The method 1100 begins 1102 and the token directive generation module 1002 generates 1104 a storage request with a token directive, where the token directive includes a request to store a data segment token on the storage device 150. The token directive transmission module 1004 transmits 1106 the token directive to the storage device 150 and the method 1100 ends 1108. In one embodiment, the storage request includes a token directive to store the data segment token where the storage request is essentially free from data of the data segment. In another embodiment, storage request includes data from the data segment. In a preferred embodiment, a software application creates a storage request using the token directive so as to avoid the creation of the data segment. In another embodiment, a software application requests the creation of the token directive.

Figure 12:
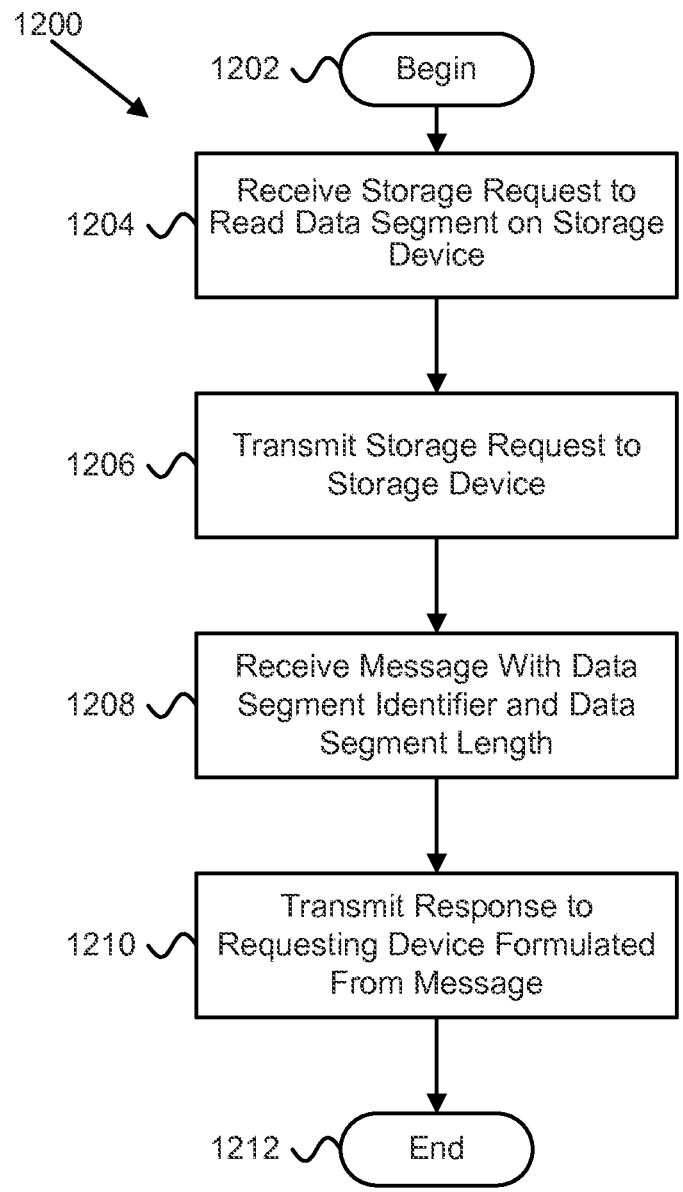
FIG. 12 is a schematic flow chart diagram illustrating an embodiment of a method for reading a data segment token in accordance with the present invention.

FIG. 12 is a schematic flow chart diagram illustrating an embodiment of a method 1200 for reading a data segment token in accordance with the present invention. The method 1200 begins 1202 and the read receiver module 1006 receives 1204 a storage request to read a data segment from a storage device 150 from a requesting client 114. The read request transmission module 1008 transmits 1206 the storage request to the storage device 150.

The read token directive receiver module 1010 receives 1208 a message corresponding to the requested data segment token from the storage device 150, where the message includes at least the data segment identifier and the data segment length. The message is substantially free from data of the data segment. The requesting client response module 1012 transmits 1210 a response to the requesting client formulated from the message received from the storage device 150 and the method 1200 ends 1212.

Figure 13:
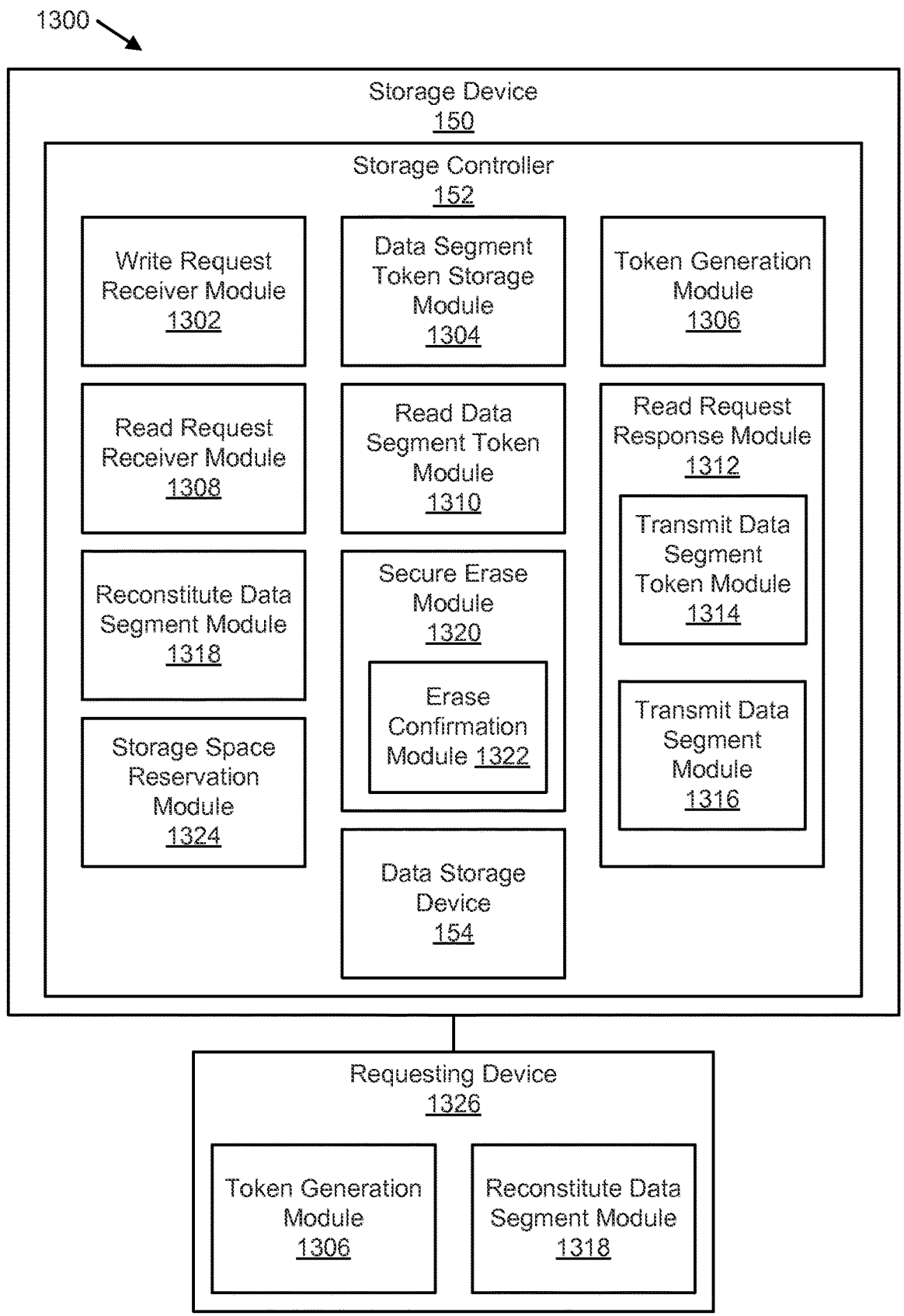
FIG. 13 is a schematic block diagram illustrating one embodiment of a system with an apparatus for managing a data segment token in accordance with the present invention.

FIG. 13 is a schematic block diagram illustrating one embodiment of a system 1300 with an apparatus for managing a data segment token in accordance with the present invention. The system 1300 includes an apparatus with a write request receiver module 1302 and a data segment token storage module 1304, and in various embodiments a token generation module 1306, a read request receiver module 1308, a read data segment token module 1310, a read request response module 1312 with a transmit data segment token module 1314 and a transmit data segment module 1316, a reconstitute data segment module 1318, a secure erase module 1320 with an erase confirmation module 1322, and a storage space reservation module 1324, which are described below. The system 1300 includes a storage device 150 with a storage controller 152 and a data storage device 154, which are substantially similar to those described above. The system 1300 includes a requesting device 1326, which is described below, in communication with the storage device 150.

In the depicted embodiment, the modules 1302-1324 are included in the storage device 150 or storage controller 152. In another embodiment, at least a portion of one or more of the modules 1302-1324 is located outside the storage device 150. In a further embodiment, the requesting device 1326 includes a portion of the modules 1302-1324 in the form of drivers, software, or other function of one or more of the modules 1302-1324. For example, a token generation module 1306 and a reconstitute data segment module 1318 are shown in the requesting device 1326. One of skill in the art will recognize other ways to distribute and implement the functionality of the modules 1302-1324.

The apparatus includes a write request receiver module 1302 that receives a storage request from the requesting device 1326, where the storage request includes a request to store a data segment in the storage device 150. The data segment includes a series of repeated, identical characters or character strings. Typically, the series of repeated, identical characters signify that the data segment is empty. This is especially true when the series of repeated, identical characters are ones or zeros. The apparatus includes a data segment token storage module 1304 that stores a data segment token in the storage device 150. The data segment token includes at least a data segment identifier and a data segment length. The data segment token is substantially free of the actual data from the data segment.

The data segment token may be stored in many forms. In one embodiment, includes an entry in an index, where the index corresponds to information and data stored on the storage device 150. For example, the index may be an object index as described above in relation to the apparatus 200 depicted in FIG. 2. The index may also be file system index, a block storage index, or other index known to those of skill in the art. In another embodiment, the data segment token includes or is in the form of metadata stored on the storage device 150. In another embodiment, the data segment token is stored as metadata on the storage device 150 and includes an entry in an index. One of skill in the art will recognize other ways to storage a data segment token.

In one embodiment, the storage request includes a token directive to store the data segment token where the storage request is essentially free from data of the data segment. The token directive may include the data segment token or a command to generate a data segment token. Where the token directive does not include the data segment token, the data segment token storage module 1304 generates the data segment token from information in the token directive. If the token directive includes the data segment token, the data segment token storage module 1304 recognizes the data segment token as a data structure representing the data segment identified by the data segment identifier in the token directive and stores the data segment token appropriately.

Typically, where the data segment token storage module 1304 recognizes a data segment token, the data segment token is differentiated in some way from other data stored on the storage device 150. For example, a requesting device 1326 may merely compress data and send a compressed object, file, or data segment so that the storage device 150 does not distinguish the compressed data segment from other data received by way of other storage requests.

Where the data segment token storage module 1304 recognizes that a received data segment token is a data segment token, the data segment token storage module 1304 may store the data segment token in such a way that when read, it may appear as a data segment rather than the data segment token. One of skill in the art will recognize other ways that the data segment token storage module 1304 may store a data segment token after recognizing that a received data segment token is a data segment token rather than a data segment.

In another embodiment, storage request includes data from the data segment. In this embodiment, the apparatus includes a token generation module 1306 that generates a data segment token from the data segment, where the data segment token is created in response to the storage request to store the data segment. In a further embodiment, the token generation module 1306 resides in the requesting device 1326, possibly in the form of a driver.

In one embodiment, the apparatus includes a secure erase module 1320 that overwrites existing data with characters such that the existing data is non-recoverable, where the existing data includes data of a data segment previously stored on the storage device 150 identified with the same data segment identifier as the data segment identified in the storage request. In this embodiment, a data segment token is stored with the data segment identifier and data segment length and existing data identified by the same data segment identifier stored in the data segment token is erased by overwriting the existing data. Typically the existing characters are overwritten by zeros, ones, or some other character string so that the existing data is destroyed and is non-recoverable.

In a further embodiment, the secure erase module 1320 also includes an erase confirmation module 1322 that transmits a message indicating that the existing data has been overwritten. Typically the message is sent to the requesting device 1326. The erase confirmation message is transmitted after the secure erase module 1320 has overwritten the existing data. The message may be transmitted in the same transaction as the storage request or in a different transaction.

In another embodiment, the secure erase module 1320 overwrites the existing data during a storage space recovery operation. For example, if the storage device 150 is a solid-state storage device 102, as described above, the storage space recovery operation may be related to the garbage collection describe in relation to the apparatus 800 depicted in FIG. 8. However, a storage space recovery operation involving a request to overwrite the existing data would typically be expedited so that the storage location where the existing data is stored is necessarily recovered prior to any confirmation message is sent by the erase confirmation module 1322. In one embodiment, the existing data is marked or otherwise identified to indicate that a secure erase has been requested. The confirmation message would typically not be sent until the existing data marked for erasure has been overwritten and made non-recoverable. In another embodiment, the secure erase module 1320 merely marks the existing data as invalid for later storage space recovery. In another embodiment, the secure erase updates an index to indicate that the existing data is invalid and prevents access to this data until the data is overwritten during later storage space recovery.

In one embodiment, the secure erase module 1320 overwrites the existing data each time a data segment token is stored. In another embodiment, the storage request specifically includes a request to overwrite the existing data and the secure erase module 1320 overwrites the existing data in response to the request to overwrite the existing data. In another embodiment, the secure erase module 1320 stores metadata information regarding confirmation that the existing data has been erased so that subsequent reads can indicate the erasure.

In other embodiments where a secure erase is not received, the existing data is deleted. In one embodiment, deleting the data includes deleting an index entry, address, etc. In a preferred embodiment, the when a data segment token is stored, the corresponding existing data is marked as invalid or otherwise ready for storage recovery. The data may be later recovered in a storage recovery operation, garbage collection operation, etc.

In a particular embodiment, the apparatus includes a read request receiver module 1308 that receives a storage request to read the data segment, a read data segment token module 1310 that reads the data segment token corresponding to the data segment requested by the storage request, and a read request response module 1312 that transmits a response to the requesting device 1326. The response is generated using the data segment token corresponding to the requested data segment.

The storage request to read the data segment, in one embodiment, is associated with the storage request and serves to confirm that the storage request has been successful. In another embodiment, the request to read the data segment is independent from the storage request and may be initiated by the requesting device 1326 that made the storage request or another separate requesting device 1326.

In one embodiment, where the requesting device 1326 is capable of receiving information from the data segment token in place of actual data, the read request response module 1312 includes a transmit data segment token module 1314 that transmits in the response a message to the requesting device 1326. The message includes at least the data segment identifier and the data segment length, but may also include a data segment location, at least one instance of the repeated, identical character or character string, or other pertinent information. Typically, the message does not include the actual data of the data segment, other than what is included in the data segment token.

In another embodiment, where the requesting device 1326 is expecting to receive a data segment, the apparatus includes a reconstitute data segment module 1318 that reconstitutes data of the data segment using the data segment token. The read request response module 1312 also includes a transmit data segment module 1316 that transmits the reconstituted requested data segment to the requesting device 1326. In another embodiment, the reconstitute data segment module 1318 resides at the requesting device 1326, possibly as in the form of a driver, and the transmit data segment token module 1314 transmits the message with the data segment token information to the requesting device 1326. The reconstitute data segment module 1318 at the requesting device 1326 reconstitutes the requested data segment from the message.

In one embodiment, the system 1300 includes a separate apparatus that includes a read request receiver module 1308, a read data segment token module 1310, a read request response module 1312, which are substantially similar to those described above. The apparatus may be independent from the apparatus including the write request receiver module 1302 and the data segment token storage module 1304. In one embodiment, the read request response module 1312 includes a transmit data segment token module 1314 and/or a transmit data segment module 1316, and the apparatus may include a reconstitute data segment module 1318, where the modules 1314, 1316, 1318 are substantially similar to those described above.

Figure 14:
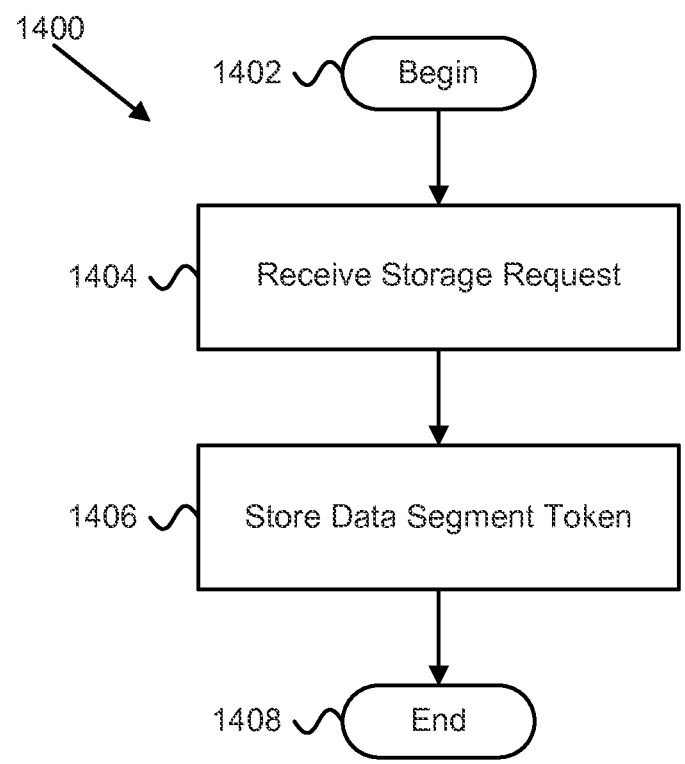
FIG. 14 is a schematic flow chart diagram illustrating an embodiment of a method for storing a data segment token in accordance with the present invention.

FIG. 14 is a schematic flow chart diagram illustrating an embodiment of a method 1400 for storing a data segment token in accordance with the present invention. The method 1400 begins 1402 and the write request receiver module 1302 receives 1404 a storage request from the requesting device 1326, where the storage request includes a request to store a data segment in the storage device 150. The data segment includes a series of repeated, identical characters or character strings. The data segment token storage module 1304 stores 1406 a data segment token in the storage device 150 and the method 1400 ends 1408. The data segment token includes at least a data segment identifier and a data segment length and the data segment token does not include data from the data segment for the most part.

Figure 15:
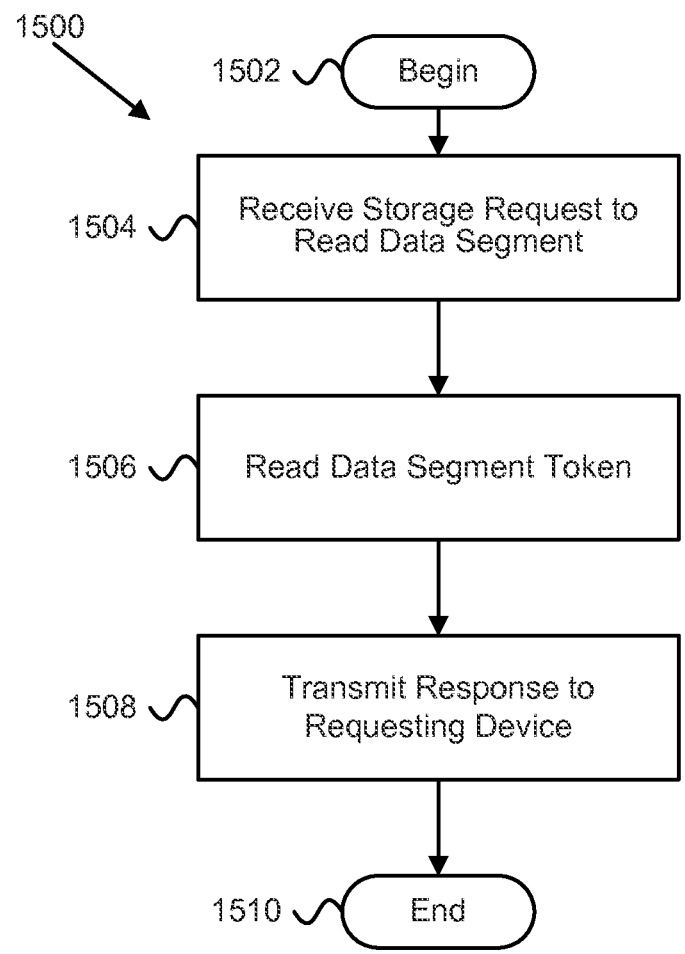
FIG. 15 is a schematic flow chart diagram illustrating an embodiment of a method for reading a data segment token in accordance with the present invention.

FIG. 15 is a schematic flow chart diagram illustrating an embodiment of a method 1500 for reading a data segment token in accordance with the present invention. The method 1500 begins 1502 and the read request receiver module 1308 receives 1504 a storage request to read a data segment from the storage device 150. The data segment is represented on the storage device 150 by a data segment token and the data segment includes a series of repeated, identical characters or character strings. The data segment token includes at least a data segment identifier and a data segment length and the data segment token does not include data from the data segment. The read data segment token module 1310 reads 1506 the data segment token corresponding to the data segment requested in the storage request, the read request response module 1312 transmits 1508 a response to the requesting storage device 150 and the method 1500 ends 1510. The response is generated using the data segment token corresponds to the requested data segment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for managing data in a NAND flash storage system, the method comprising:
   receiving an empty-block directive from a host at a storage controller in the NAND flash storage system, the empty-block directive including a logical identifier associated with a physical storage location comprising data that does not need to be preserved;
   returning by the storage controller an indication that the logical identifier is empty, in response to a read command from the host requesting to read the data identified by the logical identifier included in the empty-block directive, wherein the data in the physical storage location remains on the NAND flash storage system;
   maintaining by the storage controller an index of mappings between the logical identifier and the physical storage location; and
   updating the index of mappings by the storage controller, in response to the empty-block directive, to indicate that the data in the physical storage location does not need to be preserved.

2. The method of claim 1, wherein the indication is at least one zero.

3. The method of claim 1, further comprising:
   determining that the empty-block directive further includes an indication that the data identified by the logical identifier should be overwritten; and
   overwriting the data identified by the logical identifier.

4. The method of claim 1, wherein the empty-block directive is part of a block storage protocol.

5. The method of claim 1, wherein the empty-block directive is received through an application programming interface.

6. The method of claim 1, wherein the empty-block directive is received from a file system.

7. A method for managing data in a system having a host processor and a block-based NAND flash storage system, the NAND flash storage system having physical NAND flash storage locations controlled by a NAND controller, the method comprising:
   receiving, via the host processor, an indication of deletion of a file at the host processor;
   creating, via the host processor, an empty-block identifier in response to the indication of deletion;
   receiving, via the NAND controller, the empty-block identifier;
   maintaining, via the NAND controller, an index of mappings between logical identifiers and physical NAND flash storage locations; and
   updating the index of mappings, in response to the receiving the empty-block identifier, to indicate that data associated with the file on one or more of the physical NAND flash storage locations identified by the empty-block identifier does not need to be preserved.

8. The method of claim 7, further comprising:
   receiving, via the NAND controller, a read command including a logical identifier that was associated with the empty-block; and
   returning, via the NAND controller, a data string indicating that the logical identifier is empty in response to the receiving the read command.

9. The method of claim 8, wherein the data string comprises at least one zero.

10. The method of claim 7, wherein the empty-block identifier indicates that the data associated with the file on the one or more physical NAND flash storage locations identified by the empty-block identifier should be overwritten.

11. The method of claim 7, further comprising transmitting a message indicating that the data associated with the file on one or more physical NAND flash storage locations identified by the empty-block identifier has been overwritten.

12. The method of claim 7, further comprising overwriting the data associated with the file on the one or more physical NAND flash storage locations identified by the empty-block identifier with a series of characters such that the overwritten data is non-recoverable.

13. The method of claim 7, further comprising performing garbage collection, via the NAND controller, in the NAND flash storage system.

14. The method of claim 13, wherein performing garbage collection comprises:
   copying a block containing data that should be preserved from an erase block comprising blocks containing data that does not need to be preserved; and
   erasing the erase block.

15. The method of claim 14, further comprising writing the copied data, via the NAND controller, to the erased erase block.

16. The method of claim 7, wherein the NAND flash storage system is an append-only storage system.

17. The method of claim 14, wherein each of the one or more physical NAND flash storage locations are smaller than the erase block.

18. The method of claim 1, further comprising transmitting a message indicating that the data in the physical storage location has been deleted in response to a delete command.

19. The method of claim 1, further comprising overwriting the data in the physical storage location with a series of characters such that the overwritten data is non-recoverable.

20. The method of claim 1, further comprising removing a mapping between the logical identifier and the physical storage location from the index of mappings; and erasing the data stored in the physical storage location.

* * * * *